US012713676B2

(12) United States Patent
Park et al.

(10) Patent No.: US 12,713,676 B2
(45) Date of Patent: Aug. 18, 2026

(54) SEMICONDUCTOR DEVICES

(71) Applicant: Samsung Electronics Co., Ltd., Suwon-si (KR)

(72) Inventors: Jisoo Park, Suwon-si (KR); Byungju Kang, Suwon-si (KR); Junghan Lee, Suwon-si (KR); Jaehyoung Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 257 days.

(21) Appl. No.: 18/231,549

(22) Filed: Aug. 8, 2023

(65) Prior Publication Data

US 2024/0128354 A1 Apr. 18, 2024

(30) Foreign Application Priority Data

Oct. 18, 2022 (KR) ........................ 10-2022-0133858

(51) Int. Cl.
*H10D 64/01* (2025.01)
*H10D 30/01* (2025.01)
*H10W 20/20* (2026.01)

(52) U.S. Cl.
CPC ......... *H10D 64/017* (2025.01); *H10D 30/024* (2025.01); *H10W 20/20* (2026.01)

(58) Field of Classification Search
CPC .. H10D 64/017; H10D 30/024; H10D 30/797; H10D 30/014; H10D 30/43; H10D 64/254; H10D 64/256; H10D 62/822; H10D 84/0149; H10D 84/0151; H10D 84/0158; H10D 84/038; H10D 84/01; H10D 84/834; H10D 84/0128; H10D 84/013; H10D 84/0135; H10D 84/82; H10W 20/20; H10W 20/40; H10W 20/481; H10W 20/427; H10W 46/00; H10W 46/301; H10W 20/01; H10W 46/503
USPC .......................................................... 438/478
See application file for complete search history.

(56) References Cited

U.S. PATENT DOCUMENTS 10,636,739 B2 4/2020 Beyne et al.
10,636,744 B2 * 4/2020 Wang .................... H10W 46/00
11,177,286 B2 11/2021 Kim et al.
(Continued)

FOREIGN PATENT DOCUMENTS

KR 1020100066783 A 6/2010
KR 1020200008902 A 1/2020
(Continued)

*Primary Examiner* — Mohammad M Hoque
(74) *Attorney, Agent, or Firm* — Muir Patent Law, PLLC

(57) ABSTRACT

In a method of manufacturing a semiconductor device, an alignment key is formed through a portion of a substrate including first and second surfaces opposite to each other, which is adjacent to the second surface of the substrate. A transistor including a gate structure and a source/drain layer is formed on the second surface of the substrate. A portion of the substrate adjacent to the first surface of the substrate is removed to expose the alignment key. A contact plug is formed through a portion of the substrate adjacent to the first surface of the substrate to be electrically connected to the source/drain layer. A power rail is formed on the first surface of the substrate to be electrically connected to the contact plug.

15 Claims, 55 Drawing Sheets

(56) References Cited

U.S. PATENT DOCUMENTS

| | | | | |
|---|---|---|---|---|
| 2006/0001065 | A1* | 1/2006 | Heo | H10B 63/10 257/296 |
| 2010/0140685 | A1* | 6/2010 | Kang | H10B 43/20 438/129 |
| 2020/0027842 | A1* | 1/2020 | Lee | H10W 46/00 |
| 2020/0373331 | A1* | 11/2020 | Kim | H10D 86/201 |
| 2021/0280585 | A1 | 9/2021 | Jin | |
| 2022/0157723 | A1 | 5/2022 | Park et al. | |
| 2022/0157737 | A1 | 5/2022 | Cho et al. | |

FOREIGN PATENT DOCUMENTS

| | | | |
|---|---|---|---|
| KR | 1020200095640 | A | 8/2020 |
| KR | 1020210012084 | A | 2/2021 |

* cited by examiner 200
103
115
100
101
B'
104
II
260
160
200
190
160
260
I
200
160
225
235
245
255
105b
105a
105
100
B
D1
D3
D2

100
115
115
B'
B
A
A'
C
C'
I
II
160
160
190
190
290
225
235
245
235
225
255
270
170
105
170
170
105
170
D1
D2
D3

100
105a
105b
105
300
190
280
245
235
225
255
160
200
290
B
260
310
300
190
280
160
290
I
160
260
II
107
100
115
103
200
270
B'
D1
D3
D2

270
170
105
170
170
B
105
170
225
235
245
255
235
225
190
310
290
330
I
160
350
160
II
340
115
B'
115
D1
D2
D3

350
100
105a
105b
105
300
190
280
245
235
225
255
160
200
290
B
260
330
310
300
190
280
160
290
160
260
340
320
107
100
115
103
200
270
B'
D1
D3
D2

400
405
424
424
575
585
565
595
424
480
480
585
575
565
595
530
610
F
600
620
630
600
I
II
401
411
421
411
421
411
421
500
417
419
403
530
610
F'
D3
D1
D2

SEMICONDUCTOR DEVICES

CROSS-REFERENCE TO RELATED APPLICATION

This application claims priority under 35 USC § 119 to Korean Patent Application No. 10-2022-0133858, filed on Oct. 18, 2022 in the Korean Intellectual Property Office (KIPO), the contents of which are herein incorporated by reference in their entirety.

BACKGROUND

1. Field

Example embodiments relate to semiconductor devices. More particularly, example embodiments relate to semiconductor devices having contact plugs.

2. Description of the Related Art

In a logic device, a contact plug and a via structure may be formed in order that a gate structure and a source/drain layer may be connected to upper wirings for applying electrical signals thereto. However, a total resistance of the gate structure, the source/drain layer, the contact plug structure and the via structure increases due to a contact resistance between the gate structure and the contact plug structure or between the source/drain layer and the contact plug structure. Additionally, the gate structure and the contact plug structure may be electrically shorted, or the contact plug structure and the via structure may be electrically shorted.

SUMMARY

Example embodiments provide a semiconductor device having enhanced characteristics.

According to example embodiments, there is provided a method of manufacturing a semiconductor device. In the method, an alignment key may be formed through a portion of a substrate including first and second surfaces opposite to each other, which may be adjacent to the second surface of the substrate. A transistor including a gate structure and a source/drain layer may be formed on the second surface of the substrate. A portion of the substrate adjacent to the first surface of the substrate may be removed to expose the alignment key. A contact plug may be formed through a portion of the substrate adjacent to the first surface of the substrate to be electrically connected to the source/drain layer. A power rail may be formed on the first surface of the substrate to be electrically connected to the contact plug.

According to example embodiments, there is provided a method of manufacturing a semiconductor device. In the method, portions of a substrate in a chip region and a scribe lane region may be removed to form first and second trenches, respectively, which may be adjacent to the second surface of the substrate. The substrate may include first and second surfaces opposite to each other. An isolation pattern and an alignment key may be formed in the first and second trenches, respectively. A dummy gate structure may be formed on the second surface of the substrate. A source/drain layer may be formed on a portion of the substrate adjacent to the dummy gate structure. The dummy gate structure may be replaced with a gate structure. A portion of the substrate adjacent to the first surface of the substrate may be removed to expose the alignment key. A contact plug may be formed through a portion of the substrate adjacent to the first surface of the substrate to be electrically connected to the source/drain layer. A power rail may be formed on the first surface of the substrate to be electrically connected to the contact plug.

According to example embodiments, there is provided a method of manufacturing a semiconductor device. In the method, a portion of a substrate in a scribe lane region may be removed to form a first trench, which may be adjacent to the second surface of the substrate. The substrate may include first and second surfaces opposite to each other and a chip region and the scribe lane region. A sacrificial layer and a semiconductor layer may be alternately and repeatedly stacked on the second surface of the substrate having the first trench thereon. An insulation layer may be formed on an uppermost one of the semiconductor layers on the first trench to form an alignment key. The semiconductor layers, the sacrificial layers and a portion of the substrate adjacent to the second surface of the substrate in the chip region may be partially removed to form semiconductor lines, sacrificial lines and a second trench, respectively, and the second trench may define the active pattern. An isolation pattern may be formed in the second trench. A dummy gate structure may be formed on the semiconductor lines, the sacrificial lines, the active pattern and the isolation pattern. A source/drain layer may be formed on a portion of the active pattern adjacent to the dummy gate structure. The dummy gate structure may be replaced with a gate structure. A portion of the substrate adjacent to the first surface of the substrate may be removed to expose the alignment key. A contact plug may be formed through a portion of the substrate adjacent to the first surface of the substrate to be electrically connected to the source/drain layer. A power rail may be formed on the first surface of the substrate to be electrically connected to the contact plug.

In the method of manufacturing the semiconductor device in accordance with example embodiments, the alignment key may be used for positioning and aligning structures on the first surface of the substrate, and may be exposed by removing a portion of the substrate adjacent to the second surface of the substrate. Thus, the alignment key may also be used for positioning and aligning structures on the second surface of the substrate.

Accordingly, even though the power rail is formed on the second surface of the substrate instead of the first surface of the substrate, first structures at a portion of the substrate adjacent to the first surface of the substrate and receiving power from the power rail may be aligned with second structures at a portion of the substrate adjacent to the second surface of the substrate and electrically connecting the first structures to the power rail.

DESCRIPTION OF EMBODIMENTS

A semiconductor device and a method of manufacturing the same in accordance with example embodiments will be described more fully hereinafter with reference to the accompanying drawings. Hereinafter in the specifications (and not necessarily in the claims), two directions crossing each other among horizontal directions, which are substantially parallel to an upper surface of a substrate, may be referred to as first and second directions D1 and D2, respectively, and a vertical direction substantially perpendicular to the upper surface of the substrate may be referred to as a third direction D3. In example embodiments, the first and second directions D1 and D2 may be substantially perpendicular to each other.

In the specifications, up vs. down, on and over vs. beneath and under, upper surface vs. lower surface, and upper portion vs. lower portion are relative conceptions so as to describe opposite sides in the vertical direction, and each wording may have opposite meanings according to the specific parts to be explained in the specifications.

FIGS. 1 to 26 are plan views and cross-sectional views illustrating a method of manufacturing a semiconductor device in accordance with example embodiments. Particularly, FIGS. 1, 4, 7, 11, 14, 18, 20 and 23 are the plan views, and FIGS. 2, 3, 5, 6, 8-10, 12, 13, 15-17, 19, 21, 22 and 24-26 are the cross-sectional views.

FIGS. 2, 5, 15 and 24 are cross-sectional views taken along lines A-A' of corresponding plan views, respectively, FIGS. 3, 6, 8, 10, 12, 13, 16, 19, 21 and 25 are cross-sectional views taken along lines B-B' of corresponding plan views, respectively, and FIGS. 9, 17, 22 and 26 are cross-sectional views taken along lines C-C' of corresponding plan views, respectively.

Figure 1:
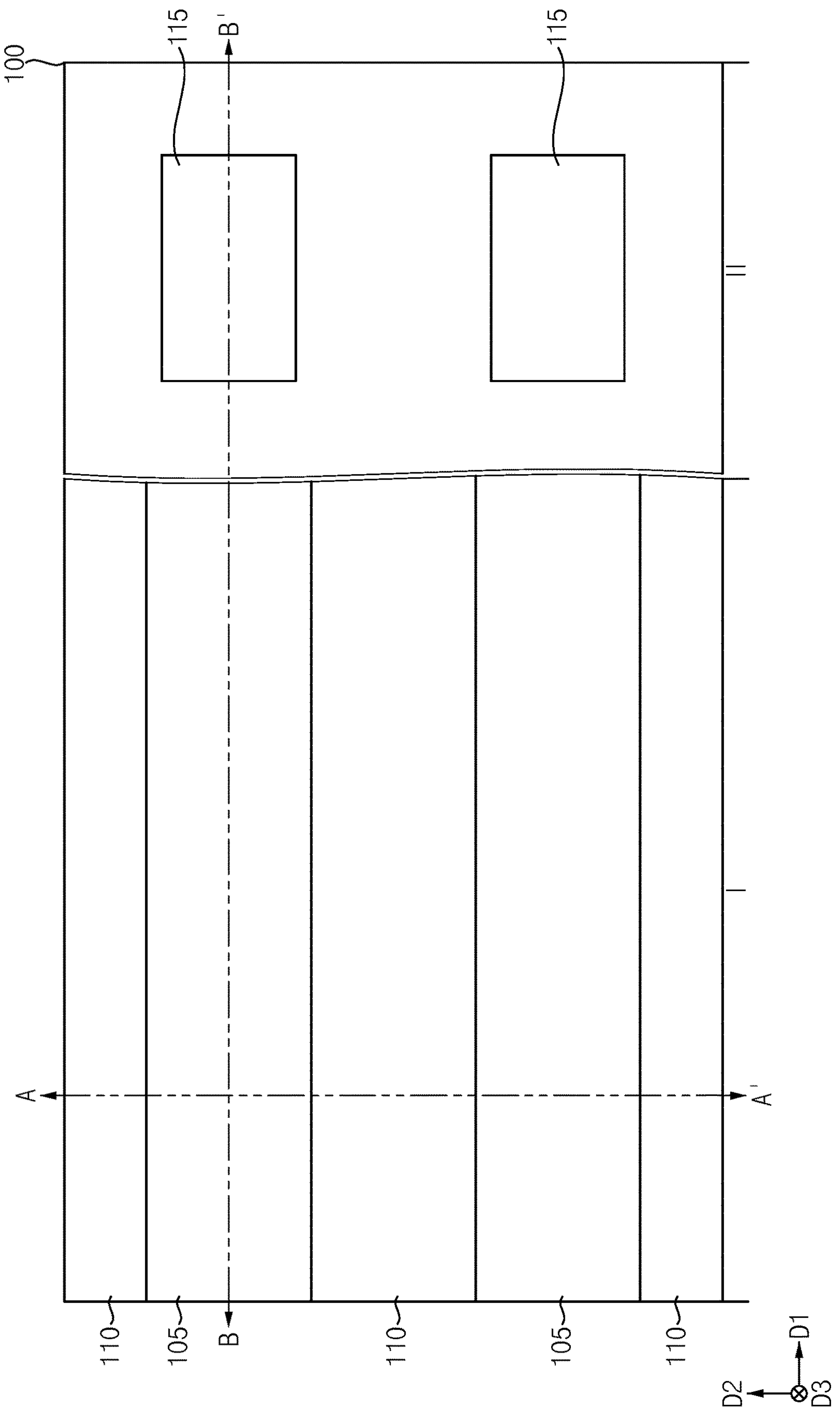
FIGS. 1 to 26 are plan views and cross-sectional views illustrating a method of manufacturing a semiconductor device in accordance with example embodiments.
Figure 2:
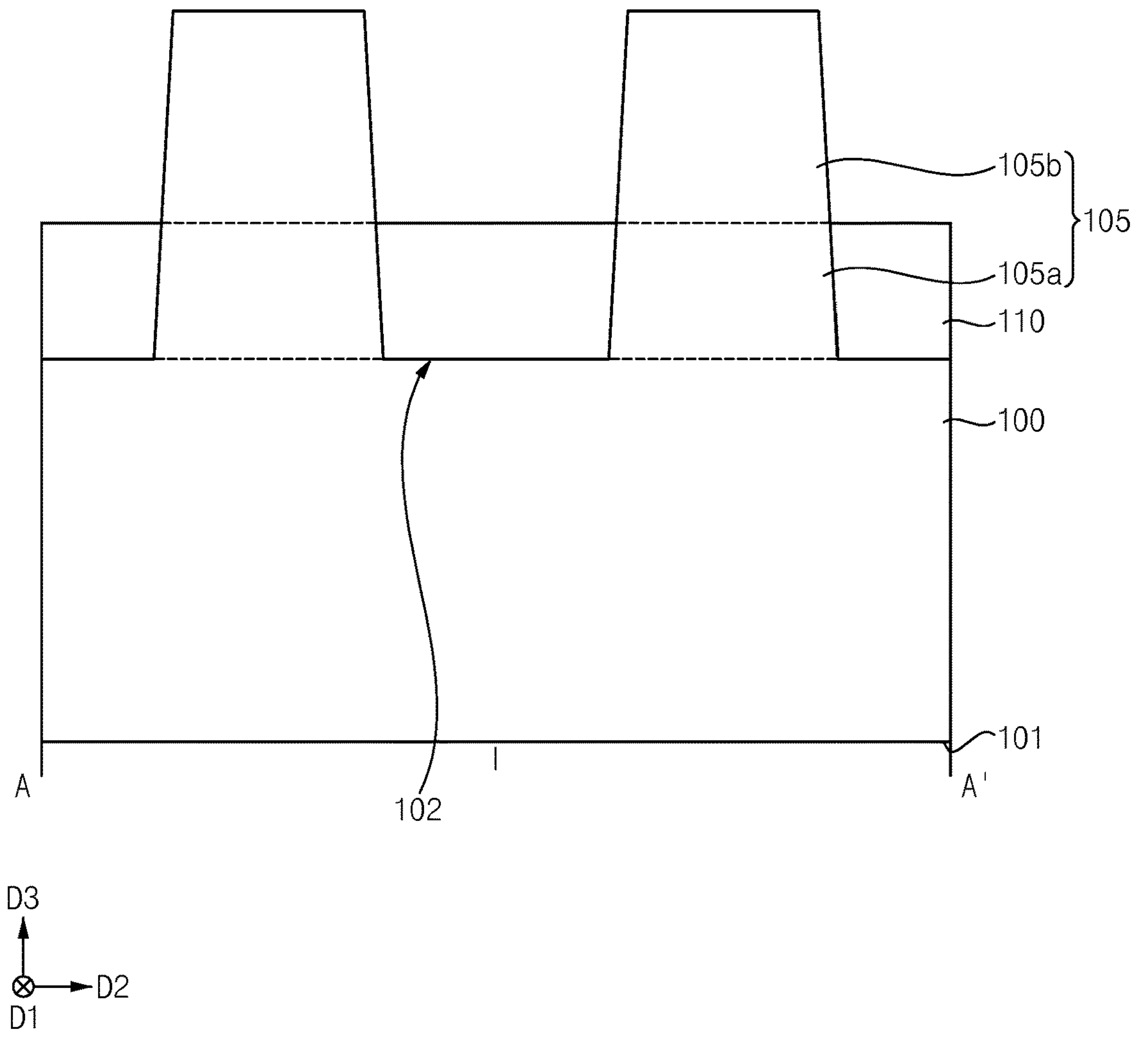
Figure 3:
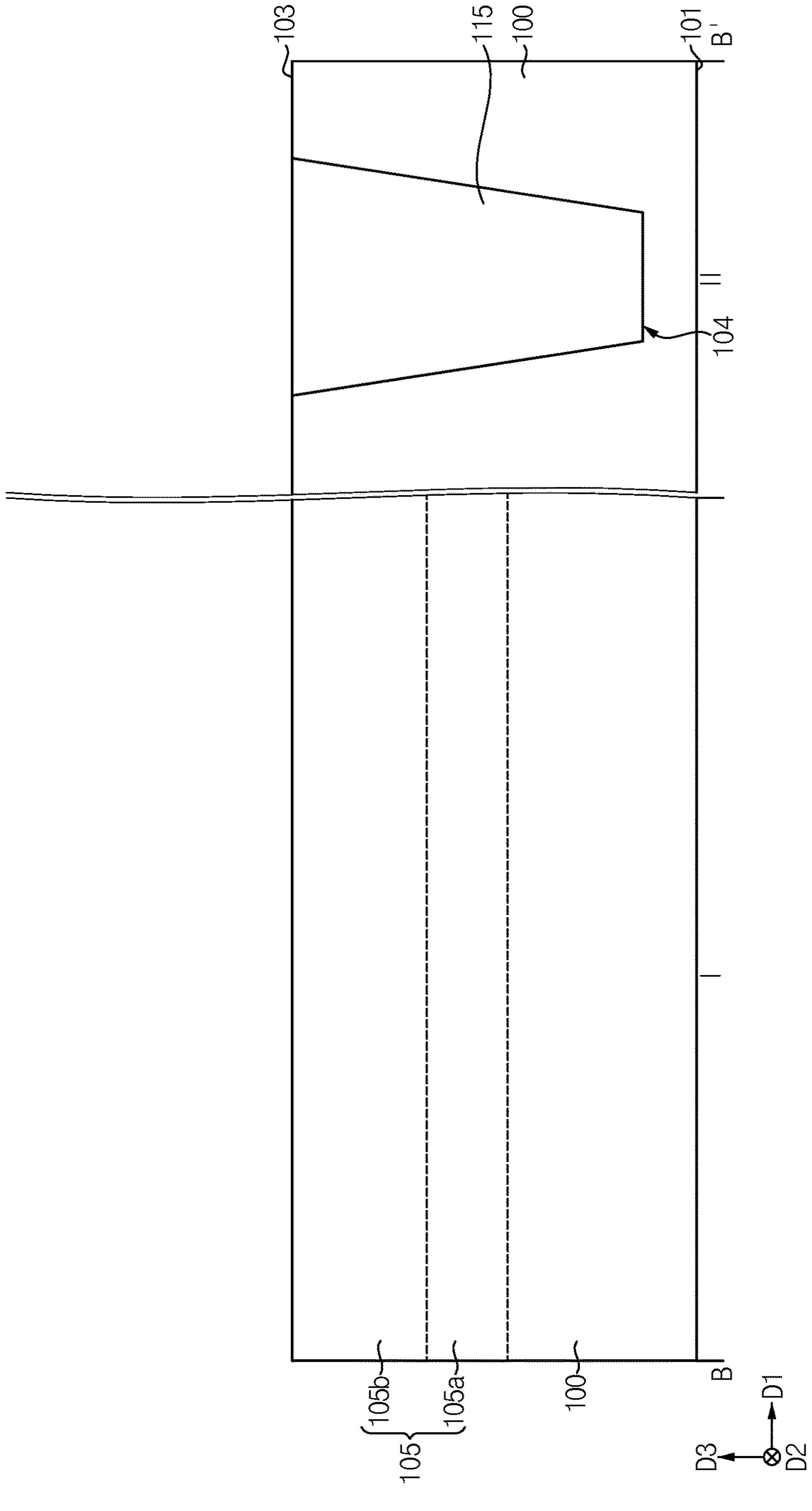

Referring to FIGS. 1 to 3, upper portions of a substrate 100 including first and second regions I and II may be removed to form first and second trenches, respectively, on the first and second regions I and II, respectively, of the substrate 100.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may include a silicon-on-insulator (SOI) substrate or a germanium-on-insulator (GOI) substrate.

In example embodiments, the first region I of the substrate 100 may be a chip region, and the second region II of the substrate 100 may be a scribe lane region. In example embodiments, the second region II of the substrate 100 may surround the first region I of the substrate 100, and FIGS. 1 and 3 show a portion of the second region II of the substrate 100.

The substrate 100 may have first and second surfaces 101 and 103 opposite to each other in the third direction D3, and FIGS. 2 and 3 show that the first and second surfaces 101 and 103 of the substrate 100 are lower and upper surfaces, respectively, of the substrate 100. Thus, each of the first and second trenches 102 and 104 may be formed by removing a portion of the substrate 100 adjacent to the second surface 103 of the substrate 100.

A first insulation layer may be formed on the second surface 103 of the substrate 100 to fill the first and second trenches 102 and 104, and the first insulation layer may be planarized until the second surface 103 of the substrate 100 is exposed.

Thus, a first active pattern 105 may be defined by the first trench 102 on the first region I of the substrate 100, and a first alignment key 115 or a first overlay key 115 may be defined in the second trench 104 on the second region II of the substrate 100. The first alignment key 115 or the first overlay key 115 may be used to realize an accurate alignment between layers stacked on the substrate 100, and the formation of features and devices in and on the substrate 100.

The first active pattern 105 may protrude upward from the substrate 100, and thus may also referred to as an active fin. In example embodiments, the first active pattern 105 may extend in the first direction D1 on the first region I of the substrate 100, and a plurality of first active patterns 105 may be spaced apart from each other in the second direction D2.

FIG. 1 shows that the first alignment key 115 has a shape of a rectangle in a plan view, however, aspects of the inventive concept may not be limited thereto. Thus, the first alignment key 115 may have a shape of, e.g., a circle, an ellipse, a rectangle, etc., in a plan view.

In example embodiments, a plurality of first alignment keys 115 may be spaced apart from each other in the first direction D1 and/or in the second direction D2 on the second region II of the substrate 100, and FIG. 1 shows that two first alignment keys 115 are spaced apart from each other in the second direction D2 on the second region II of the substrate 100.

The first insulation layer may include an oxide, e.g., silicon oxide, and the first alignment key 115 may also include an oxide, e.g., silicon oxide.

A portion of the first insulation layer at an upper portion of the first trench 102 may be removed to form a first isolation pattern 110 at a lower portion of the first trench 102. Thus, the first active pattern 105 defined by the first trench 102 may include a first lower active pattern 105*a* of which a sidewall is covered by the first isolation pattern 110 and a first upper active pattern 105*b* of which a sidewall is not covered by the first isolation pattern 110.

Alternatively, the first alignment key 115 and the first isolation pattern 110 may be formed by depositing insulating layers, respectively, and partially removing the insulating interlayers.

For example, the second trench 104 may be formed on the second region II of the substrate 100, the first alignment key 115 may be formed to fill the second trench 104, the first trench 102 may be formed on the first region I of the substrate 100 to define the first active pattern 105, and the first isolation pattern 110 may be formed at the lower portion of the first trench 102.

In this case, the first alignment key 115 may be used for positioning and aligning the first trench 102, and may include an insulating material different from an insulating material of the first isolation pattern 110. For example, the first isolation pattern 110 may include an oxide, e.g., silicon oxide, and the first alignment key may include an insulating nitride, e.g., silicon nitride. Alternatively, the first alignment key 115 may have a multi-layered structure of a first layer including an oxide and a second layer including an insulating nitride.

Figure 4:
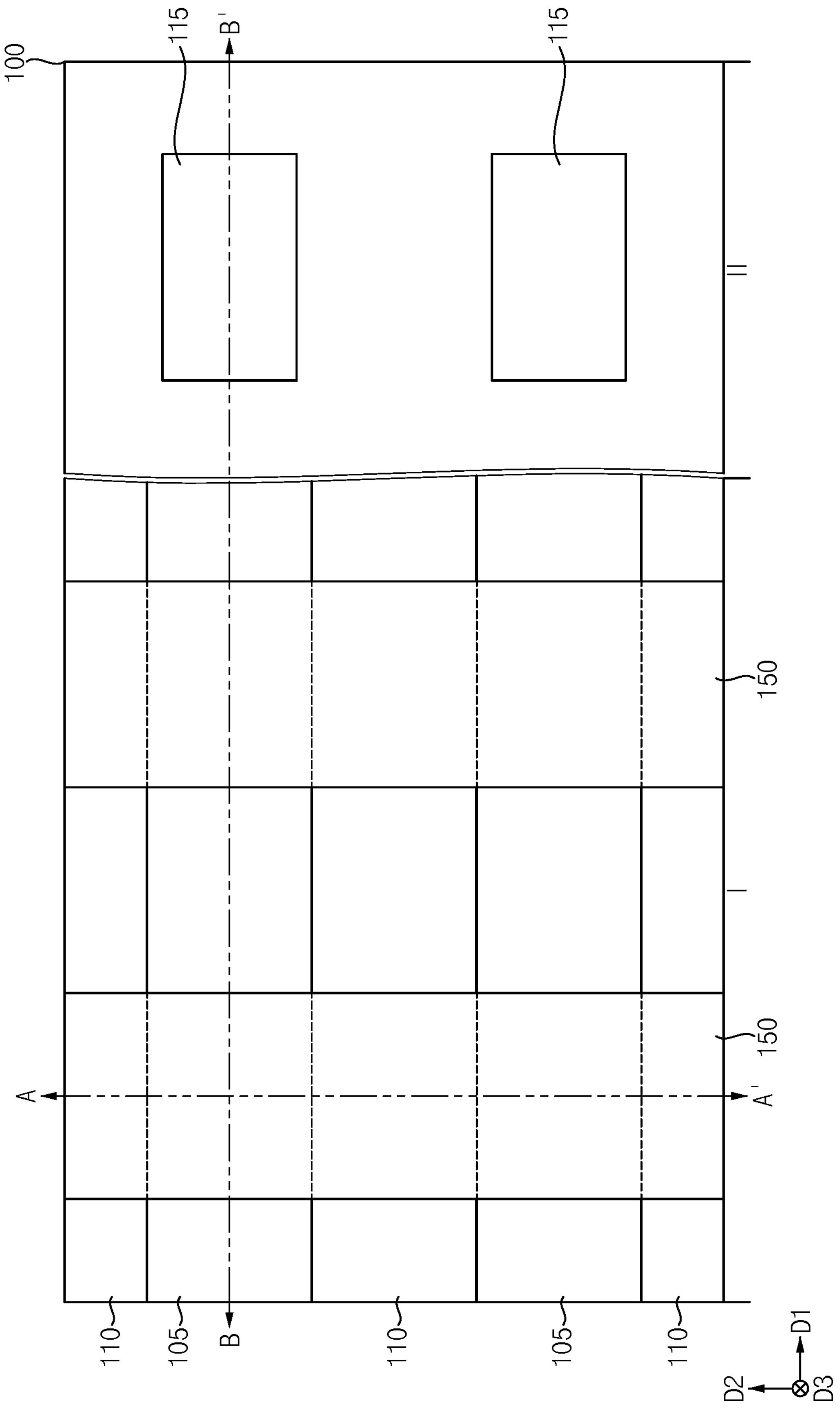
Figure 5:
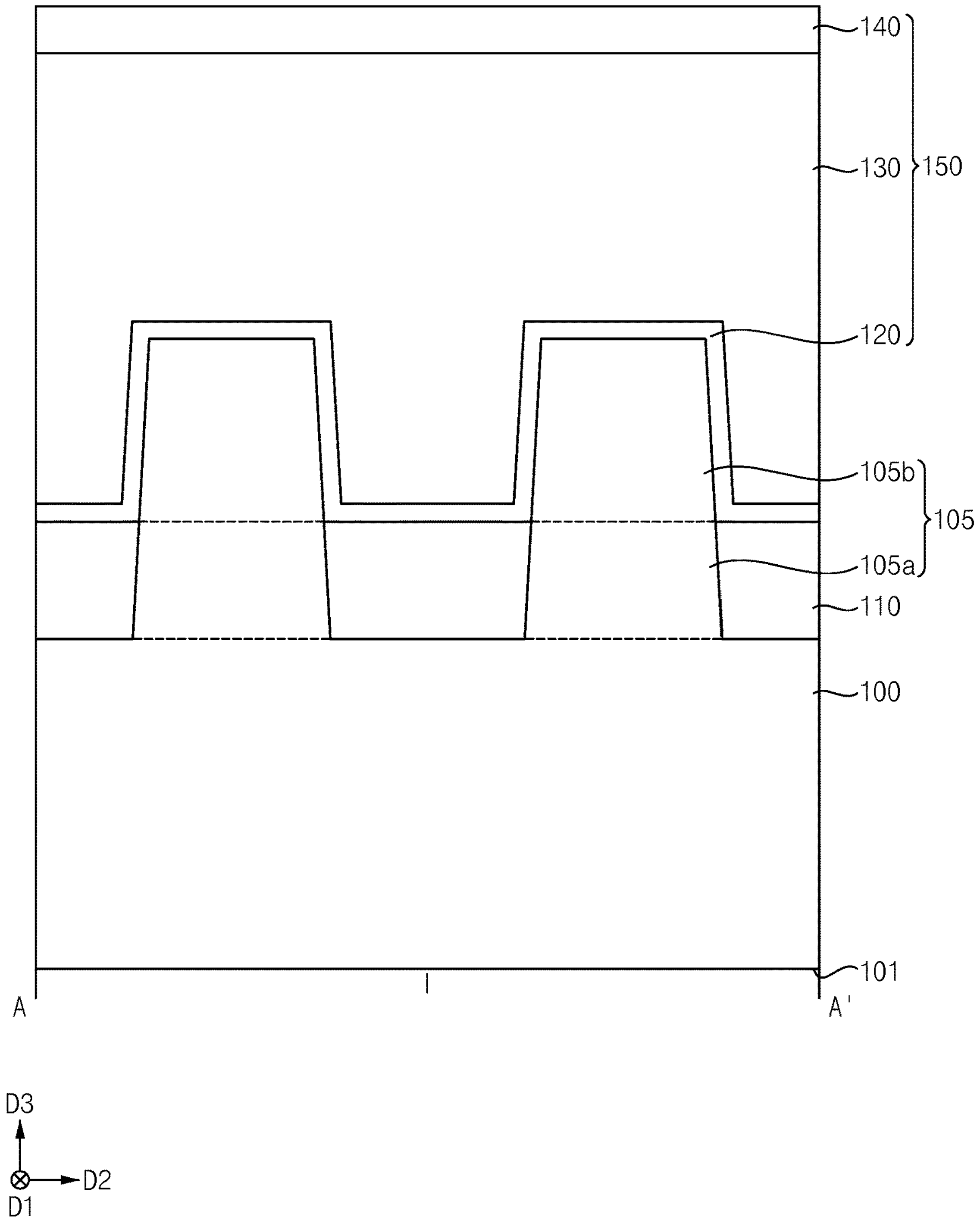
Figure 6:
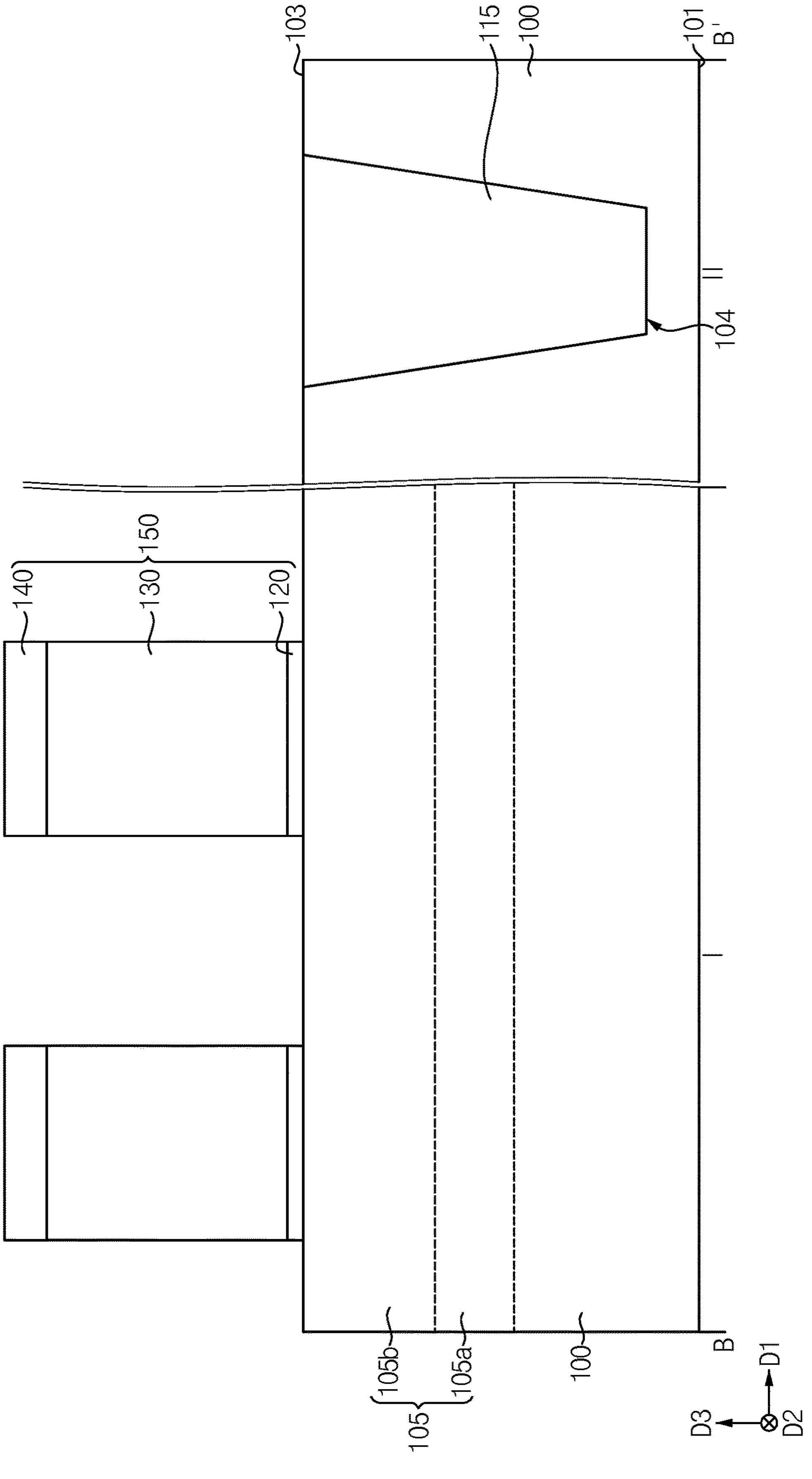
Figure 7:
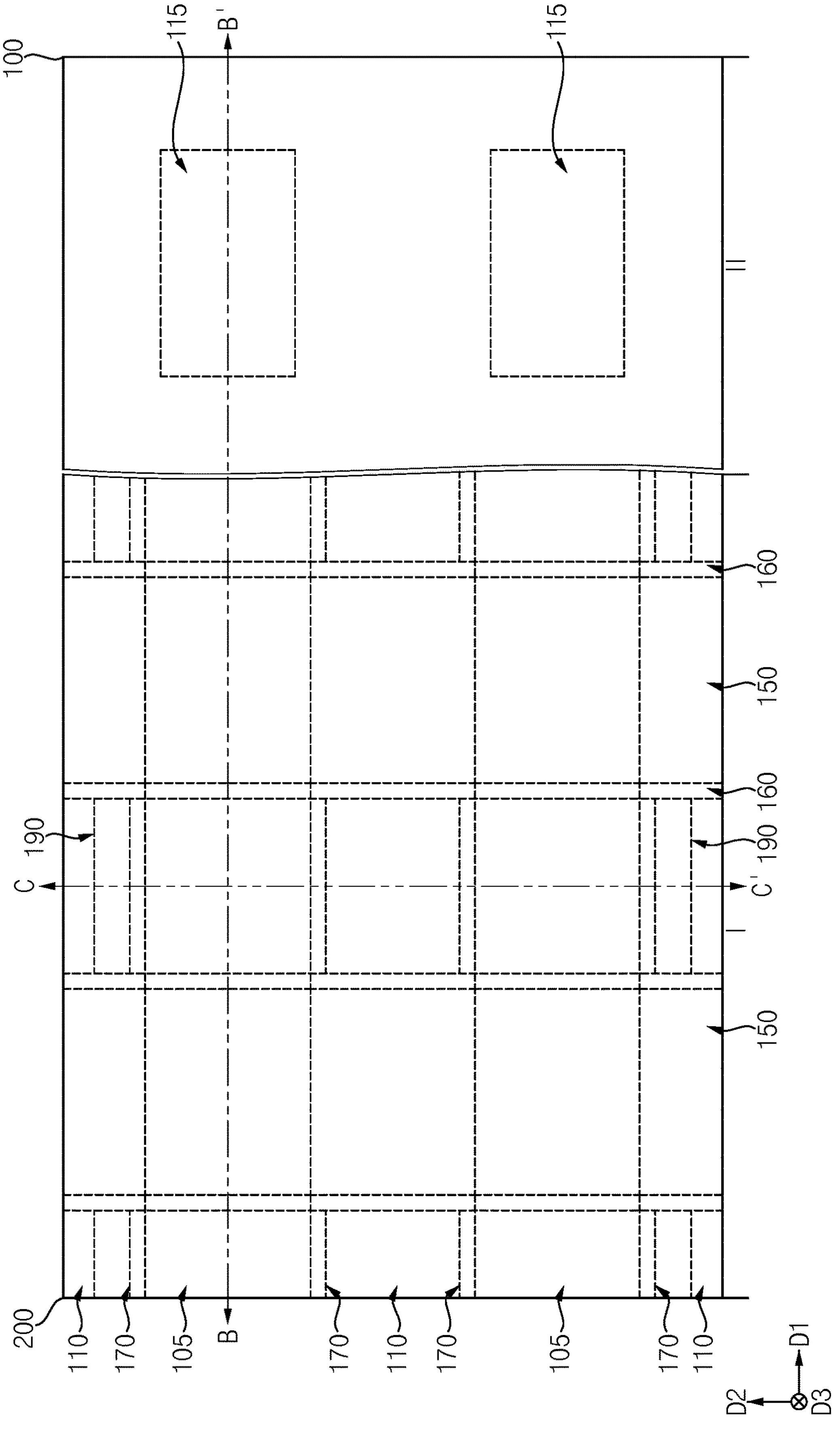

Referring to FIGS. 4 to 6, a first dummy gate structure 150 may be formed on the first region I of the substrate 100 having the first active pattern 105 and the first isolation pattern 110 thereon, and the first alignment key 115 may be used for positioning and aligning the first dummy gate structure 150.

The first dummy gate structure 150 may include a first dummy gate insulation pattern 120, a first dummy gate electrode 130 and a first dummy gate mask 140 sequentially stacked.

The first dummy gate insulation pattern 120 may include an oxide, e.g., silicon oxide, the first dummy gate electrode 130 may include, e.g., polysilicon, and the first dummy gate mask 140 may include an insulating nitride, e.g., silicon nitride.

In example embodiments, the first dummy gate structure 150 may extend in the second direction D2 on the first region I of the substrate 100, and a plurality of first dummy gate structures 150 may be spaced apart from each other in the first direction D1.

Figure 8:
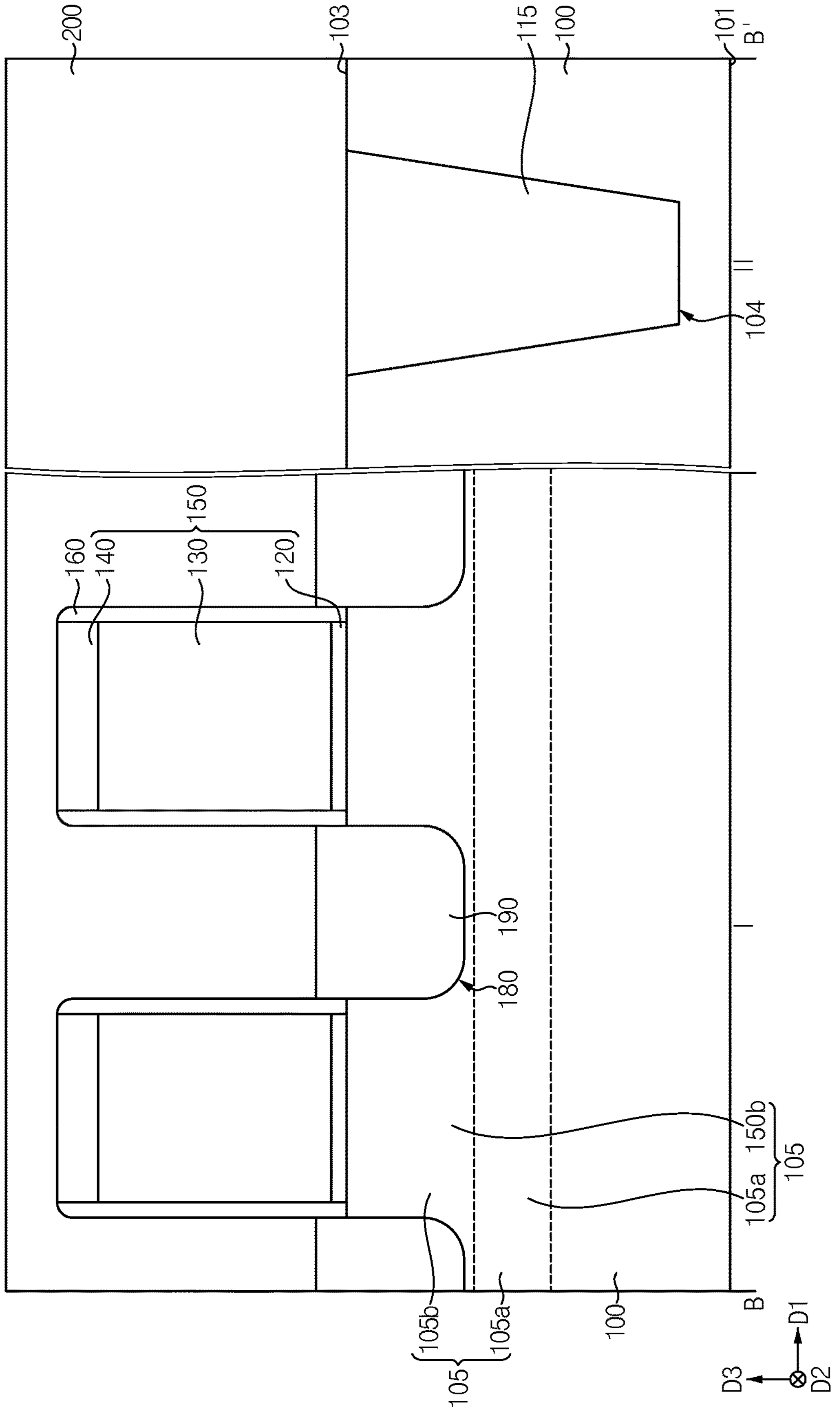
Figure 9:
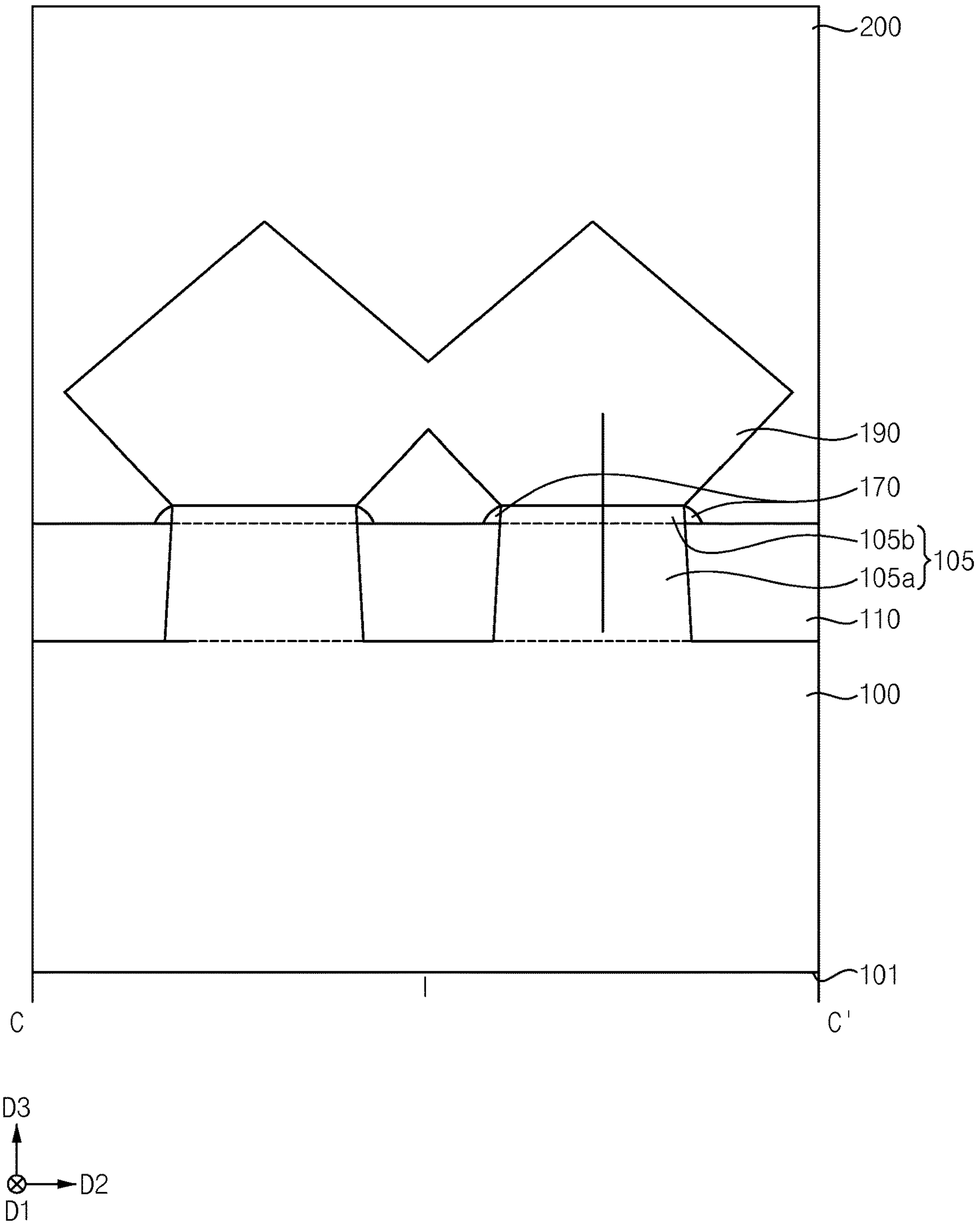
Figure 10:
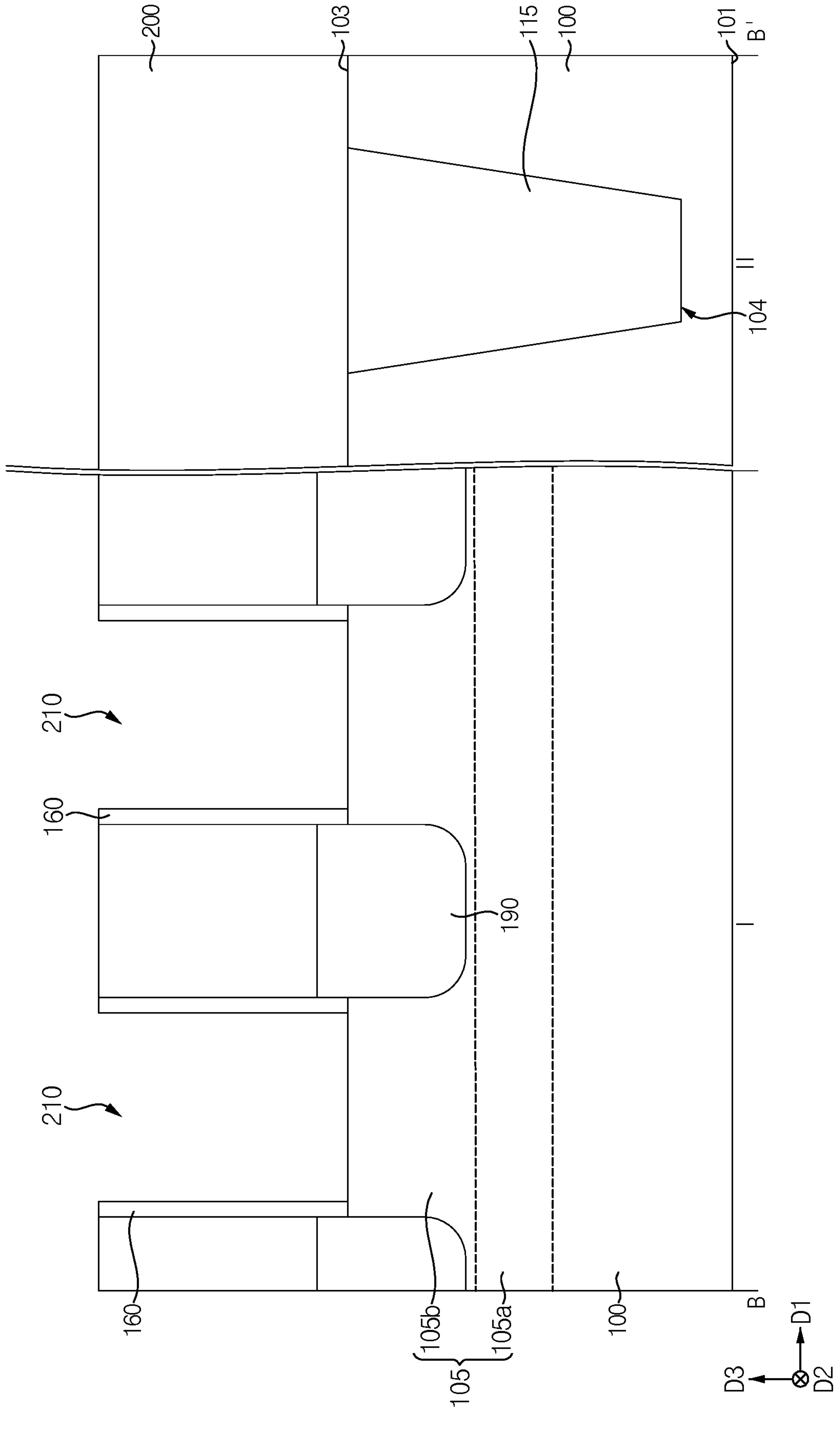

Referring to FIGS. 8 to 10, a first gate spacer 160 may be formed on each of opposite sidewalls in the first direction D1 of the first dummy gate structure 150, and a fin spacer 170 may be formed on each of opposite sidewalls in the second direction D2 of the first active pattern 105.

The first gate spacer 160 and the fin spacer 170 may be formed by forming a first spacer layer on the first active pattern 105, the first isolation pattern 110, the first alignment key 115 and the first dummy gate structure 150, and anisotropically etching the first spacer layer. The first gate spacer 160 may include an insulating nitride, e.g., silicon nitride, silicon oxynitride, silicon oxycarbonitride, etc.

An upper portion of the first active pattern 105 may be etched using the first dummy gate structure 150 and the first gate spacer 160 as an etching mask to form a first recess 180.

FIG. 8 shows that the first recess 180 is formed by partially removing the first upper active pattern 105*b*, however, aspects of the inventive concept may not be limited thereto. In some embodiments, the first recess 180 may be formed by partially removing both of the first lower active pattern 105*a* and the first upper active pattern 105*b*.

In example embodiments, the anisotropic etching process of the first spacer layer and the etching process for forming the first recess 180 may be performed in-situ.

A selective epitaxial growth (SEG) process may be performed using an upper surface of the first active pattern 105 exposed by the first recess 180 as a seed to form a first source/drain layer 190 on the first active pattern 105.

The SEG process may be performed using a silicon source gas, e.g., dichlorosilane ($SiH_2Cl_2$) gas, a germanium source gas, e.g., germane ($GeH_4$) gas, and a p-type impurity source gas, e.g., diborane ($B_2H_6$) gas, so that a single crystalline silicon-germanium layer doped with p-type impurities may be formed as the first source/drain layer 190.

Alternatively, the SEG process may be performed using a silicon source gas, e.g., disilane ($Si_2H_6$) gas, $SiH_3CH_3$ gas, etc., and an n-type impurity source gas, e.g., $PH_3$, $POCl_3$, $P_2O_5$, etc., so that a single crystalline silicon layer doped with n-type impurities or a single crystalline silicon carbide layer doped with n-type impurities may be formed as the first source/drain layer 190.

The first source/drain layer 190 may fill the first recess 180, and may further grow to contact a lower sidewall of the first gate spacer 160. The first source/drain layer 190 may grow in the horizontal direction as well as in the vertical direction, so as to have a cross-section taken along the second direction D2 having a pentagon-like shape. If a distance between ones of the first active patterns 105 neighboring in the second direction D2 is small, ones of the first source/drain layers 190 grown from upper surfaces of the neighboring ones of the first active patterns 105 may be merged with each other.

A first insulating interlayer 200 may be formed on the substrate 100 having the first dummy gate structure 150, the first gate spacer 160, the fin spacer 170, the first source/drain layer 190, the first isolation pattern 110 and the first alignment key 115 thereon to have an upper surface higher than upper surfaces of the first dummy gate structure 150 and the first gate spacer 160.

Referring to FIG. 10, a planarization process may be performed until an upper surface of the first dummy gate electrode 130 included in the first dummy gate structure 150 is exposed to remove an upper portion of the first insulating interlayer 200 and the first dummy gate mask 140 included in the first dummy gate structure 150, and an upper portion of the first gate spacer 160 may also be removed.

The first dummy gate electrode 130 and the first dummy gate insulation pattern 120 may be removed to form a first opening 210 exposing upper surfaces of the first active pattern 105 and the first isolation pattern 110.

In example embodiments, the first dummy gate electrode 130 and the first dummy gate insulation pattern 120 may be removed by sequentially performing a dry etching process and a wet etching process. The wet etching process may be performed using, e.g., hydrofluoric acid (HF) as an etching solution.

Figure 11:
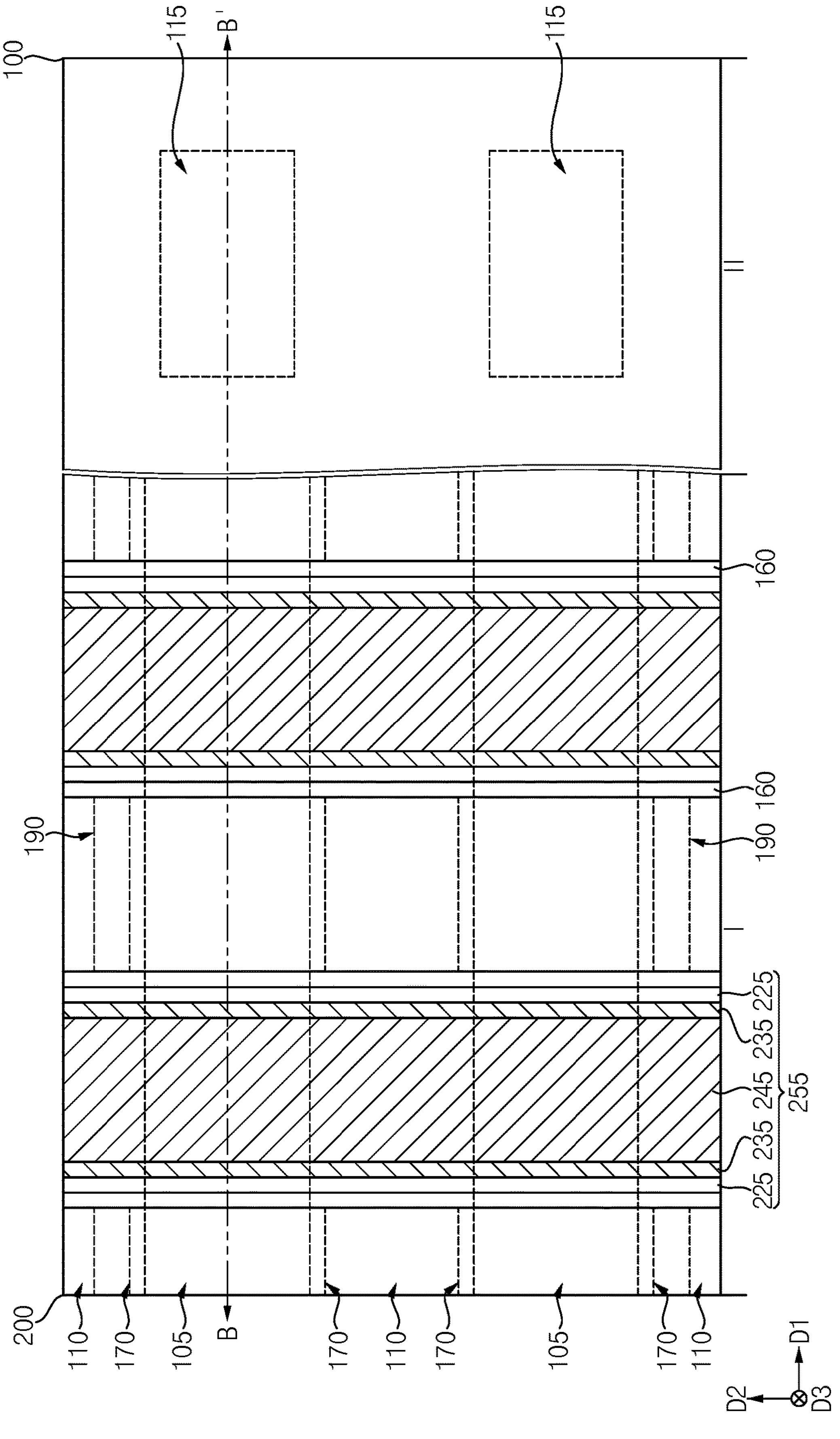
Figure 12:
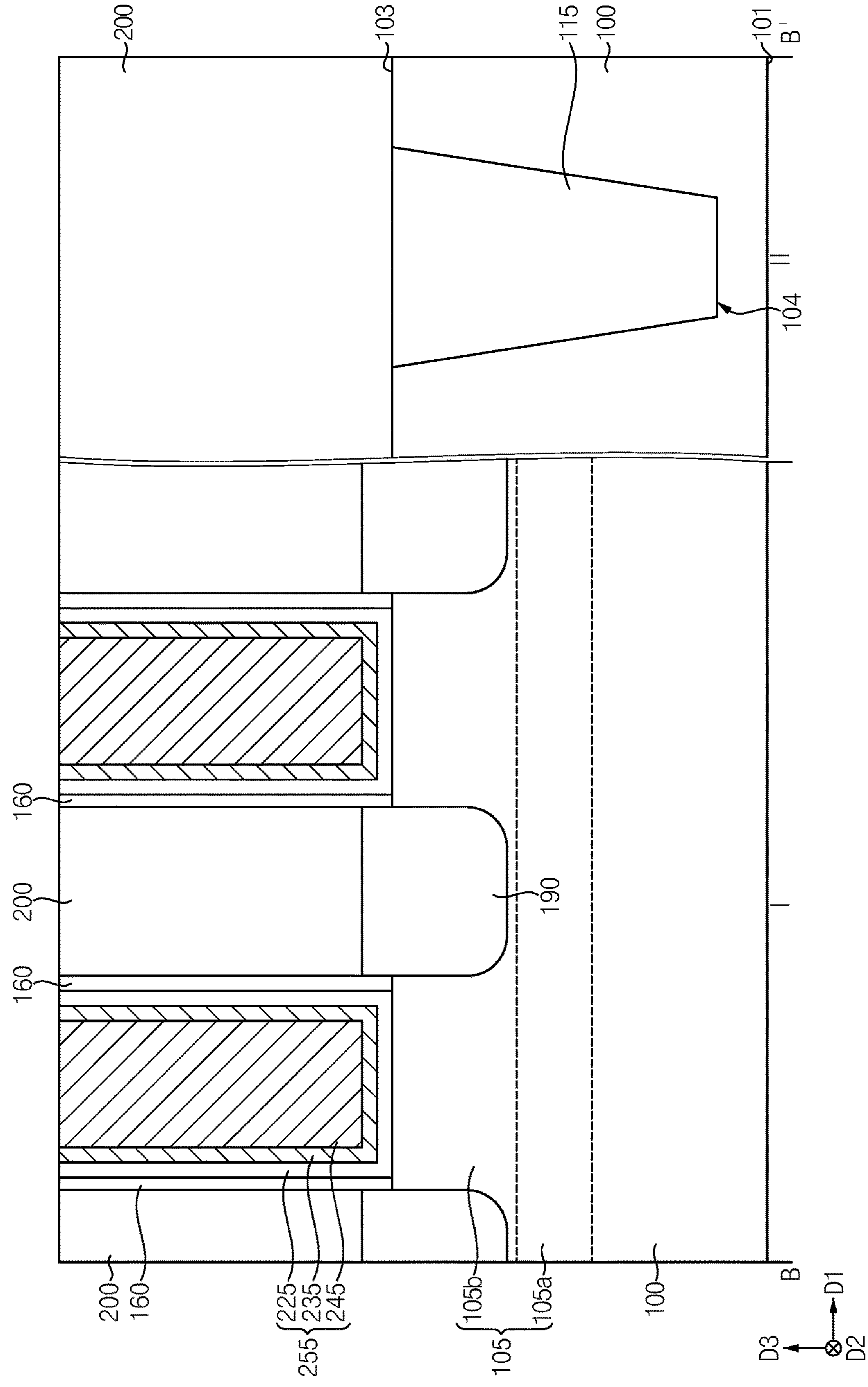

Referring to FIGS. 11 and 12, a first gate insulation layer and a first conductive layer may be sequentially stacked on a bottom and a sidewall of the first opening 210 and an upper surface of the first insulating interlayer 200, forming a second conductive layer on the first conductive layer to fill a remaining portion of the first opening 210, and the second conductive layer, the first conductive layer and the first gate insulation layer may be planarized until the upper surface of the first insulating interlayer 200 is exposed.

Thus, a first gate structure 255 including a first gate insulation pattern 225, a first conductive pattern 235 and a second conductive pattern 245 sequentially stacked may be formed in the first opening 210, and the first and second conductive patterns 235 and 245 may form a first gate electrode.

In example embodiments, each of the first and second conductive patterns 235 and 245 may include a metal, e.g., tungsten, aluminum, copper, titanium, etc., a metal nitride, e.g., titanium nitride, tantalum nitride, tungsten nitride, etc., or a metal alloy.

Figure 13:
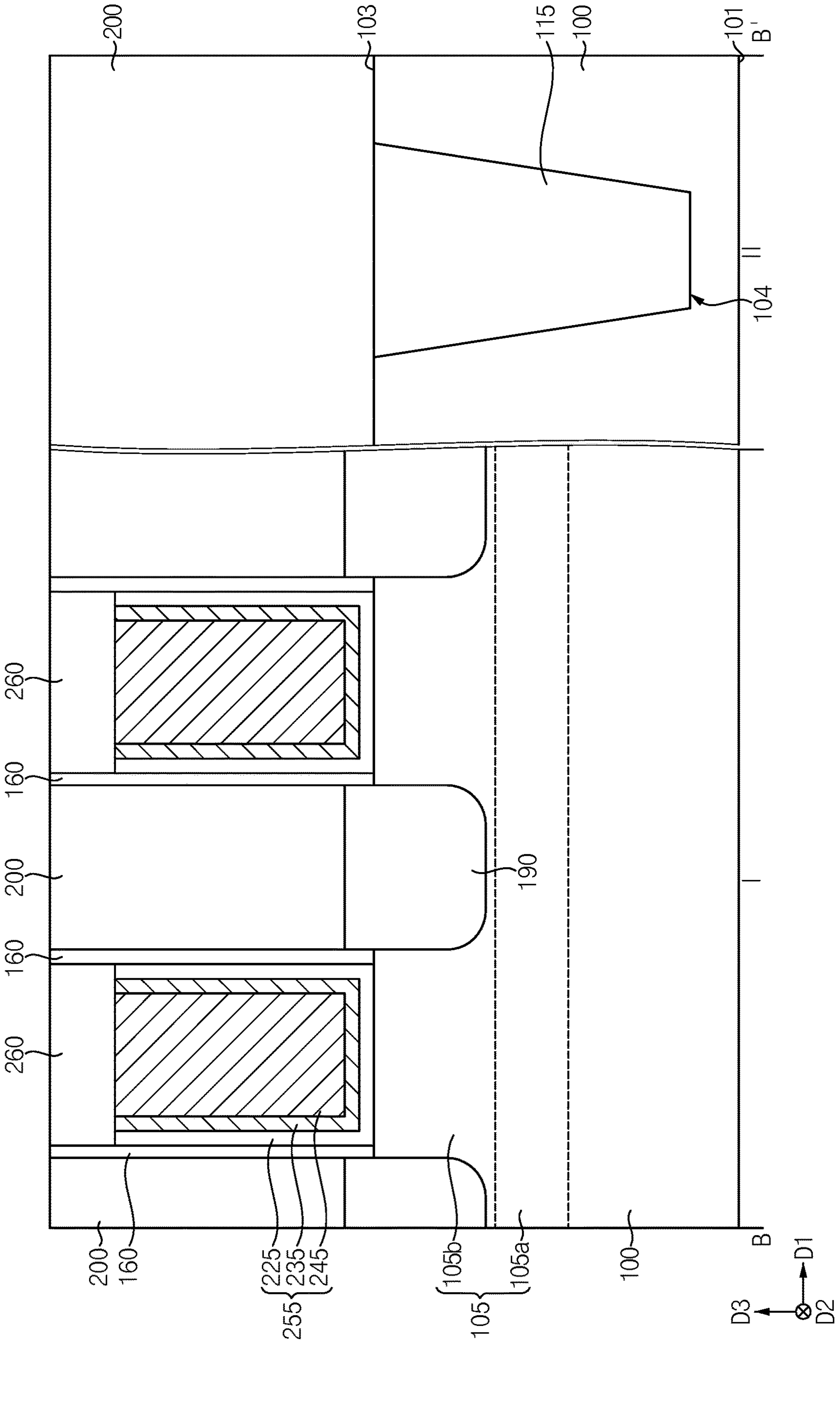
Figure 14:
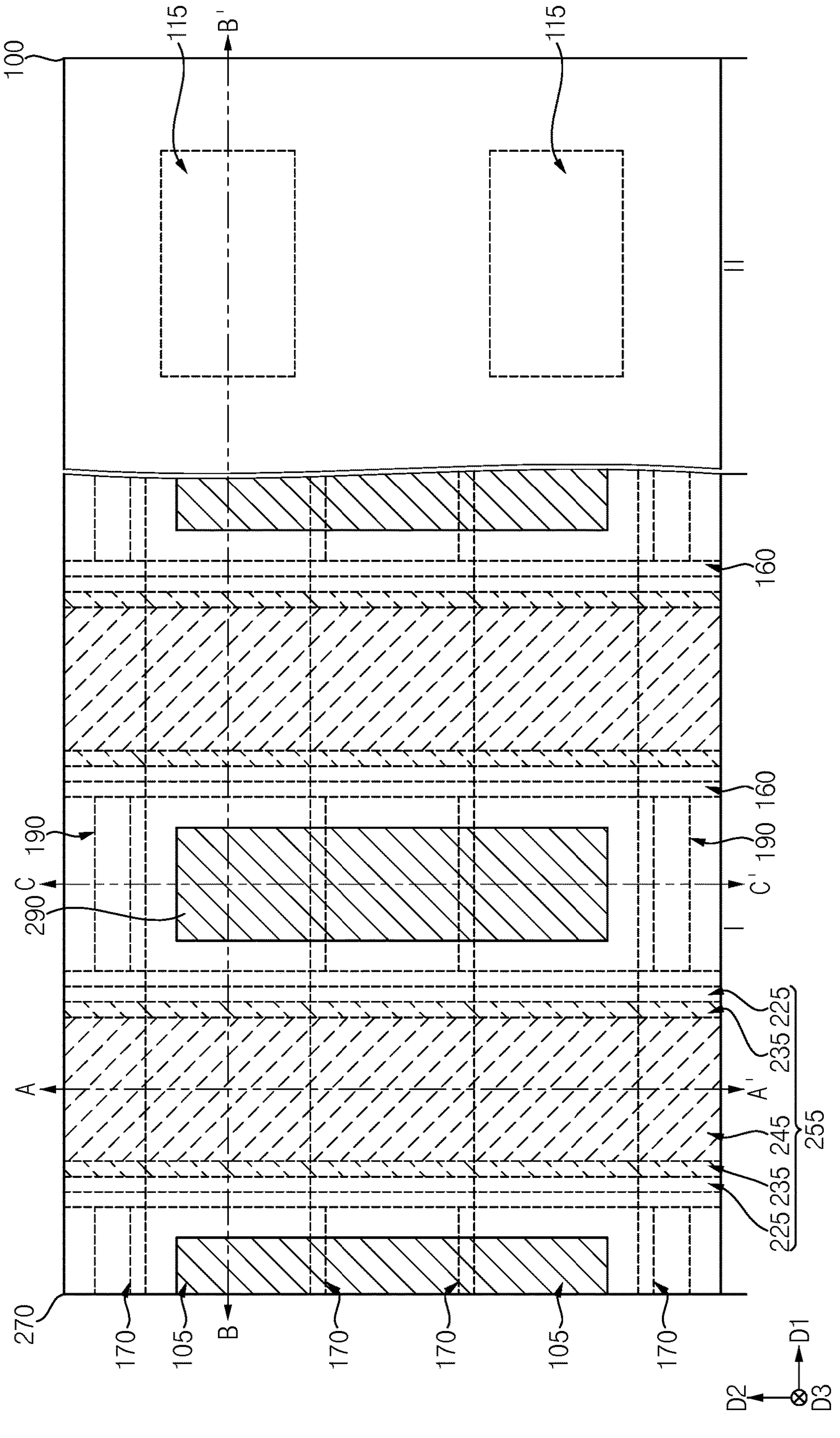
Figure 15:
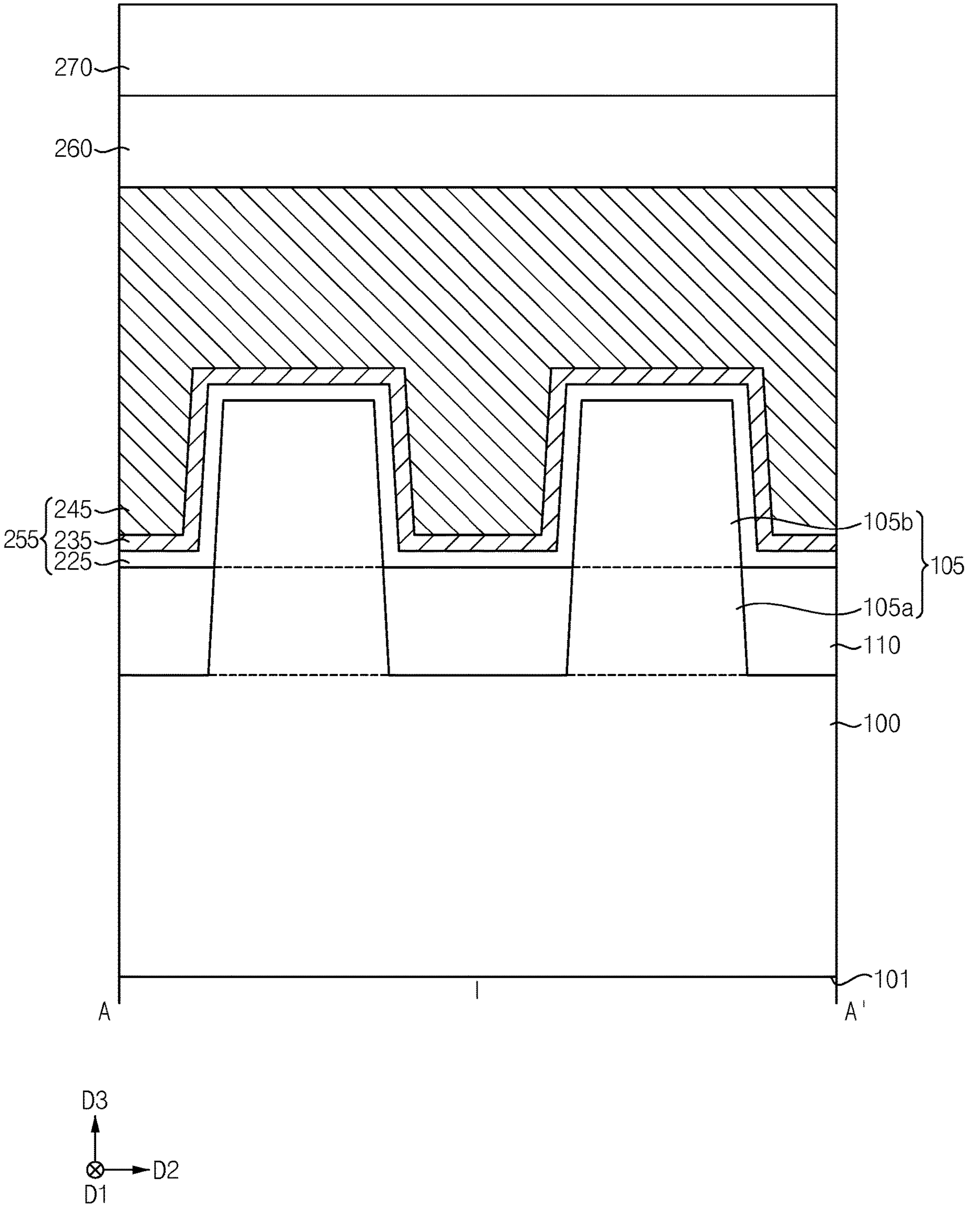
Figure 16:
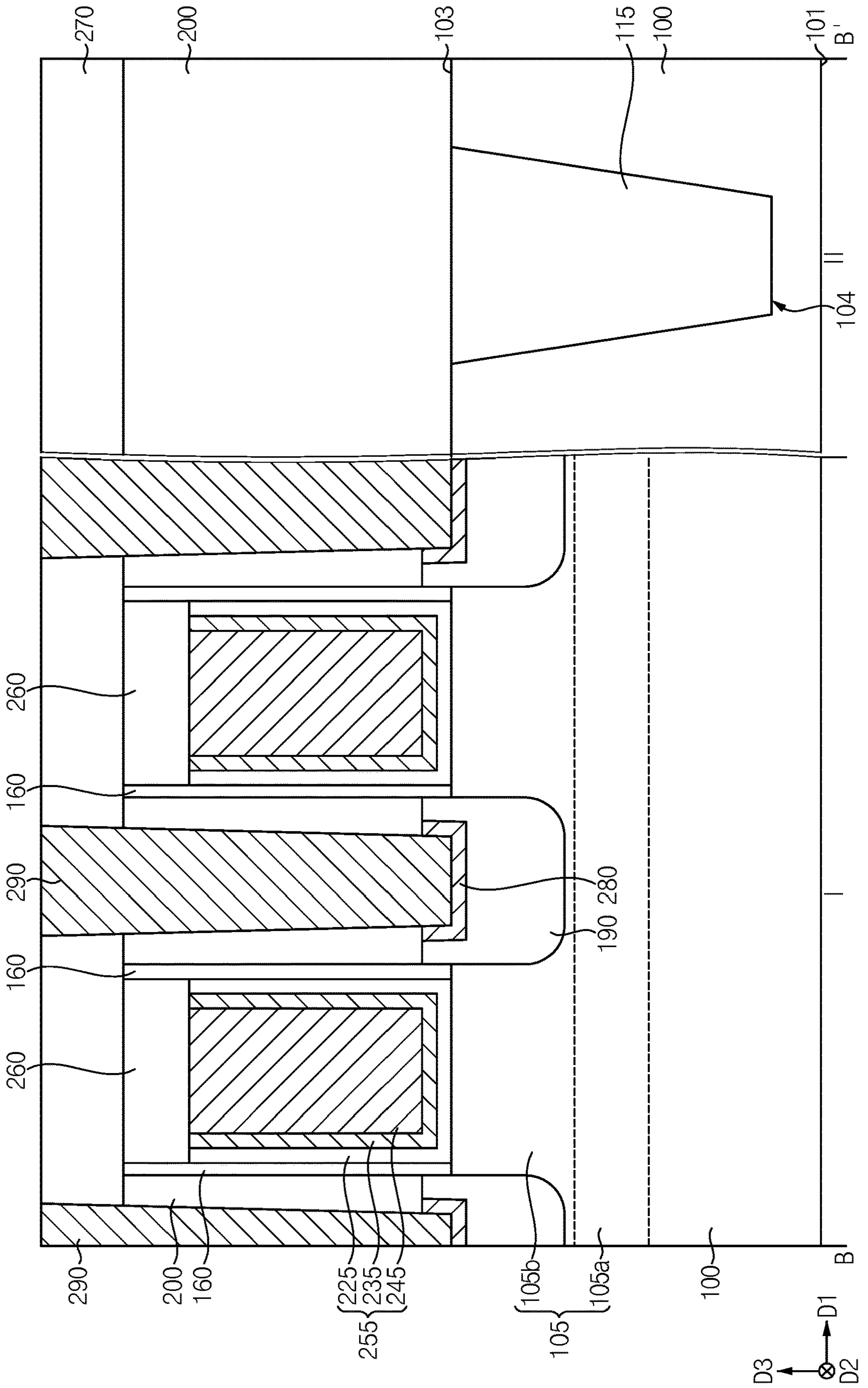
Figure 17:
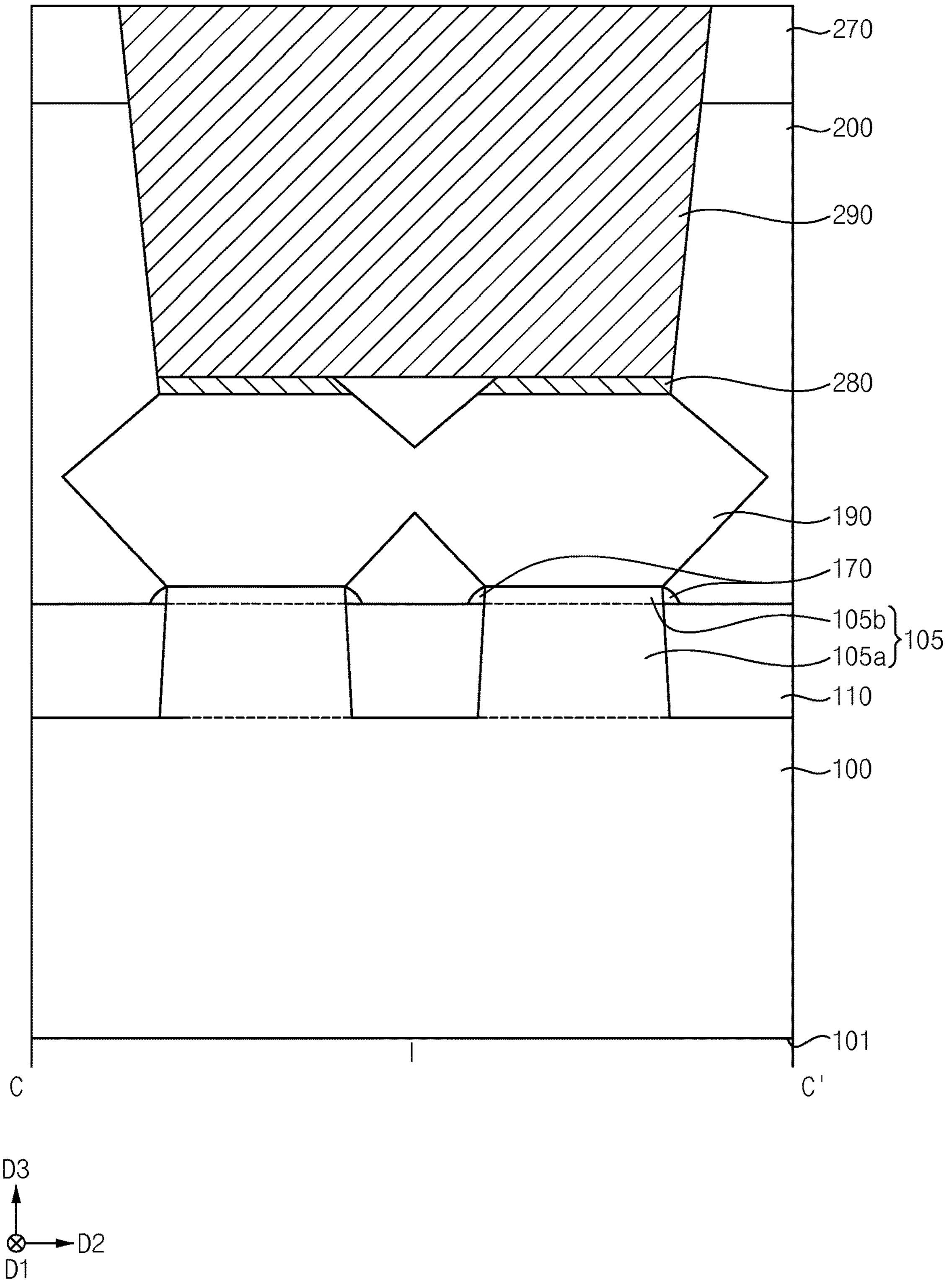

Referring to FIG. 13, an upper portion of the first gate structure 255 may be removed to form a second recess, a first capping pattern 260 may be formed in the second recess.

The first capping pattern 260 may include an insulating nitride, e.g., silicon nitride, silicon oxynitride, silicon oxycarbonitride, etc.

Referring to FIGS. 14 to 17, a second insulating interlayer 270 may be formed on the first insulating interlayer 200, the first capping pattern 260 and the first gate spacer 160, and the second insulating interlayer 270 may be partially etched to form a second opening exposing an upper surface of the first source/drain layer 190. The second opening may partially extend through an upper portion of the first source/drain layer 190.

The second insulating interlayer 270 may include an oxide, e.g., silicon oxide.

A first ohmic contact pattern 280 may be formed on the upper surface of the first source/drain layer 190 exposed by the second opening.

Particularly, a first metal layer may be formed on the upper surface of the first source/drain layer 190 exposed by the second opening, a sidewall of the second opening and an upper surface of the second insulating interlayer 270, and a heat treatment process may be performed on the first metal layer so that a metal included in the first metal layer and silicon included in the first source/drain layer 190 may be reacted with each other to form the first ohmic contact pattern 280 on the upper surface of the first source/drain layer 190. An unreacted portion of the first metal layer that is not reacted with the first source/drain layer 190 may be removed.

The first ohmic contact pattern 280 may include a metal silicide, e.g., cobalt silicide, nickel silicide, titanium silicide, etc.

A first contact plug layer may be formed on the first ohmic contact pattern 280 and the second insulating interlayer 270 to fill the second opening, and the first contact plug layer may be planarized until the upper surface of the second insulating interlayer 270 is exposed to form a first contact plug 290 in the second opening.

In example embodiments, the first contact plug 290 may have a width gradually decreasing from a top toward a bottom thereof in the third direction D3. The first contact plug 290 may include, e.g., a metal, a metal nitride, etc.

Upper vias and upper wirings may be further formed on the first contact plug 290 and the first gate electrode included in the first gate structure 255.

Figure 18:
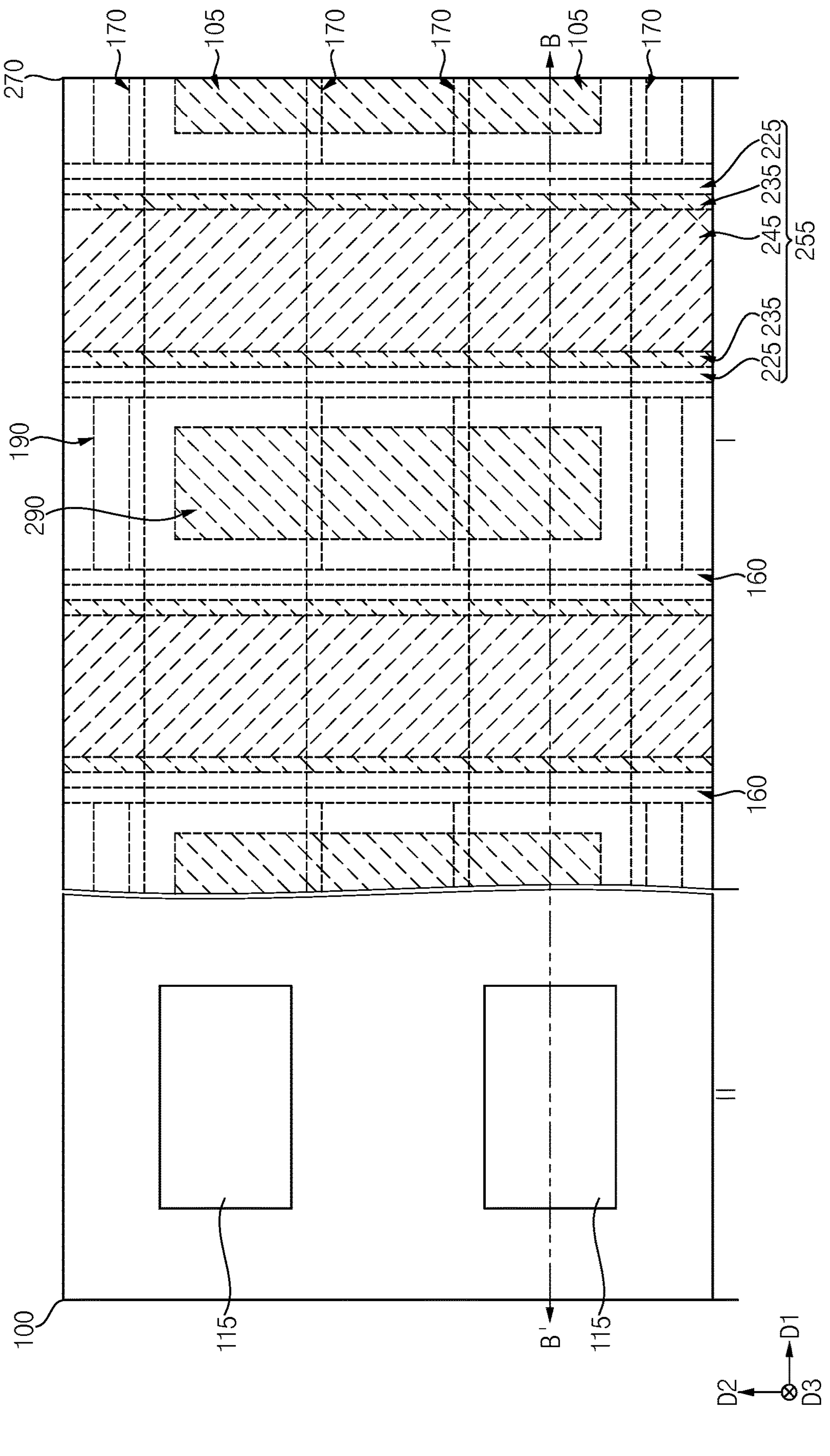
Figure 19:
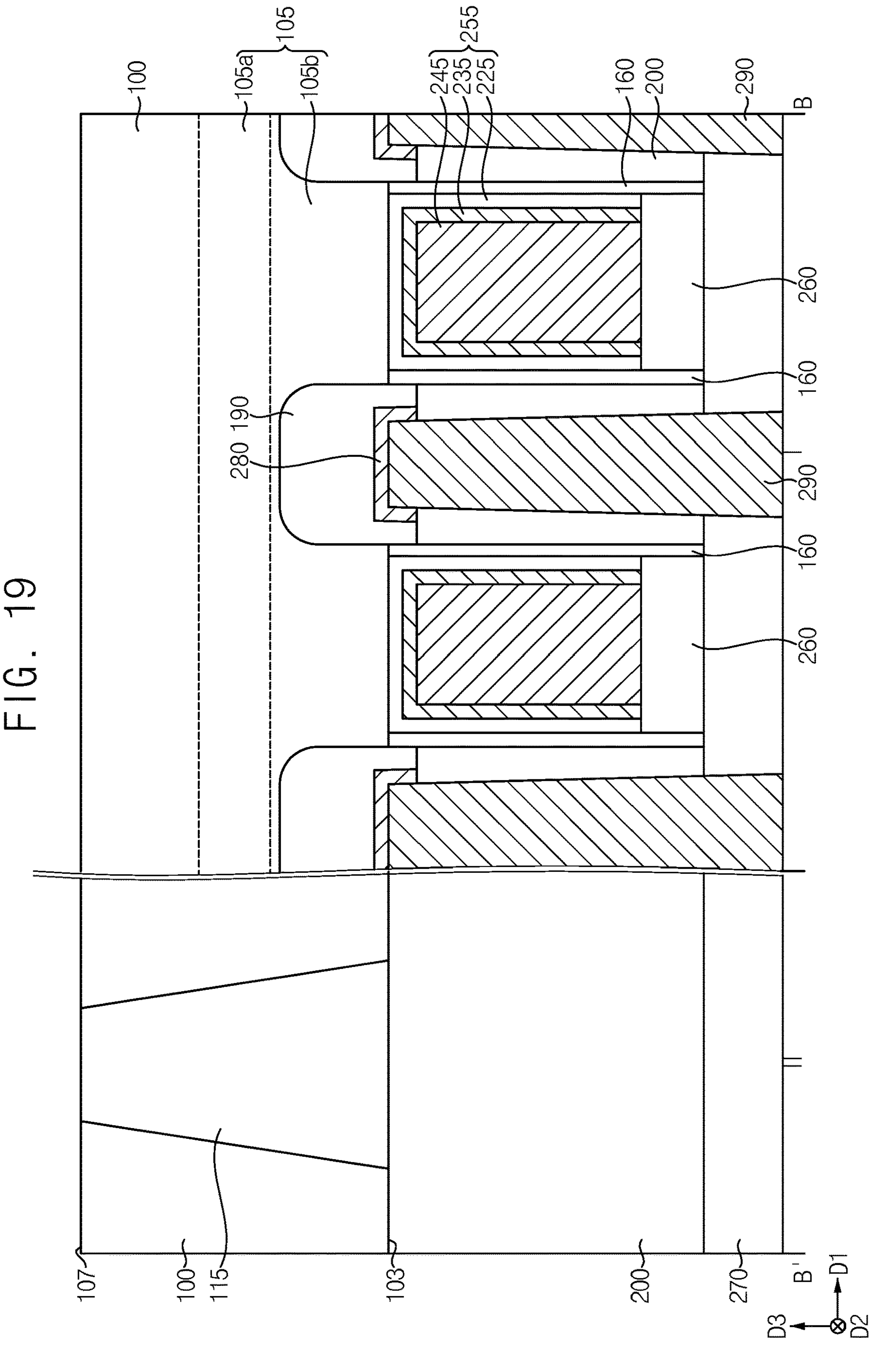

Referring to FIGS. 18 and 19, the substrate 100 may be turned over so that the first and second surfaces 101 and 103 of the substrate 100 may face upwardly and downwardly, respectively, and upper and lower portions of structures on the substrate 100 may be referred to as lower and upper portions, respectively, of the structures hereinafter.

An upper portion of the substrate 100, that is, a portion of the substrate 100 adjacent to the second surface 103 may be removed to expose the first alignment key 115.

In example embodiments, the upper portion of the substrate 100 may be removed by, e.g., a grinding process and/or a chemical mechanical polishing (CMP) process.

An upper surface of the substrate 100 after removing the upper portion of the substrate 100 may be referred to as a third surface 107.

Figure 20:
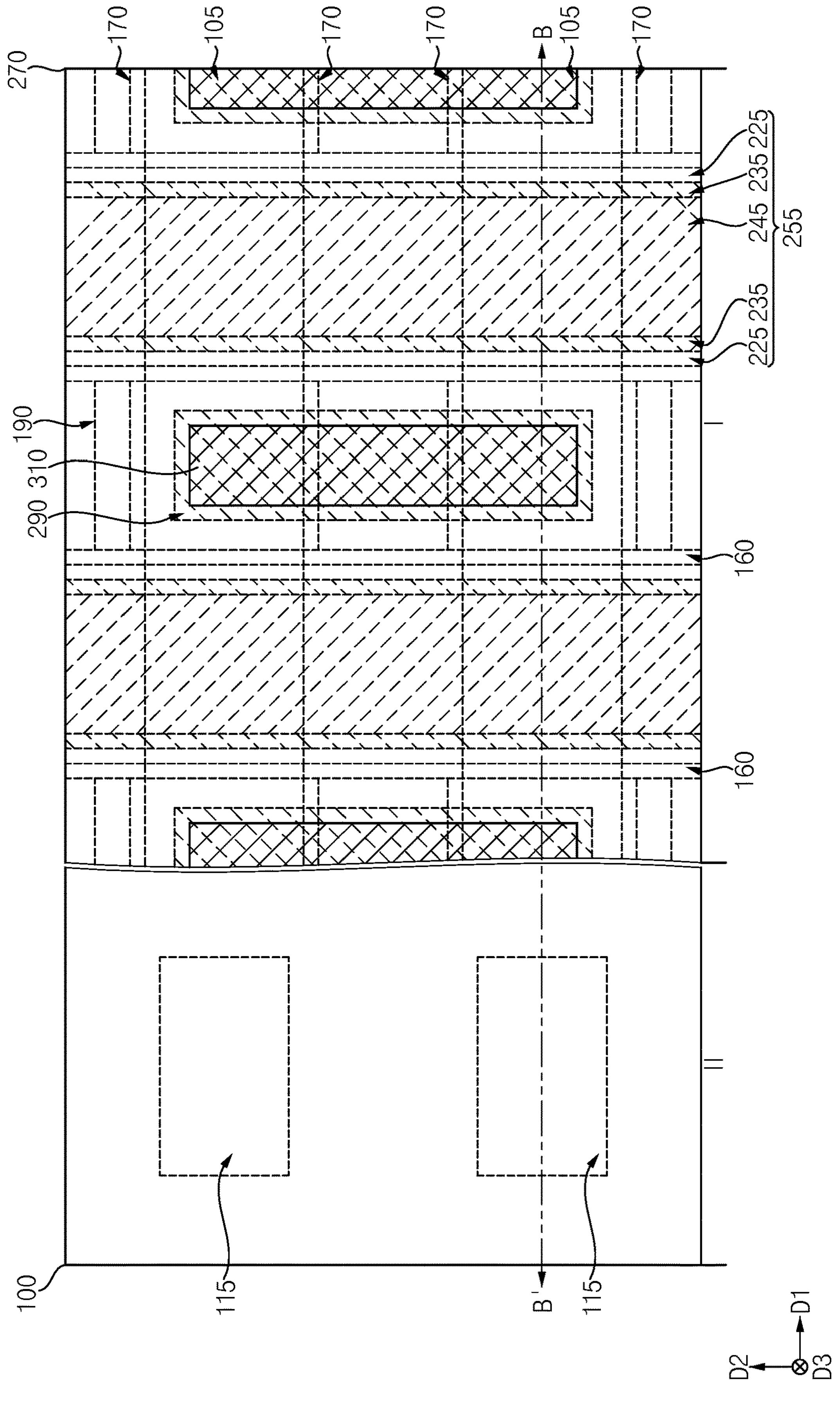
Figure 21:
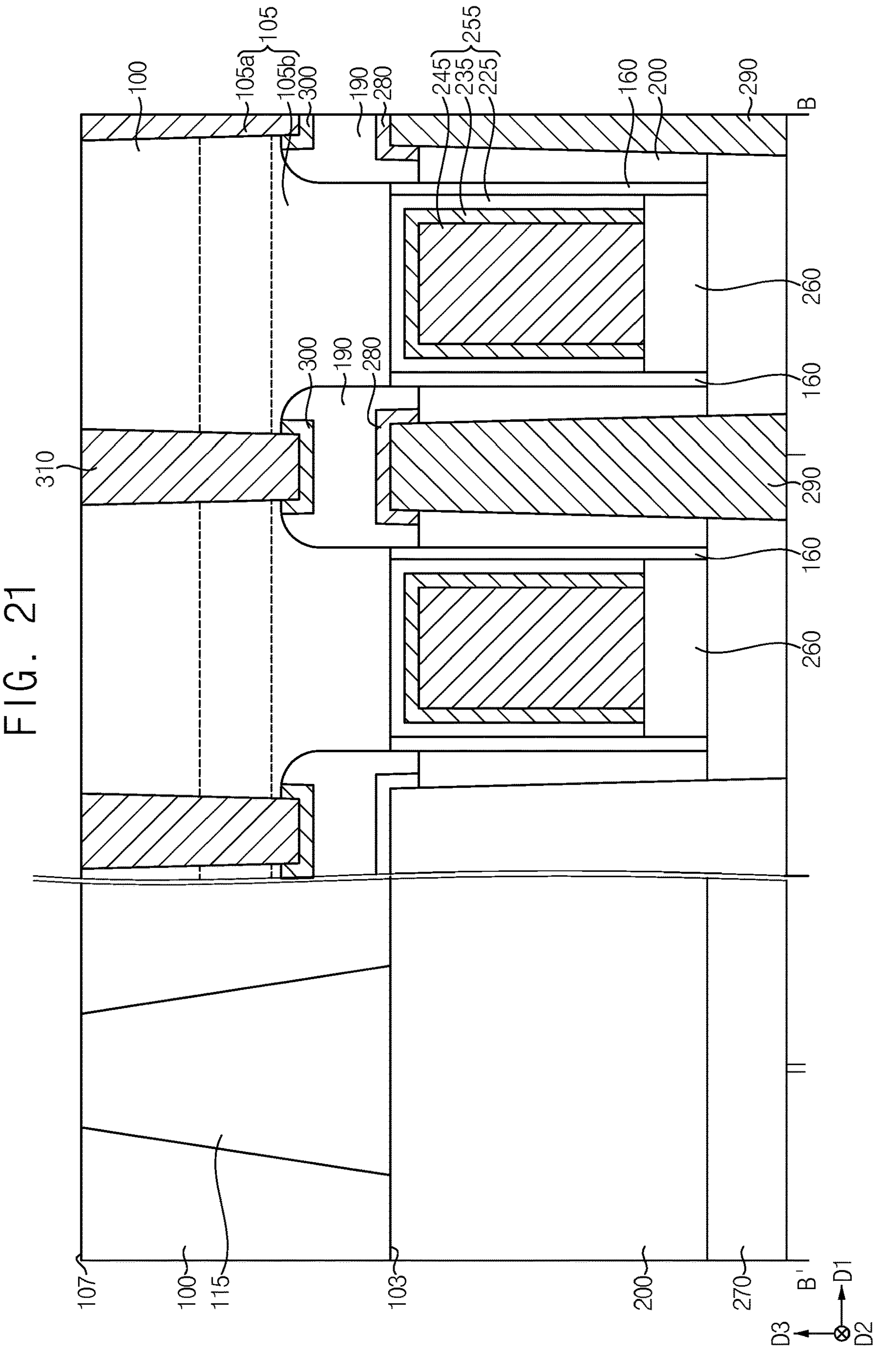
Figure 22:
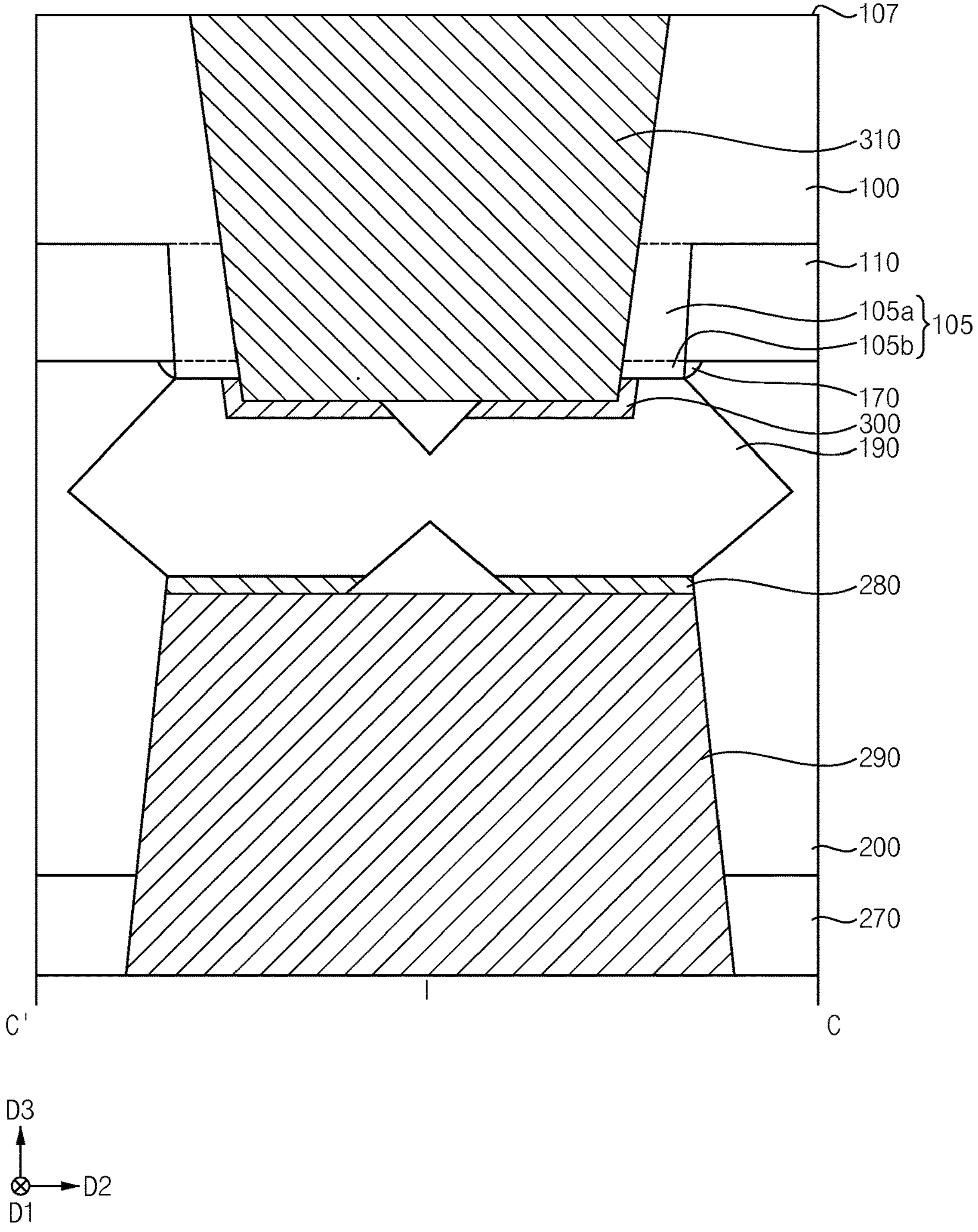

Referring to FIGS. 20 to 22, a third opening may be formed through the first active pattern 105 of the substrate 100 to expose an upper surface of the first source/drain layer 190, and the third opening may partially extend through an upper portion of the first source/drain layer 190.

In example embodiments, when the third opening is formed, the first alignment key 115 on the second region II of the substrate 100 may be used for positioning and aligning the third opening.

A second ohmic contact pattern 300 may be formed on the upper surface of the first source/drain layer 190 exposed by the third opening.

Particularly, a second metal layer may be formed on the upper surface of the first source/drain layer 190 exposed by the third opening, a sidewall of the third opening and an upper surface, that is, the third surface of the substrate 100, and a heat treatment process may be performed on the second metal layer so that a metal included in the second metal layer and silicon included in the first source/drain layer 190 may be reacted with each other to form the second ohmic contact pattern 300 on the upper surface of the first source/drain layer 190. An unreacted portion of the second metal layer that is not reacted with the first source/drain layer 190 may be removed.

The second ohmic contact pattern 300 may include a metal silicide, e.g., cobalt silicide, nickel silicide, titanium silicide, etc.

A second contact plug layer may be formed on the second ohmic contact pattern 300 and the substrate 100 to fill the third opening, and the second contact plug layer may be planarized until the upper surface, that is, the third surface of the substrate 100 is exposed to form a second contact plug 310 in the third opening.

In example embodiments, the second contact plug 310 may have a width gradually decreasing from a top toward a bottom thereof in the third direction D3. The second contact plug 310 may include, e.g., a metal, a metal nitride, etc.

In some embodiments, a second insulation layer may be further formed on the sidewall of the third opening, and thus a sidewall of the second contact plug 310 may be electrically insulated from the substrate 100 by the second insulation layer.

Referring to FIGS. 23 to 26, a third insulating interlayer 320 may be formed on the third surface 107 of the substrate 100, the first alignment key 115 and the second contact plug 310, and a first via 330 may be formed through the third insulating interlayer 320 to contact an upper surface of the second contact plug 310.

A fourth insulating interlayer 340 may be formed on the third insulating interlayer 320 and the first via 330, and a first wiring 350 may be formed through the fourth insulating interlayer 340 to contact an upper surface of the first via 330.

In example embodiments, the first wiring 350 may serve as a power rail for providing power.

In an example embodiment, the first wiring 350 may extend in the first direction D1. Alternatively, the first wiring 350 may extend in the second direction D2.

Figure 23:
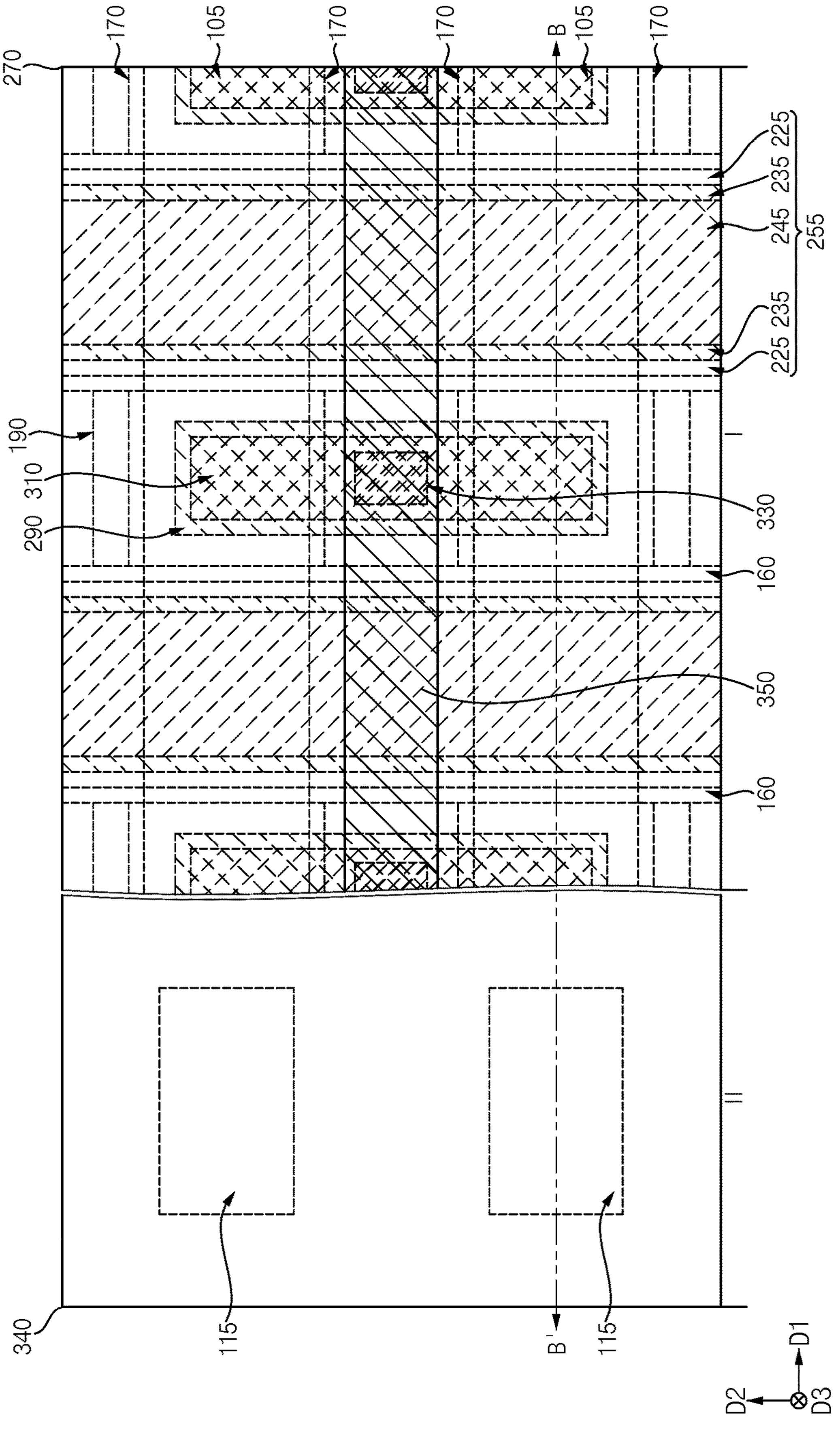
Figure 24:
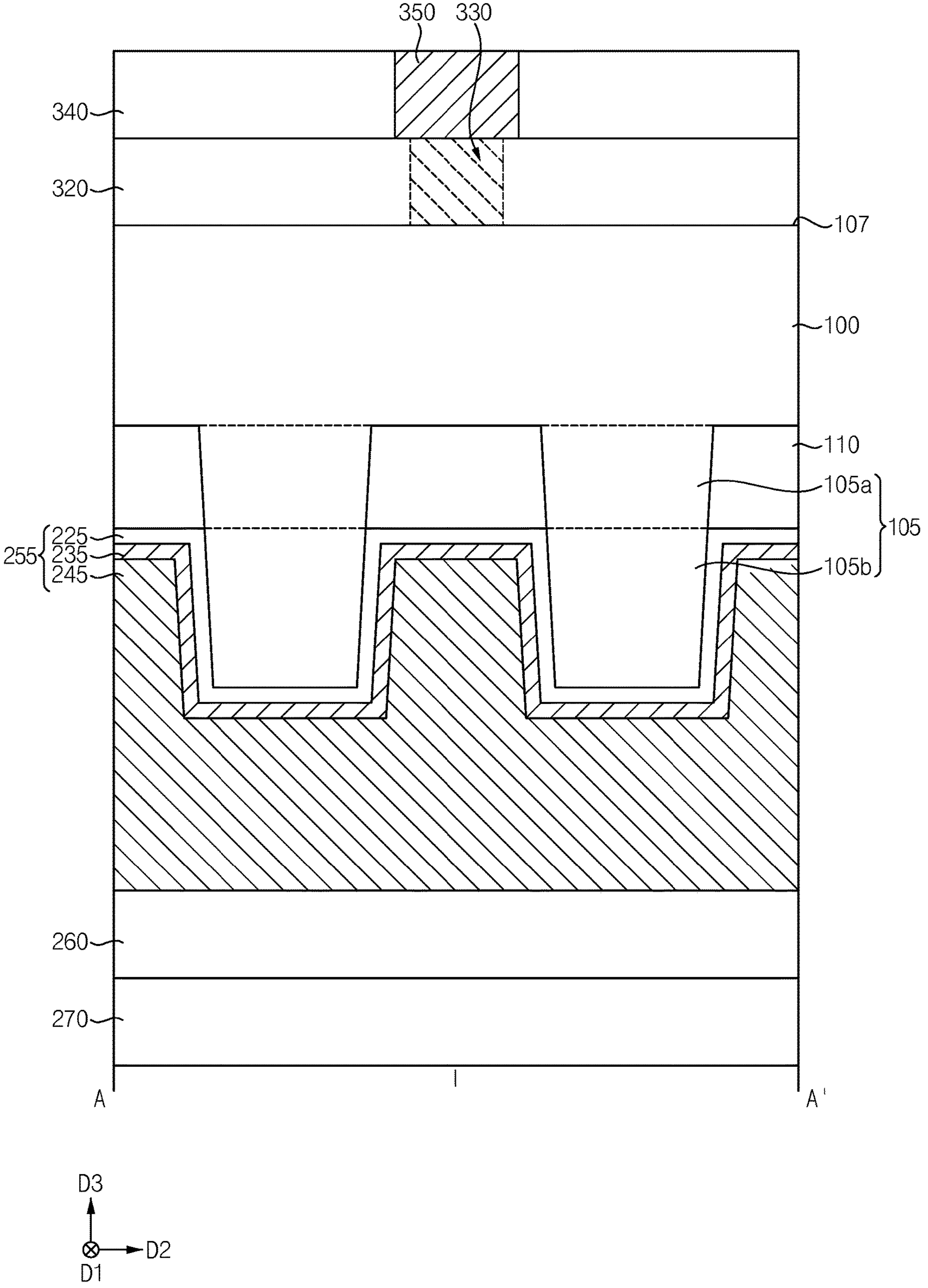
Figure 25:
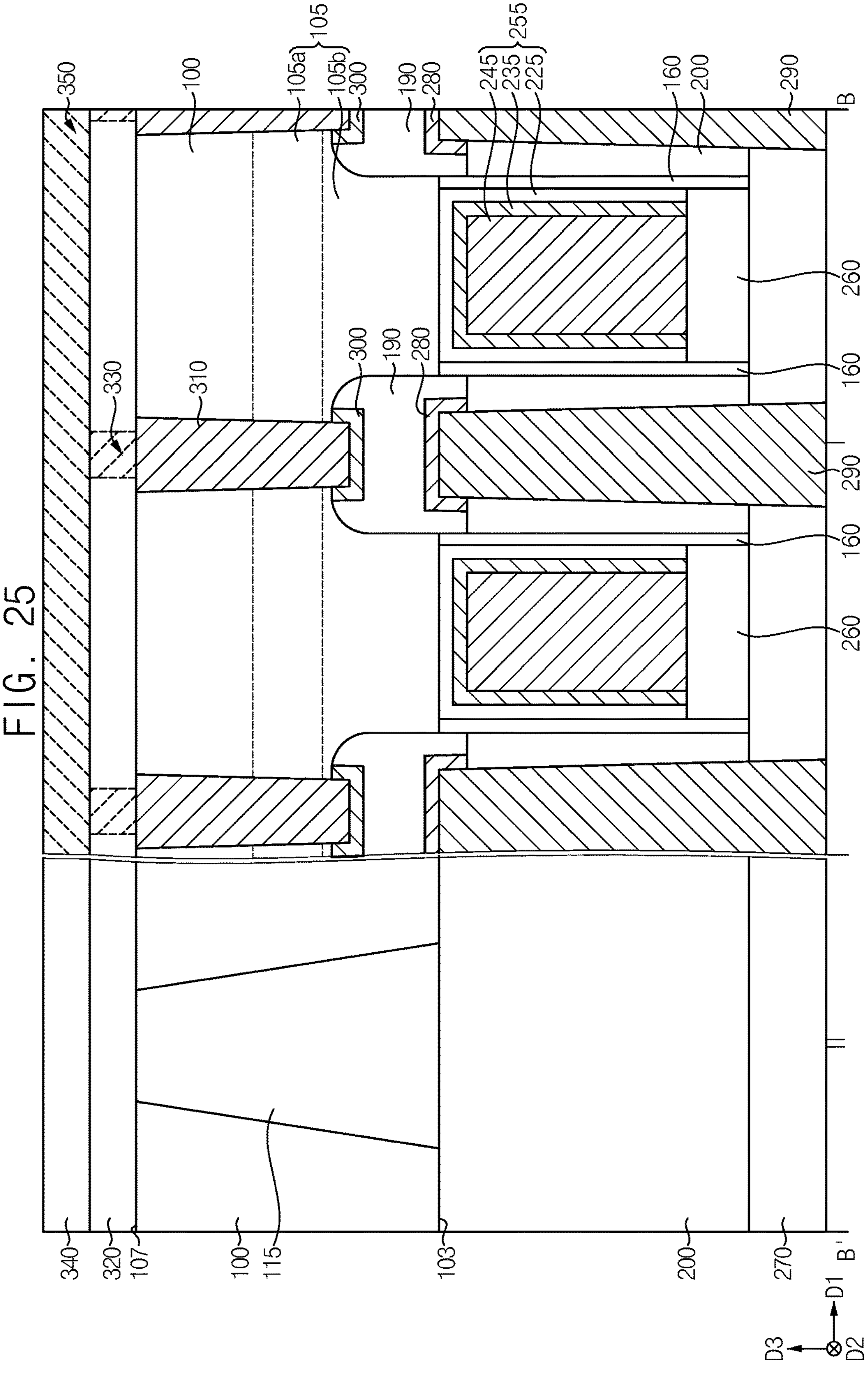
Figure 26:
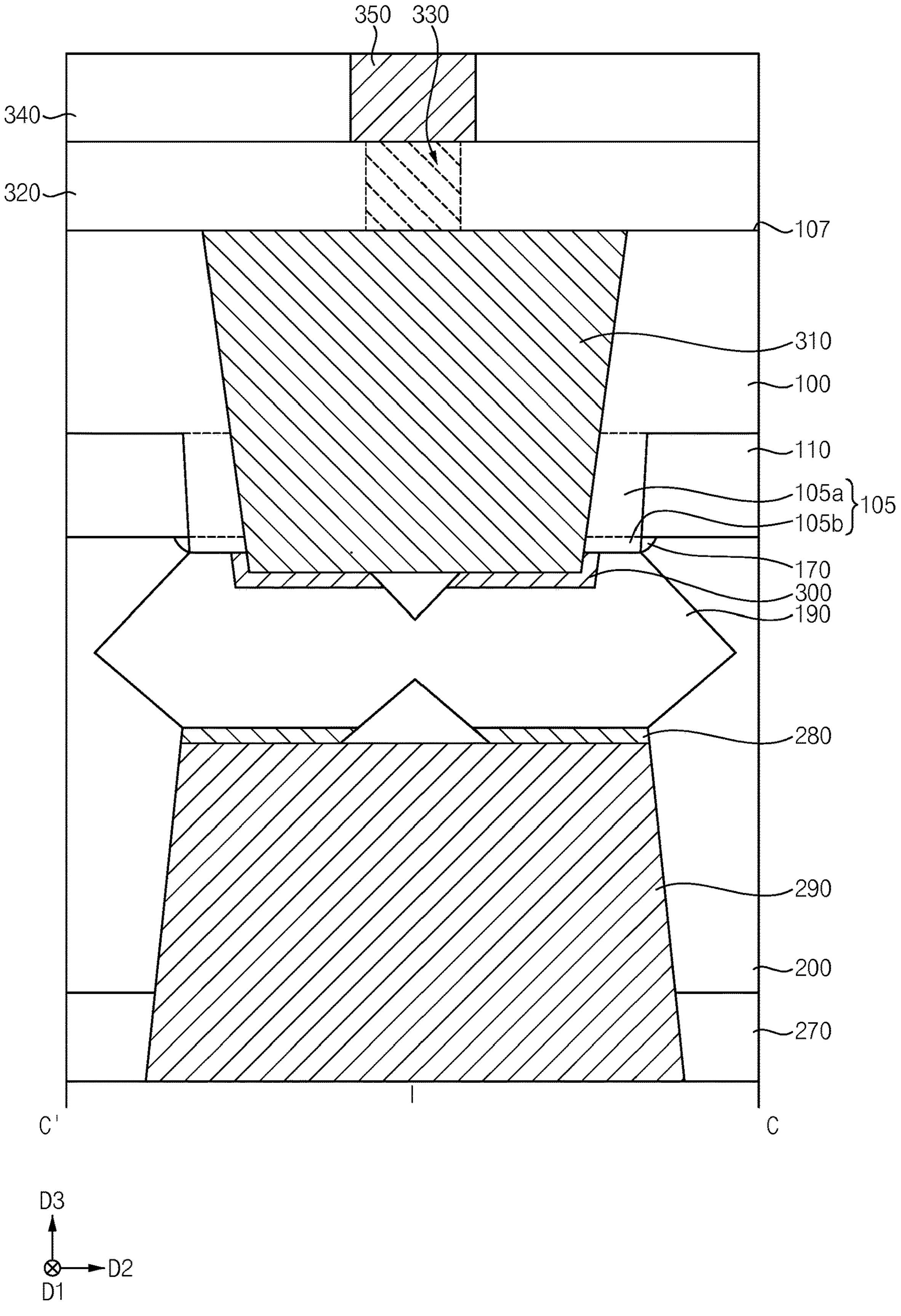

FIGS. 23 to 25 show that the first wiring 350 overlaps the first gate structures 255 in the third direction D3, however, aspects of the inventive concept may not be limited thereto. For example, the second contact plug 310 may extend in the second direction D2 to a length greater than a length of the first gate structure 255, and each of the first via 330 and the first wiring 350 may not overlap the first gate structures 255 in the third direction D3.

The first via 330 and the first wiring 350 may include, e.g., a metal, a metal nitride, etc.

The second region II of the substrate 100 may be removed by, e.g., a sawing process, and the first alignment key 115 may also be removed.

By the above processes, the semiconductor device may be manufactured. The semiconductor device may include a finFET that may have the first gate structure 255 on the first active pattern 105 and the first source/drain layers 190 at portions of the first active pattern 105 adjacent to the first gate structure 255.

As illustrated above, the first alignment key 115 may be formed to be adjacent to the second surface 103 of the substrate 100, and may be used for positioning and aligning the structures on the second surface 103 of the substrate 100, e.g., the first dummy gate structure 150, and may be exposed by removing a portion of the substrate 100 adjacent to the first surface 101 of the substrate 100. Thus, the first alignment key 115 may also be used for positioning and aligning the structures on the third surface 107 of the substrate 100, e.g., the third opening for forming the second contact plug 310.

Accordingly, even though the first wiring 350 is formed on the third surface 107 of the substrate 100 instead of the second surface 103 of the substrate 100, the structures, e.g., the second contact plug 310 for electrically connecting the structures adjacent to the second surface 103 of the substrate 100, e.g., the first source/drain layer 190 to the first wiring 350 may be aligned with the first source/drain layer 190 in the third direction D3.

FIGS. 27 to 49 are plan views and cross-sectional views illustrating a semiconductor device in accordance with example embodiments. Particularly, FIGS. 27, 30, 33, 37, 40, 44 and 46 are the plan views, and FIGS. 28, 29, 31, 32, 34-36, 38, 39, 41-43, 45 and 47-49 are the cross-sectional views.

Figure 34:
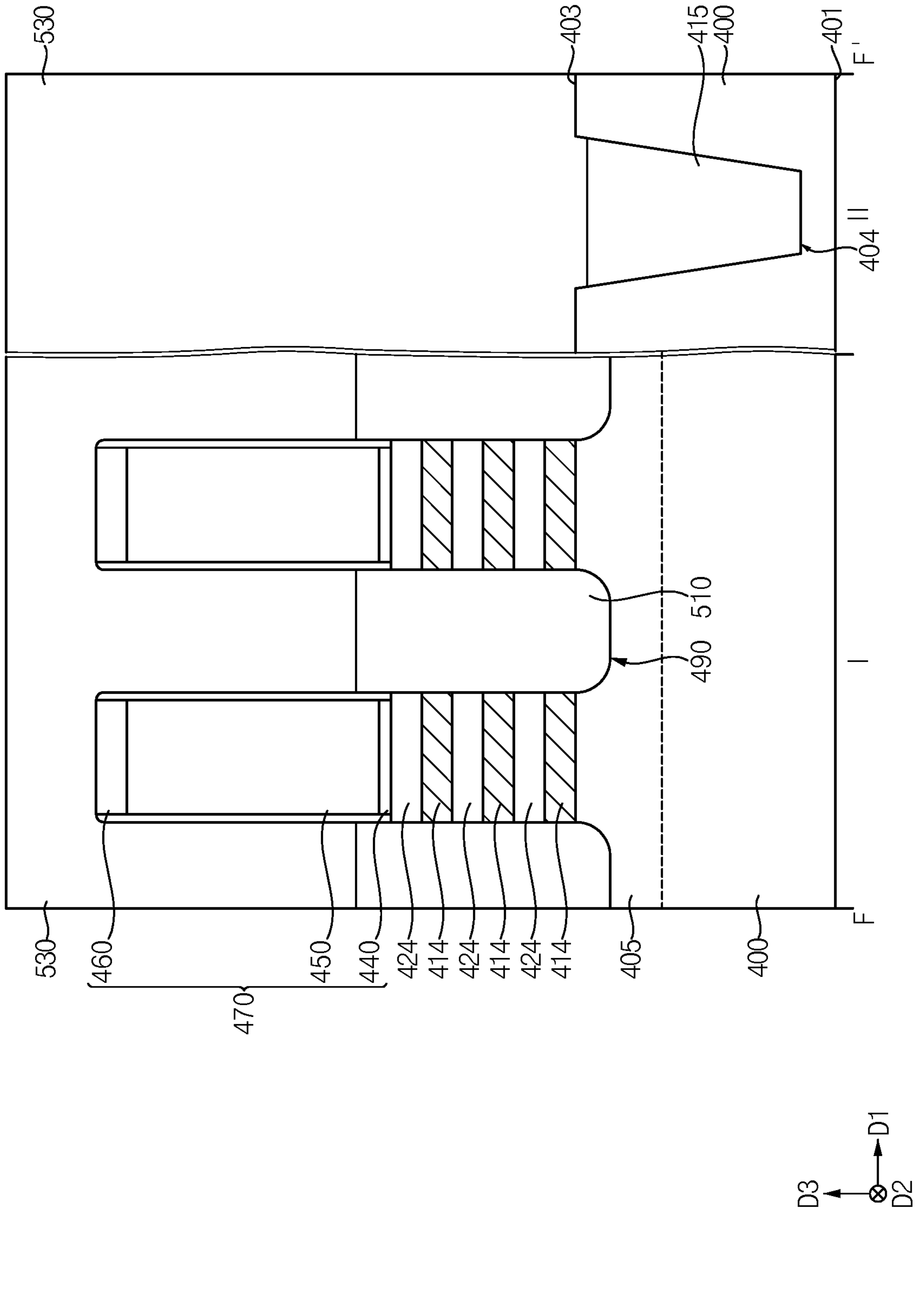
Figure 35:
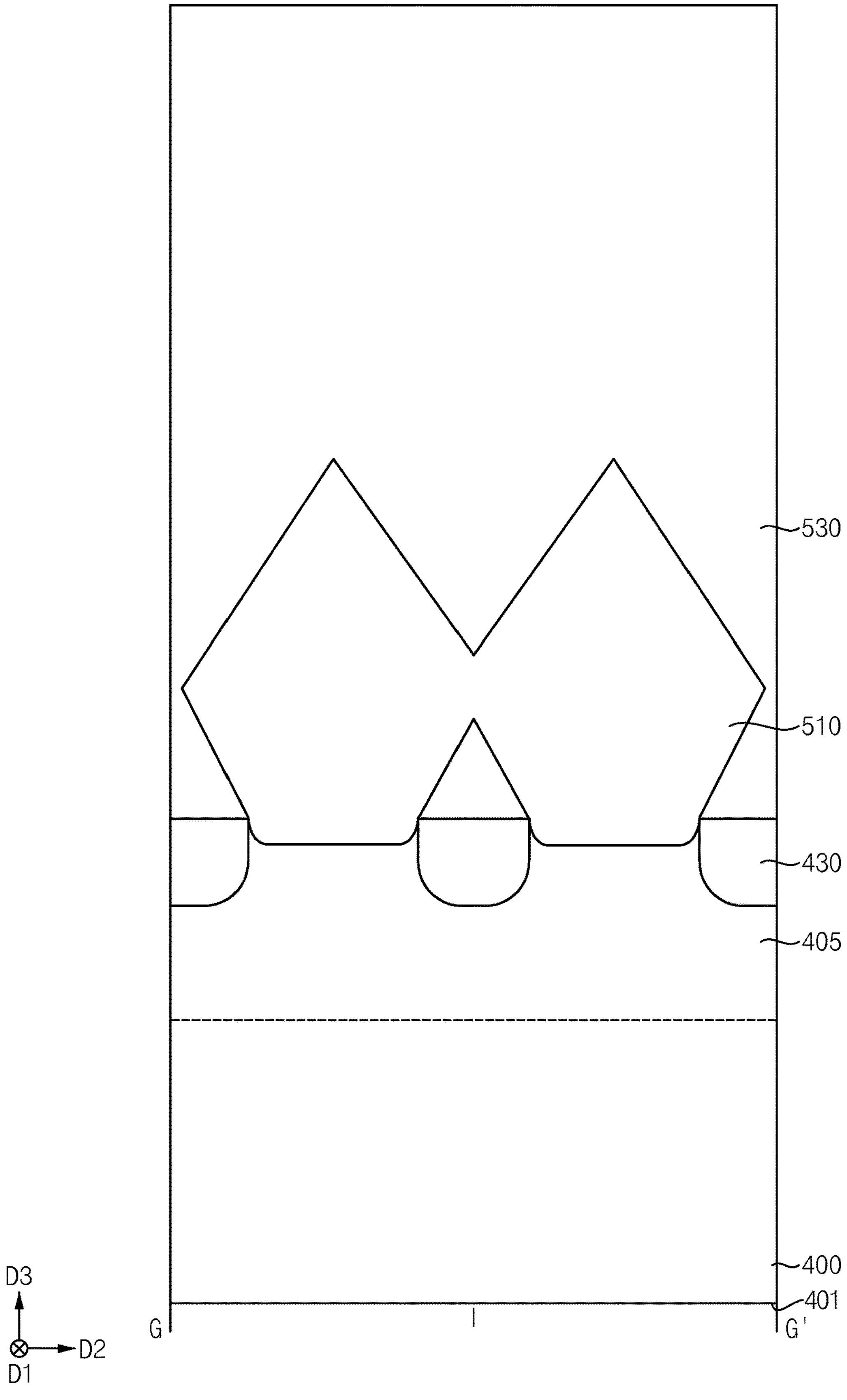
Figure 43:
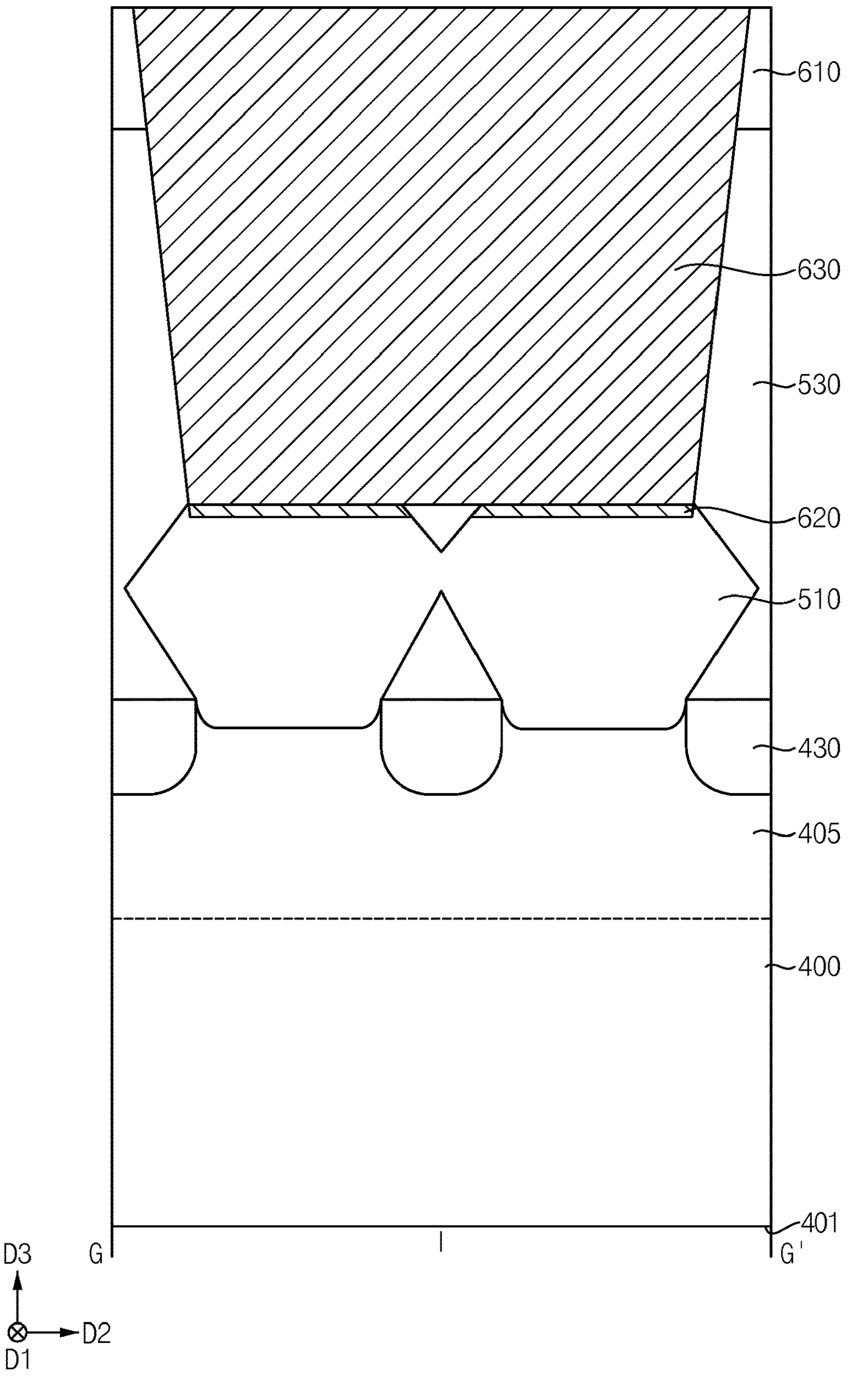
Figure 48:
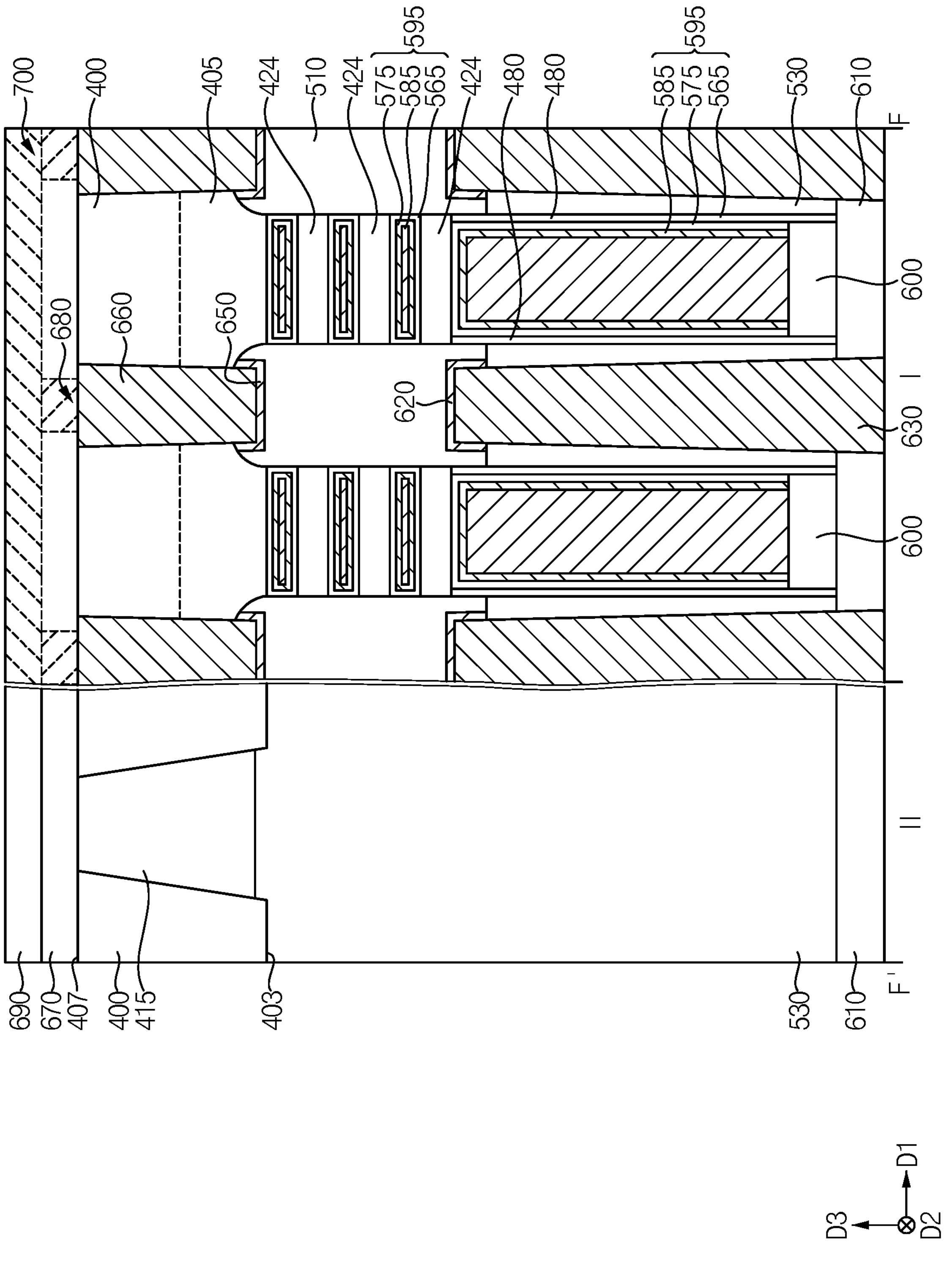
Figure 49:
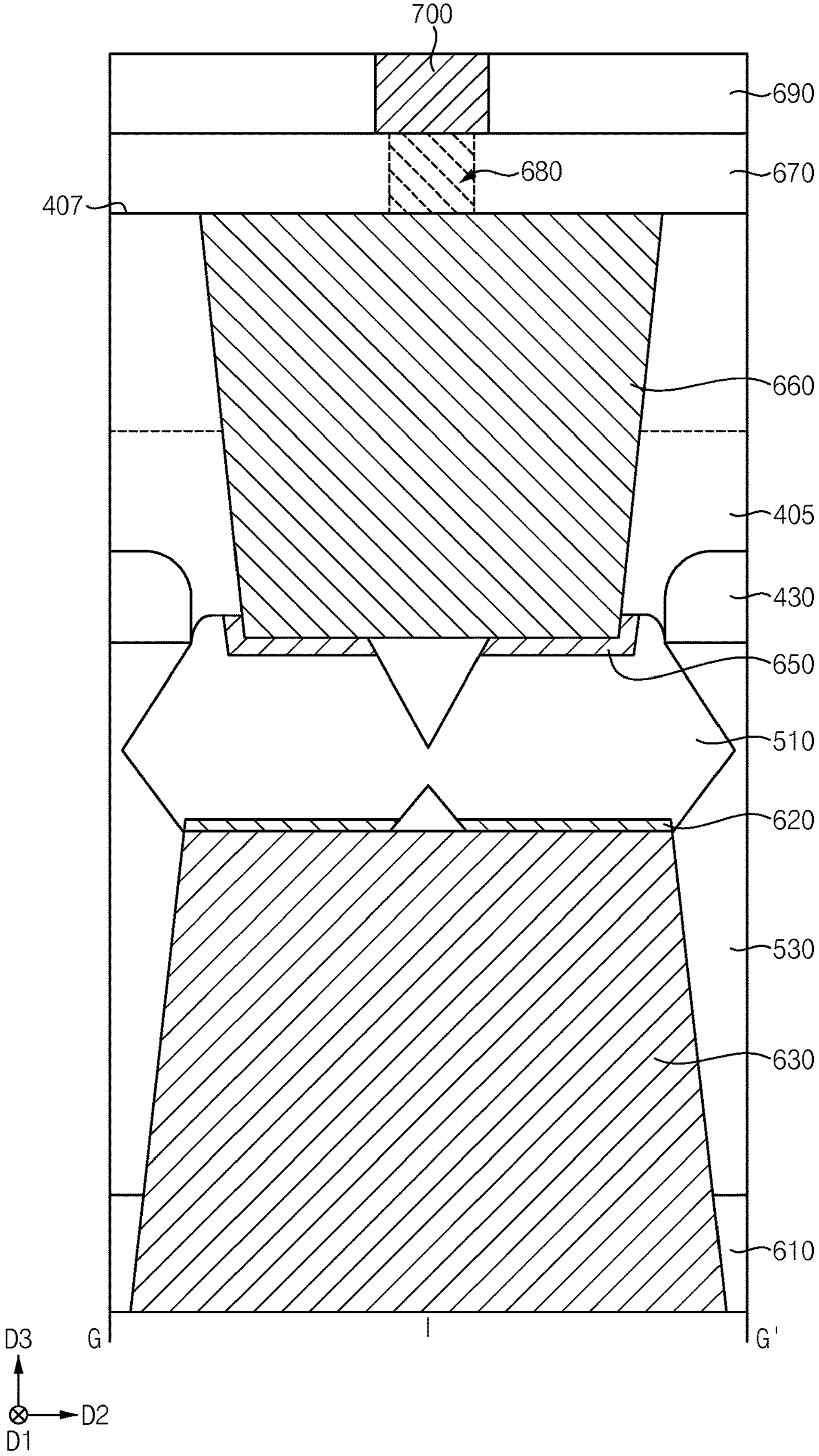

FIGS. 28, 31, 41 and 47 are cross-sectional views taken along lines E-E' of corresponding plan views, respectively, FIGS. 29, 32, 34, 36, 38, 39, 42, 45 and 48 are cross-sectional views taken along lines F-F' of corresponding plan views, respectively, and FIGS. 35, 43 and 49 are cross-sectional views taken along lines G-G' of corresponding plan views, respectively.

This method may include processes substantially the same as or similar to those illustrated with reference to FIGS. 1 to 26, and thus repeated explanations thereof are omitted herein.

That is, the semiconductor device may be a multi-bridge channel field effect transistor (MBCFET) including semiconductor patterns 424 spaced apart from each other in the third direction D3, which may serve as channels, respectively. Other elements except for the semiconductor patterns 424 may have structures and functions substantially the same as or similar to those of corresponding elements, respectively, of the finFET illustrated with reference to FIGS. 1 to 26, and may be formed by processes substantially the same as or similar to those of the corresponding elements, respectively. Thus, repeated explanations are omitted herein. Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, dire to manufacturing processes.

Figure 27:
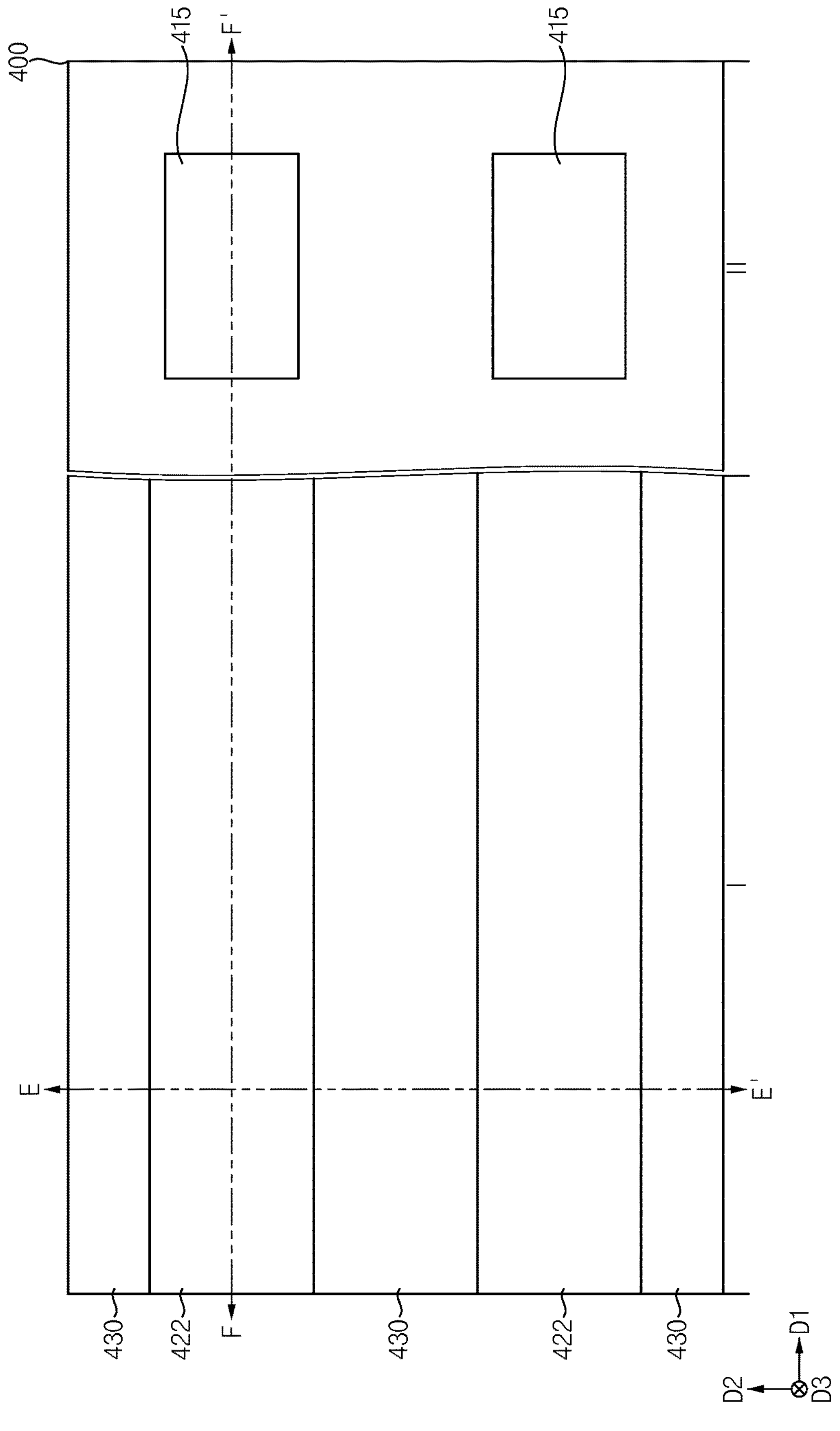
FIGS. 27 to 49 are plan views and cross-sectional views illustrating a semiconductor device in accordance with example embodiments.
Figure 28:
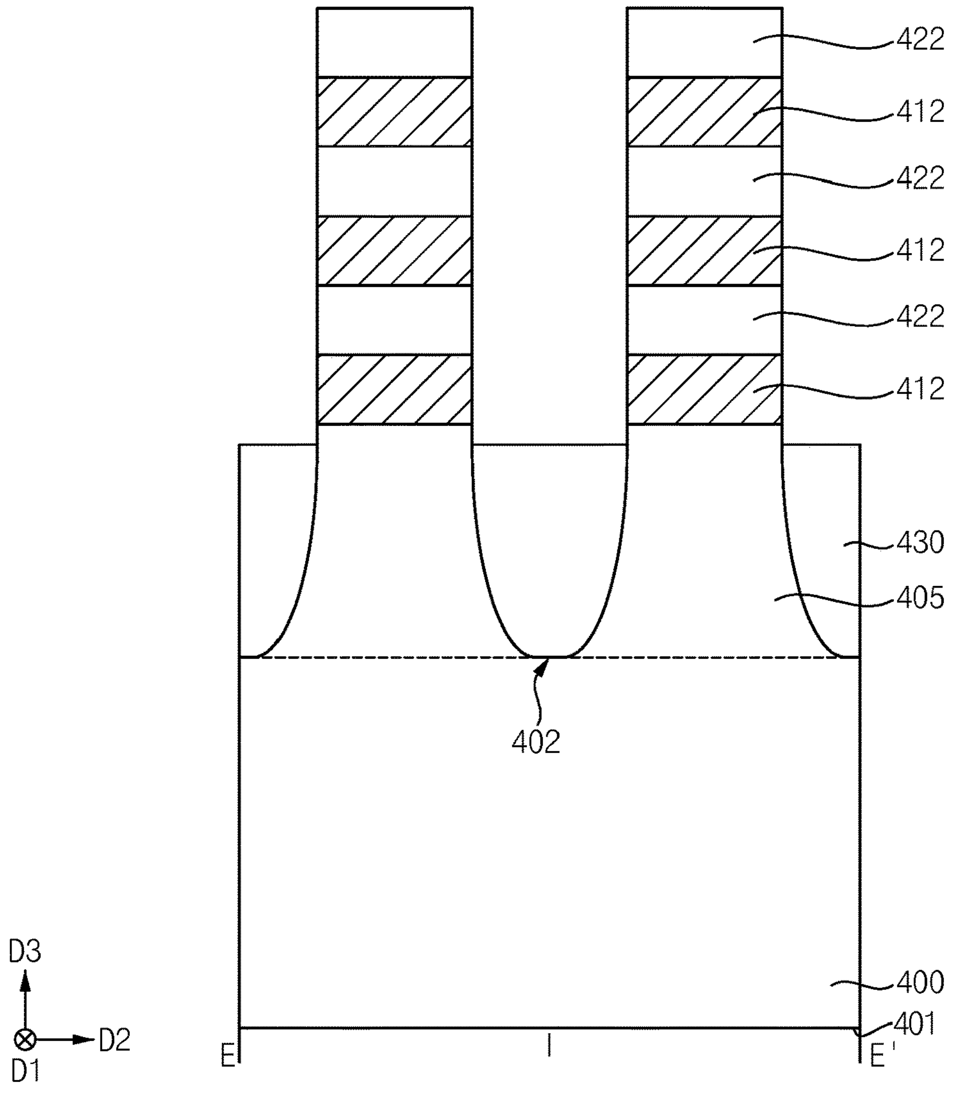
Figure 29:
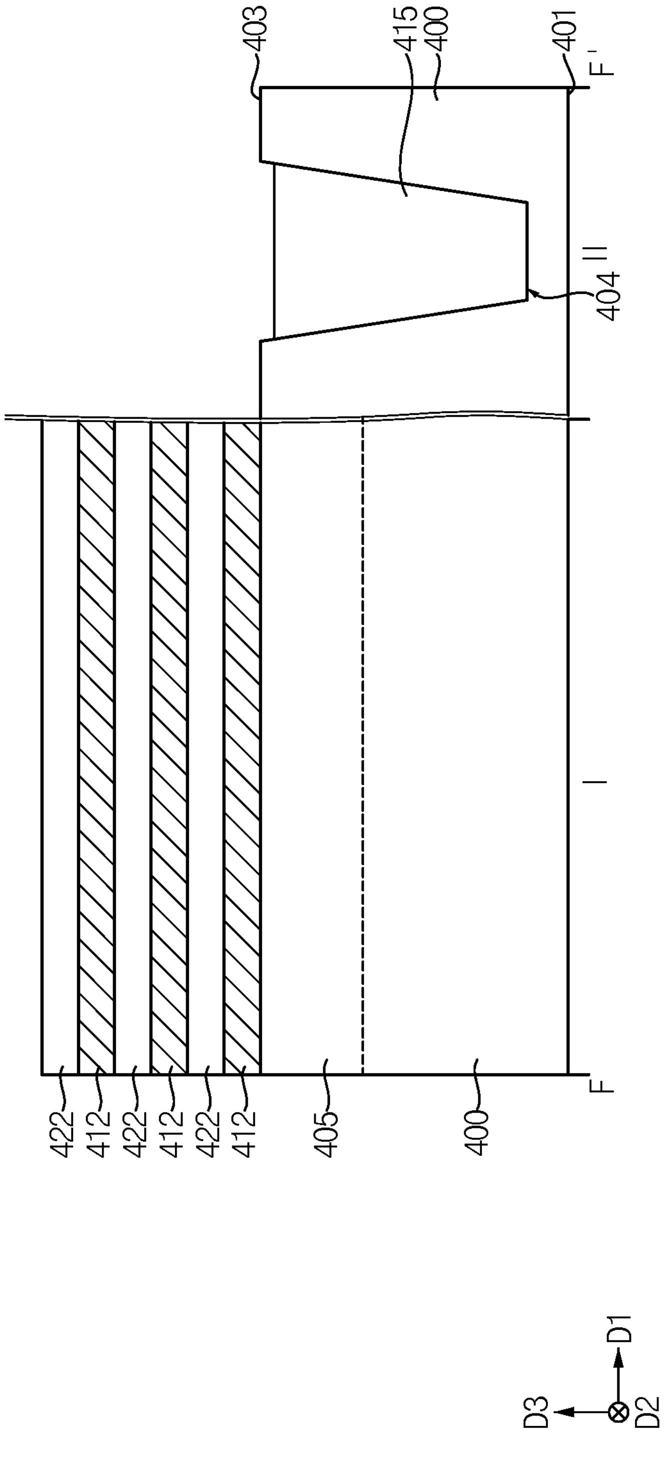

Referring to FIGS. 27 to 29, a sacrificial layer and a semiconductor layer may be alternately and repeatedly stacked on a substrate 400, and the semiconductor layers, the sacrificial layers and an upper portion of the substrate 400 may be etched to form third and fourth trenches 402 and 404 on the first and second regions I and II, respectively, of the substrate 400.

The substrate 400 may include first and second surfaces 401 and 403 opposite to each other in the third direction D3, and FIG. 29 shows that the first and second surfaces 401 and 403 of the substrate 400 face downwardly and upwardly, respectively. Thus, the third and fourth trenches 402 and 404 may be formed by removing portions of the substrate 400 adjacent to the second surface 403 of the substrate 400.

In example embodiments, the third trench 402 may extend in the first direction D1 on the first region I of the substrate 400, and a plurality of third trenches 402 may be spaced apart from each other in the second direction D2.

Thus, a plurality of second active patterns 405, each of which may extend in the first direction D1, spaced apart from each other in the second direction D2 may be defined on the first region I of the substrate 400, and a fin structure including sacrificial lines 412 and semiconductor lines 422 alternately and repeatedly stacked in the third direction D3 may be formed on each of the second active patterns 405. In example embodiments, a plurality of fin structures may be spaced apart from each other in the second direction D2 on the first region I of the substrate 400.

FIGS. 28 and 29 show that three sacrificial lines 412 and three semiconductor lines 422 are formed at three levels, respectively, however, aspects of the inventive concept may not be limited thereto. The semiconductor lines 422 may include, e.g., silicon, and the sacrificial lines 412 may include a material having an etching selectivity with respect to the substrate 400 and the semiconductor lines 422, e.g., silicon-germanium.

FIG. 27 shows that the fourth trench 404 has a shape of a rectangle in a plan view, however, aspects of the inventive concept may not be limited thereto. Thus, the fourth trench 404 may have various shapes of, e.g., a circle, an ellipse, a polygon, etc. In some embodiments, a plurality of fourth trenches 404 may be formed on the second region II of the substrate 400.

A third insulation layer may be formed to fill the third and fourth trenches 402 and 404. The third insulation layer may include an oxide, e.g., silicon oxide.

In an example embodiment, an upper surface of the third insulation layer may be lower than an upper surface of the second active pattern 405 on the first region I of the substrate 400, and may be lower than the second surface 403 of the second region II of the substrate 400. However, aspects of the inventive concept may not be limited thereto, for example, the upper surface of the third insulation layer may be substantially coplanar with the upper surfaces of the second active pattern 405 and the second surface 403 of the substrate 400.

As the third insulation layer is formed, a second isolation pattern 430 may be formed in the third trench 402 on the first region I of the substrate 400, and a second alignment key 415 may be formed in the fourth trench 404 on the second region II of the substrate 400.

Alternatively, the second alignment key 415 and the second isolation pattern 430 may be independently formed by depositing different insulation layers.

For example, the fourth trench 404 may be formed on the second region II of the substrate 400, the second alignment key 415 may be formed in the fourth trench 404, the third trench 402 may be formed on the first region I of the substrate 400 to define the second active pattern 405, and the second isolation pattern 430 may be formed in the third trench 402.

In this case, the second alignment key 415 may be used for positioning and aligning the third trench 402. In some embodiments, the second alignment key 415 and the second isolation pattern 430 may include different materials. For example, the second isolation pattern 430 may include an oxide, e.g., silicon oxide, and the second alignment key 415 may include an insulating nitride, e.g., silicon nitride. Alternatively, the second alignment key 415 may have a multi-layered structure of a third layer including an oxide and a fourth layer including an insulating nitride.

Figure 30:
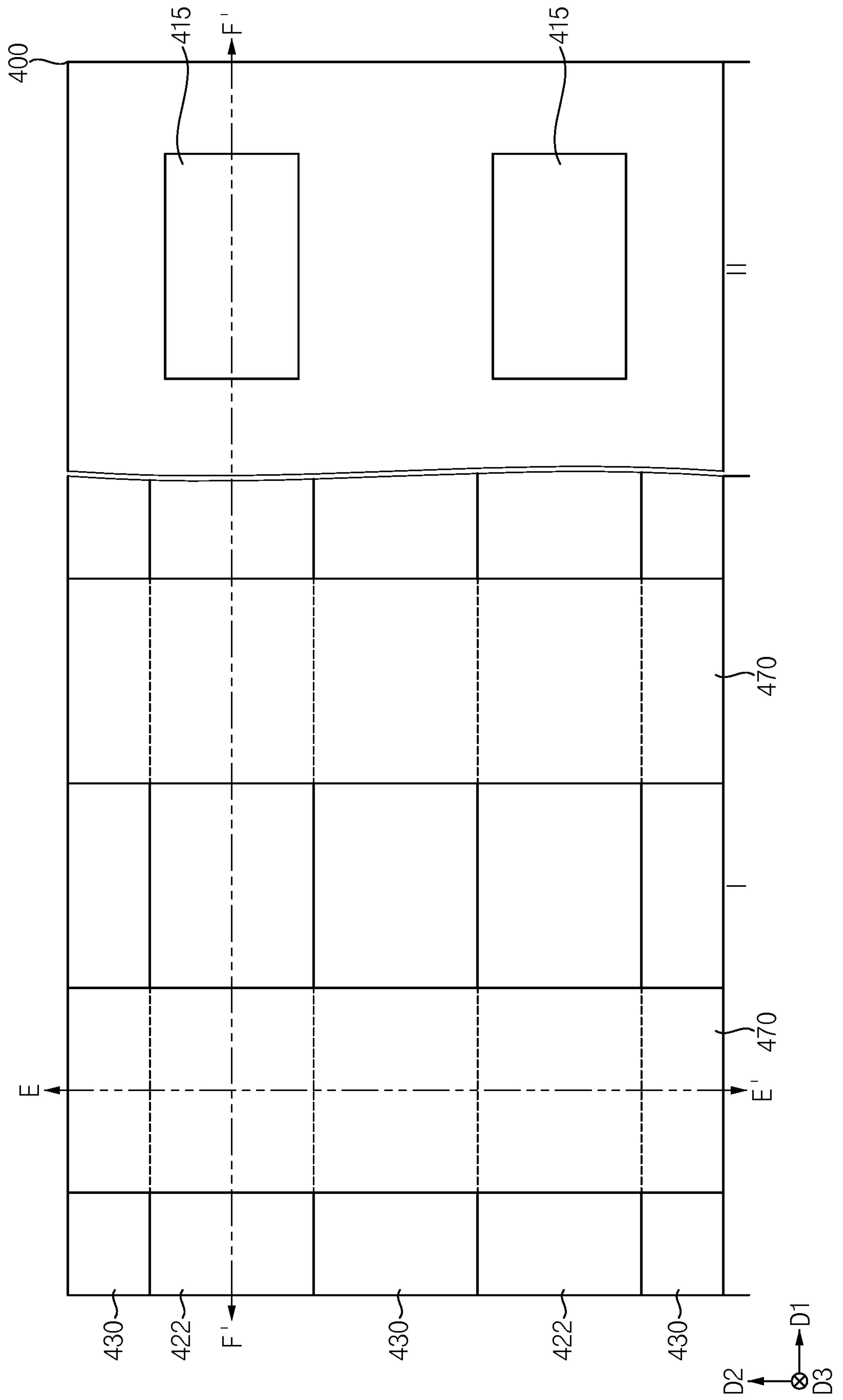
Figure 31:
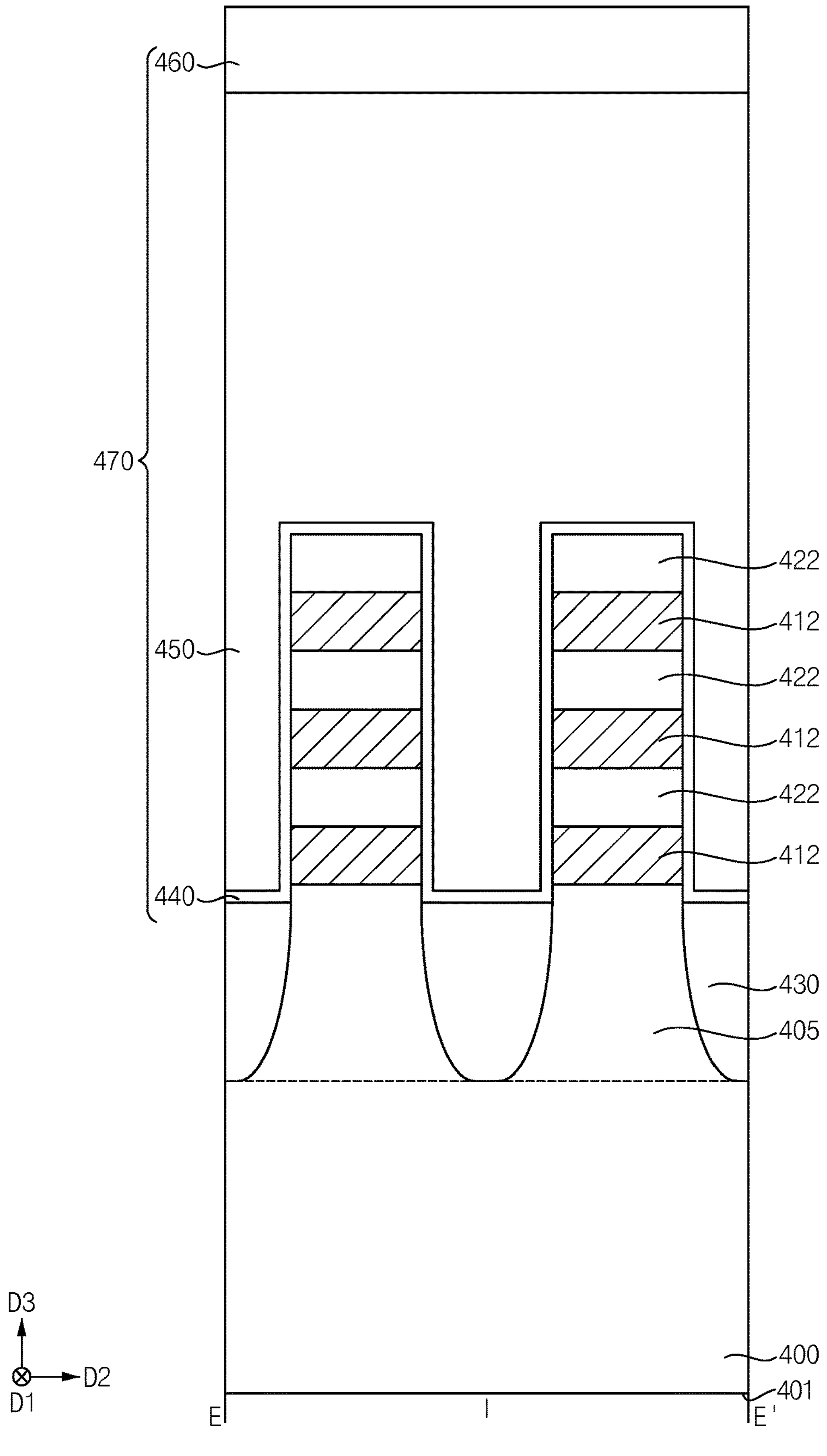
Figure 32:
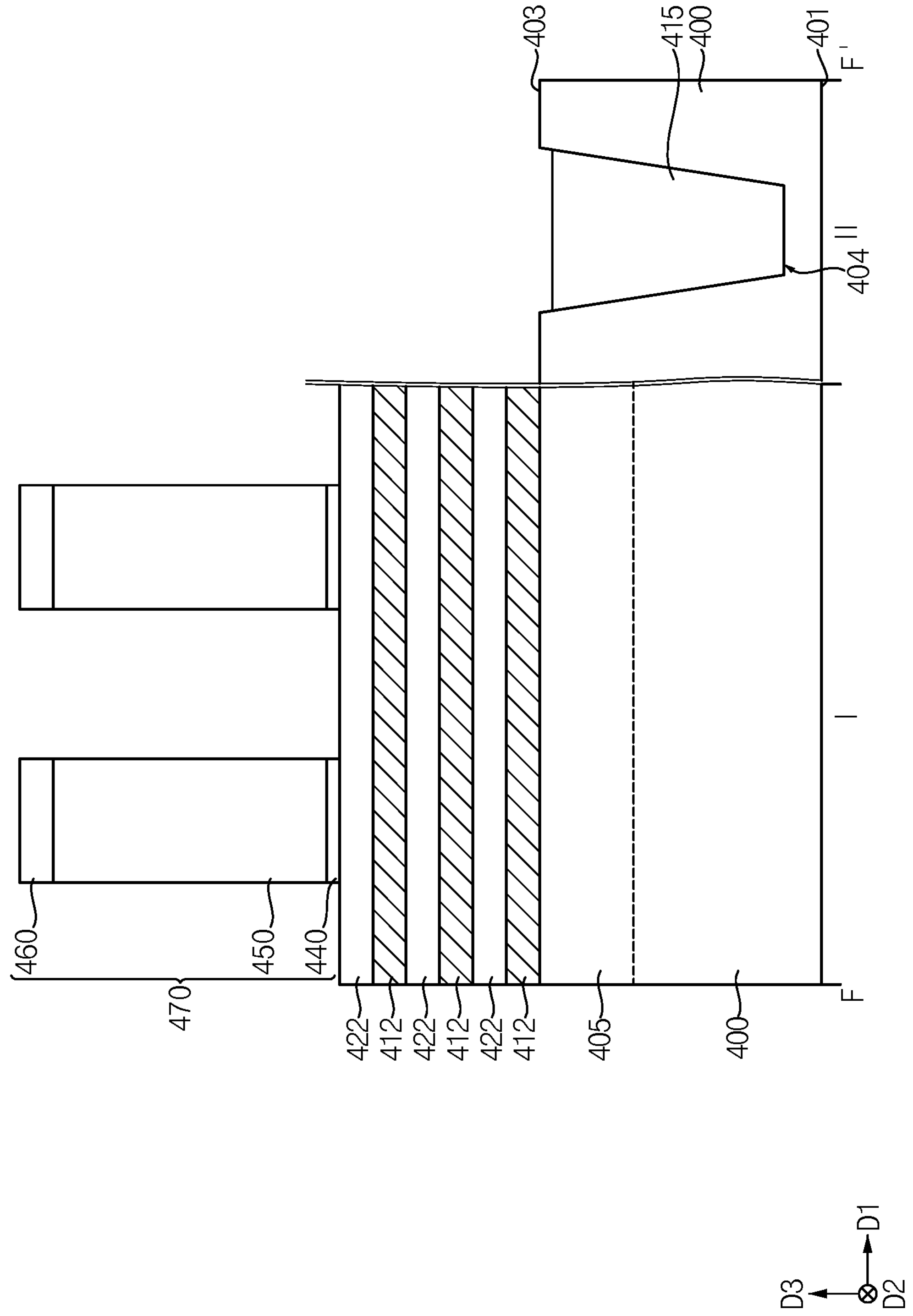

Referring to FIGS. 30 to 32, a second dummy gate structure 470 may be formed on the first region I of the substrate 400 to partially cover the fin structure and the second isolation pattern 430, and the second alignment key 415 on the second region II of the substrate 400 may be used for positioning and aligning the second dummy gate structure 470.

The second dummy gate structure 470 may include a second dummy gate insulation pattern 440, a second dummy gate electrode 450 and a second dummy gate mask 460 sequentially stacked in the third direction D3 on the second active pattern 405 and a portion of the second isolation pattern 430 adjacent thereto.

In example embodiments, the second dummy gate structure 470 may extend in the second direction D2 on the fin structure and the second isolation pattern 430, and may cover an upper surface and opposite sidewalls in the second direction D2 of the fin structure. In example embodiments, a plurality of second dummy gate structures 470 may be spaced apart from each other in the first direction D1 on the first region I of the substrate 400.

The second dummy gate insulation pattern 440 may include an oxide, e.g., silicon oxide, the second dummy gate electrode 450 may include polysilicon, and the second dummy gate mask 460 may include an insulating nitride, e.g., silicon nitride.

Figure 33:
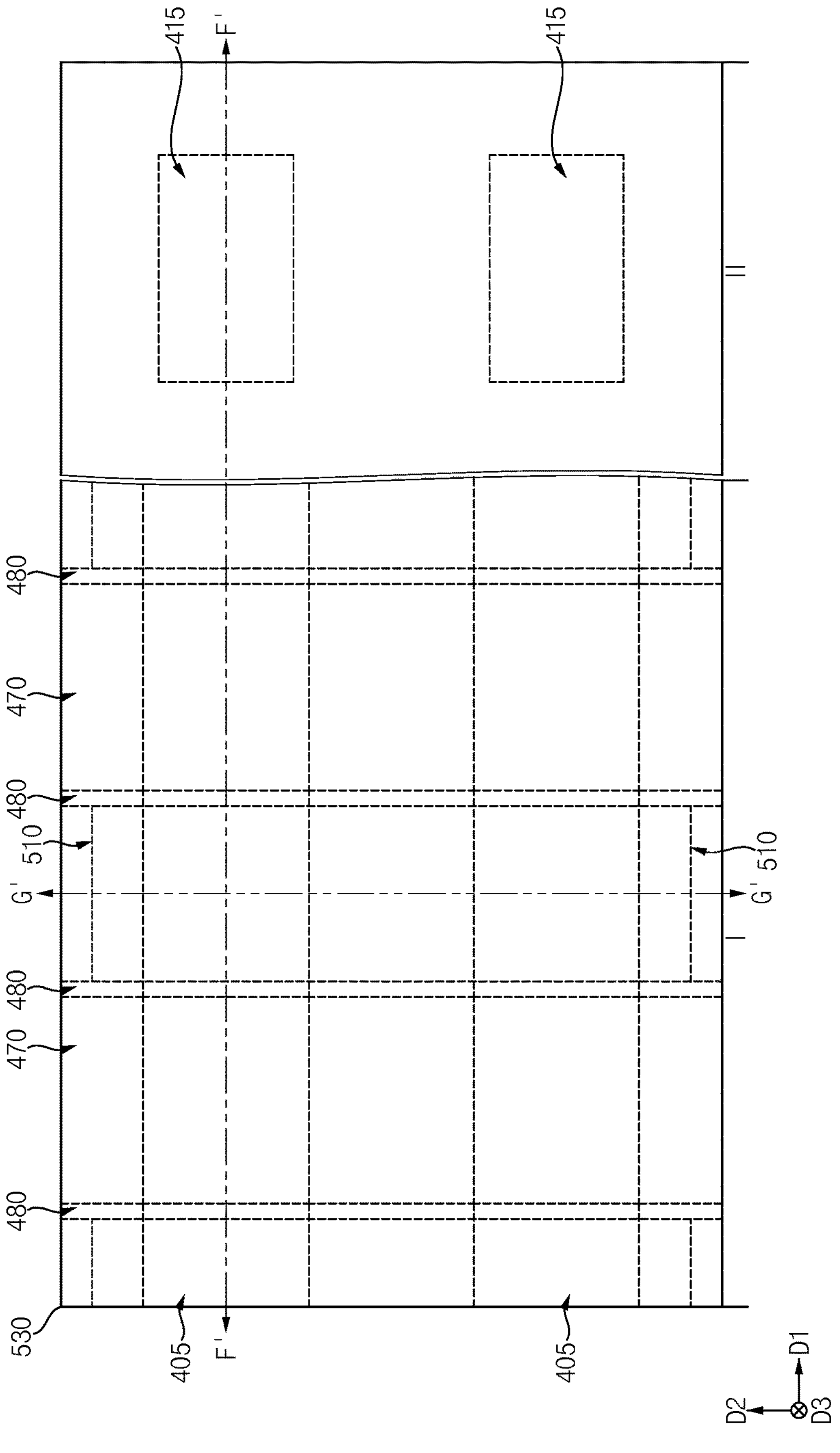

Referring to FIGS. 33 to 35, a second gate spacer 480 may be formed on a sidewall of the second dummy gate structure 470.

Particularly, a second spacer may be formed on the substrate 400 having the fin structure, the second isolation pattern 430, the second dummy gate structure 470 and the second alignment key 415 thereon, and may be anisotropically etched to form the second gate spacer 480 covering each of opposite sidewalls in the first direction D1 of the second dummy gate structure 470.

The fin structure and an upper portion of the second active pattern 405 on the first region I of the substrate 400 may be etched using the second dummy gate structure 470 and the second gate spacer 480 as an etching mask to form a fourth opening 490.

Thus, the sacrificial lines 412 and the semiconductor lines 422 under the second dummy gate structure 470 and the second gate spacer 480 may be transformed into sacrificial patterns 414 and semiconductor patterns 424, respectively, and the fin structure extending in the first direction D1 may be divided into a plurality of parts spaced apart from each other in the first direction D1.

Hereinafter, the second dummy gate structure 470, the second gate spacer 480 on each of opposite sidewalls of the second dummy gate structure 470 and the fin structure may be referred to as a stack structure. In example embodiments, the stack structure may extend in the second direction D2, and a plurality of stack structures may be spaced apart from each other in the first direction D1.

In some embodiments, a portion of each of the sacrificial patterns 414 adjacent to the fourth opening 490 may be removed to form a gap, and an inner spacer (not shown) may be formed in the gap.

A selective epitaxial growth (SEG) process may be performed using the upper surface of the second active pattern 405 and the sidewalls of the semiconductor patterns 424 and the sacrificial patterns 414 exposed by the fourth opening 490 as a seed to form a second source/drain layer 510 on an inner wall of the fourth opening 490.

In an example embodiment, a single crystalline silicon-germanium layer doped with p-type impurities may be formed as the second source/drain layer 510. Alternatively, a single crystalline silicon layer doped with n-type impurities or a single crystalline silicon carbide layer doped with n-type impurities may be formed as the second source/drain layer 510.

A fifth insulating interlayer 530 may be formed on the substrate 400 to cover the stack structure, the second source/drain layer 510 and the first alignment key 415.

Figure 36:
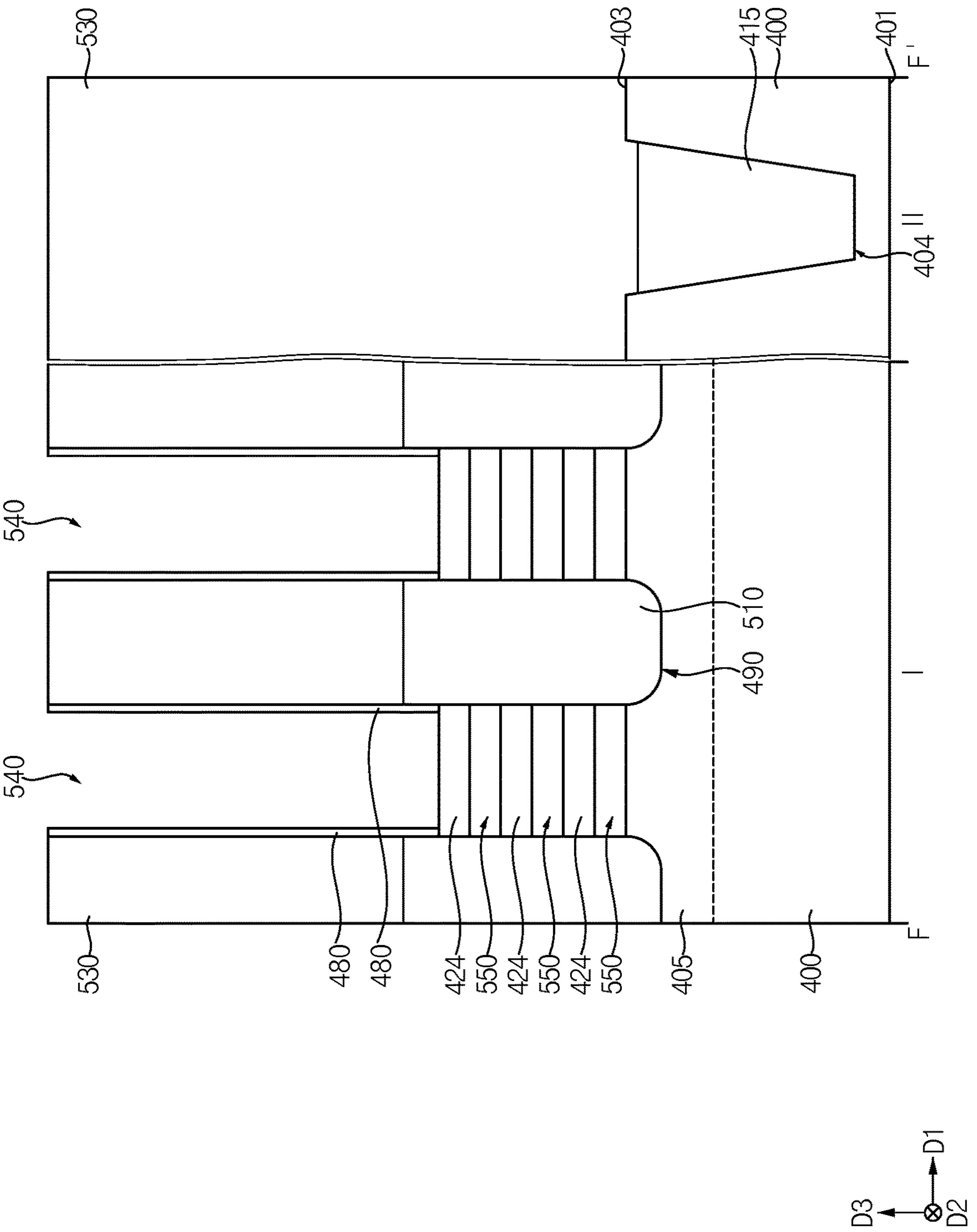

Referring to FIG. 36, processes substantially the same as or similar to those illustrated with reference to FIG. 10 may be performed.

Thus, a planarization process may be performed until an upper surface of the second dummy gate electrode 450 included in the stack structure is exposed so that an upper portion of the fifth insulating interlayer 530 and the second dummy gate mask 460 included in the second dummy gate structure 470 may be removed.

The second dummy gate electrode 450, the second dummy gate insulation pattern 440 and the sacrificial patterns 414 may be removed by, e.g., a wet etching process and/or a dry etching process to form a fifth opening 540 exposing an inner sidewall of the second gate spacer 480 and an upper surface of an uppermost one of the semiconductor patterns 424, and to form a sixth opening 550 exposing a sidewall of the second source/drain layer 510, surfaces of the semiconductor patterns 424 and the upper surface of the second active pattern 405.

Figure 37:
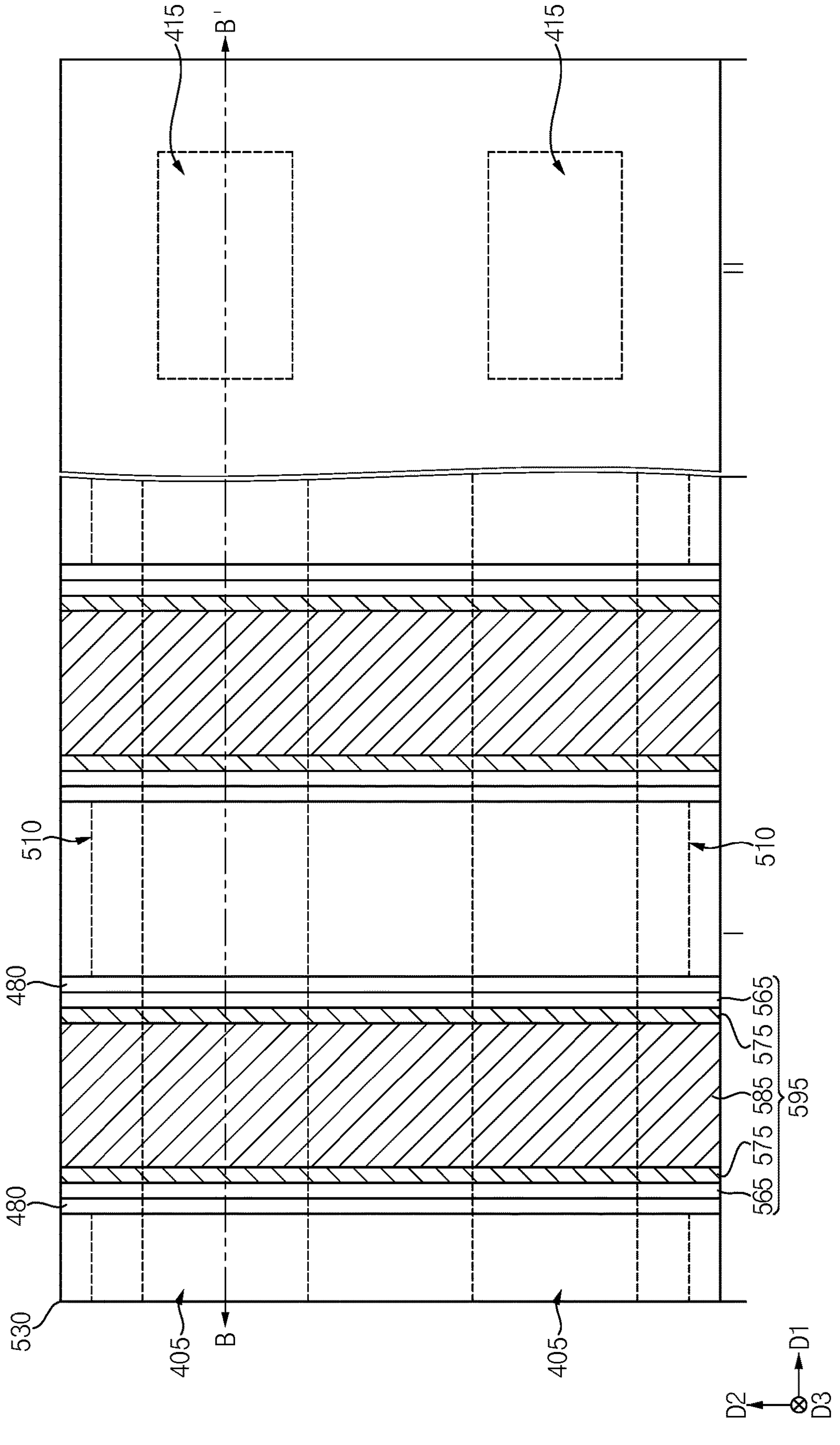
Figure 38:
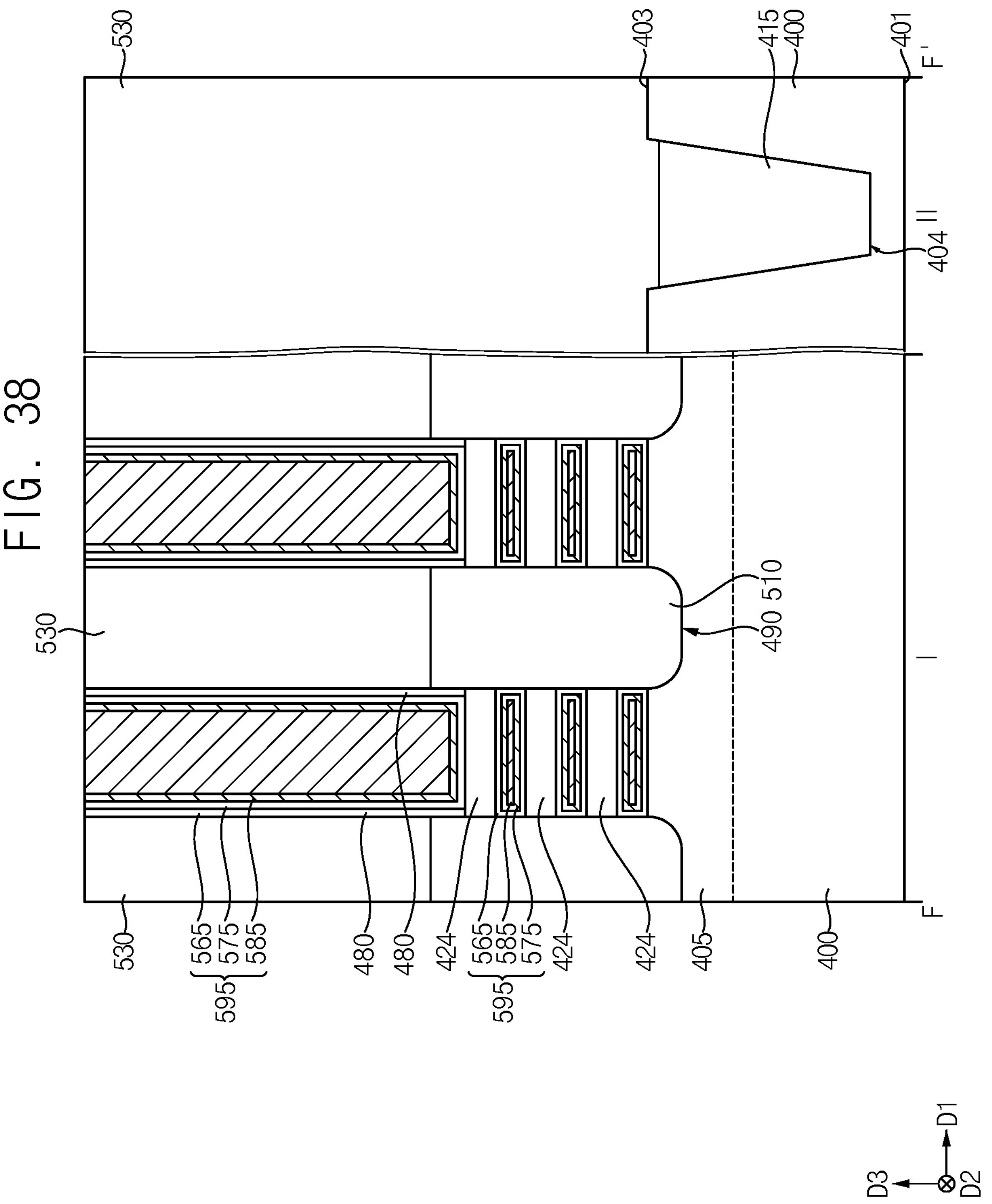

Referring to FIGS. 37 and 38, processes substantially the same as or similar to others of the processes illustrated with reference to FIGS. 11 and 12 may be performed.

Thus, a second gate insulation layer and a third conductive layer may be sequentially stacked on the upper surface of the second active pattern 405, the upper surface of the second isolation pattern 430, the sidewall of the second source/drain layer 510, the surfaces of the semiconductor patterns 424, the inner sidewall of the second gate spacer 480 exposed by the fifth and sixth openings 540 and 550 and the upper surface of the second active pattern 405, a fourth conductive layer may be formed on the third conductive layer to fill the fifth and sixth openings 540 and 550, and the fourth conductive layer, the third conductive layer and the second gate insulation layer may be planarized until the upper surface of the fifth insulating interlayer 530 is exposed.

Thus, a second gate structure 595 including a second gate insulation pattern 565, a third conductive pattern 575 and a fourth conductive pattern 585 sequentially stacked may be formed in the fifth and sixth openings 540 and 550, and the third and fourth conductive patterns 575 and 585 may form a second gate electrode.

Figure 39:
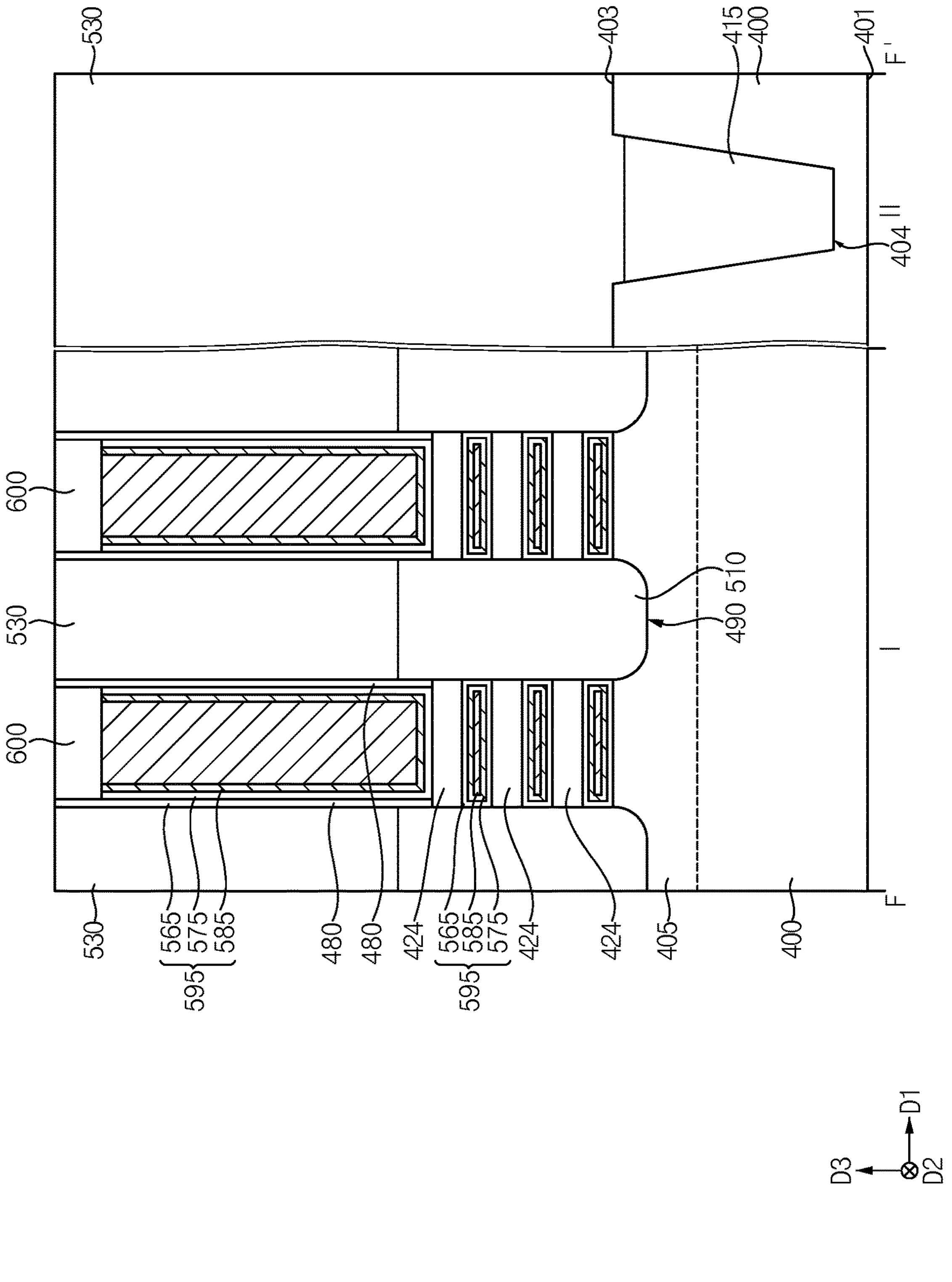
Figure 40:
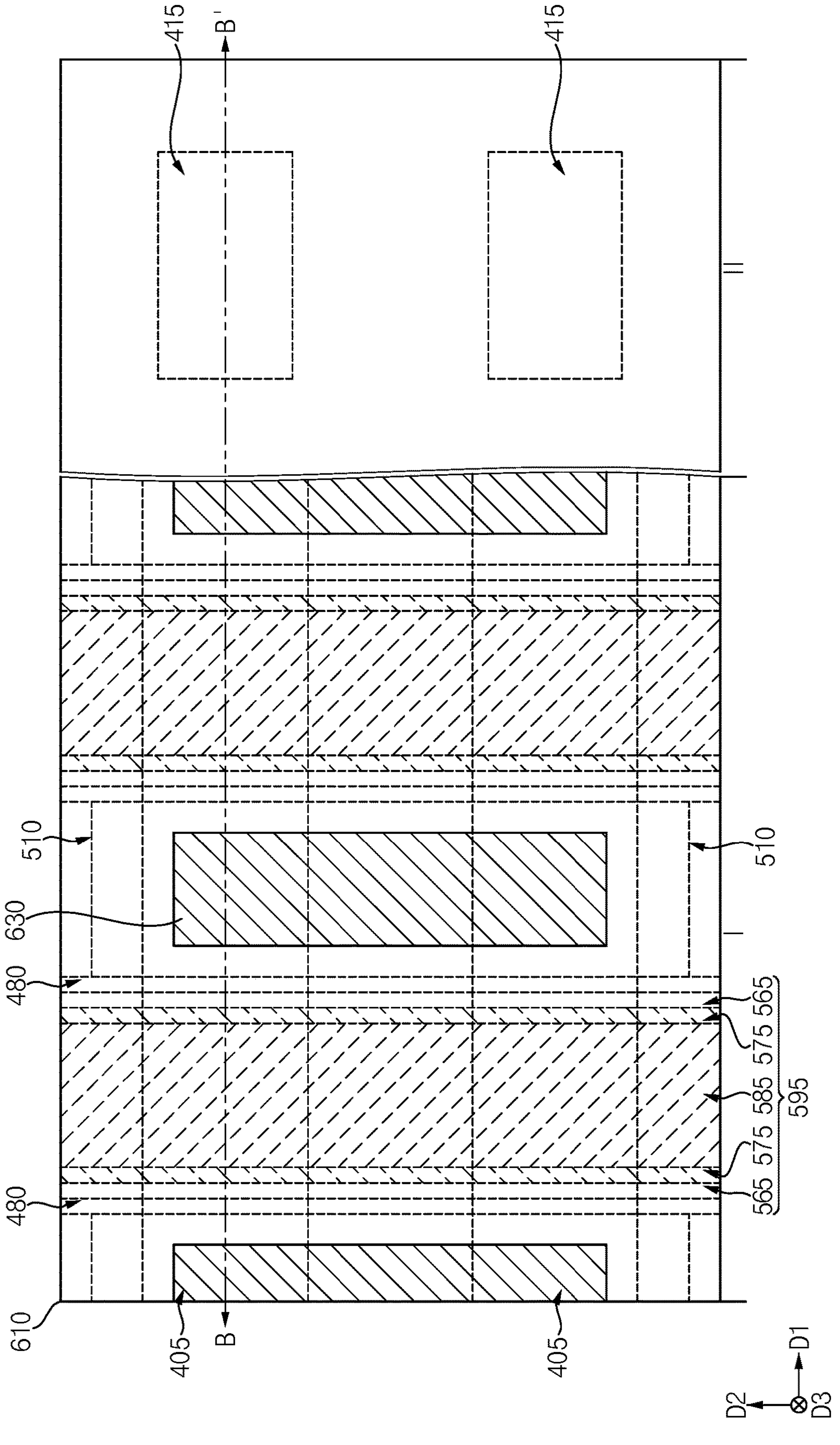
Figure 41:
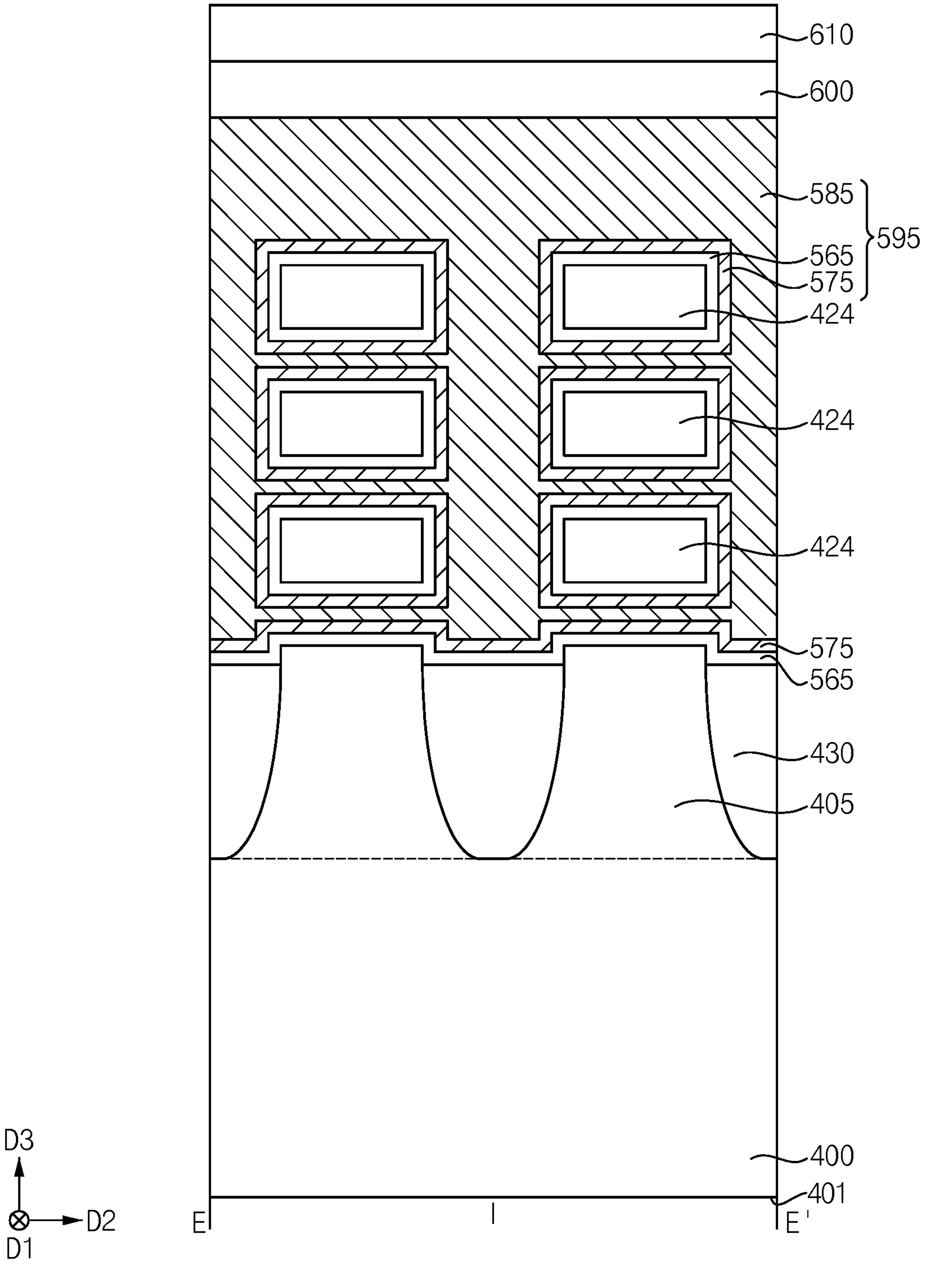
Figure 42:
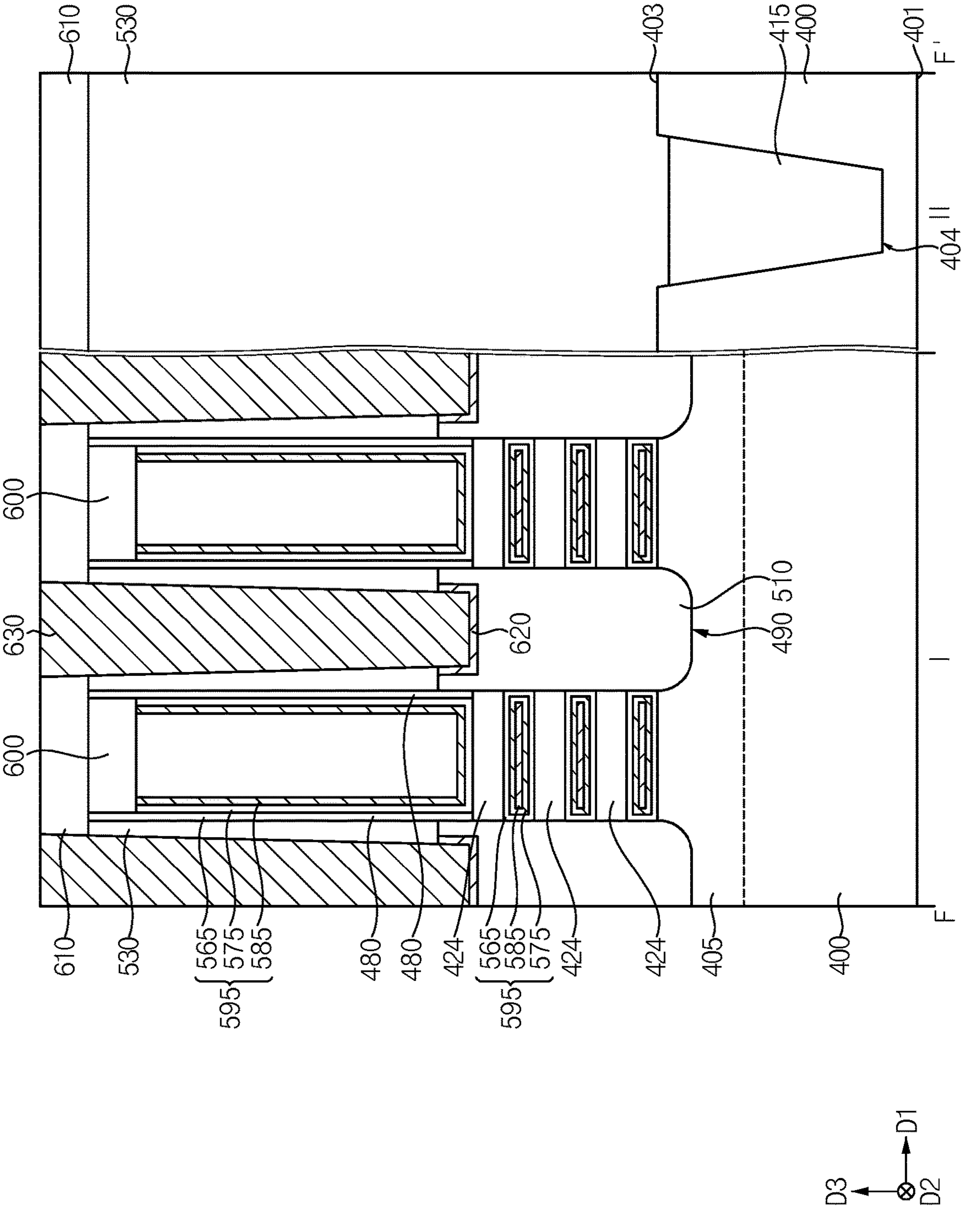

Referring to FIG. 39, an upper portion of the second gate structure 595 may be removed to form a third recess, and a second capping pattern 600 may be formed in the third recess.

The second capping pattern 600 may include an insulating nitride, e.g., silicon nitride, silicon oxynitride, silicon oxycarbonitride, etc.

Referring to FIGS. 40 to 43, processes substantially the same as or similar to those illustrated with reference to FIGS. 14 to 17 may be performed.

Thus, a sixth insulating interlayer 610 may be formed on the fifth insulating interlayer 530, the second capping pattern 600 and the second gate spacer 480, and a seventh opening may be formed through the fifth and sixth insulating interlayers 530 and 610 to expose an upper surface of the second source/drain layer 510. The seventh opening may also extend through an upper portion of the second source/drain layer 510.

The sixth insulating interlayer 610 may include an oxide, e.g., silicon oxide.

A third ohmic contact pattern 620 may be formed on the upper surface of the second source/drain layer 510 exposed by the seventh opening, and the third ohmic contact pattern 620 may include a metal silicide, e.g., cobalt silicide, nickel silicide, titanium silicide, etc.

A third contact plug 630 may be formed in the seventh opening.

In example embodiments, the third contact plug 630 may have a width gradually decreasing in the third direction D3 from a top toward a bottom thereof. The third contact plug 630 may include a metal, a metal nitride, etc.

Upper vias and upper wirings may be formed to be electrically connected to the third contact plug 630 and the second gate electrode of the second gate structure 595.

Figure 44:
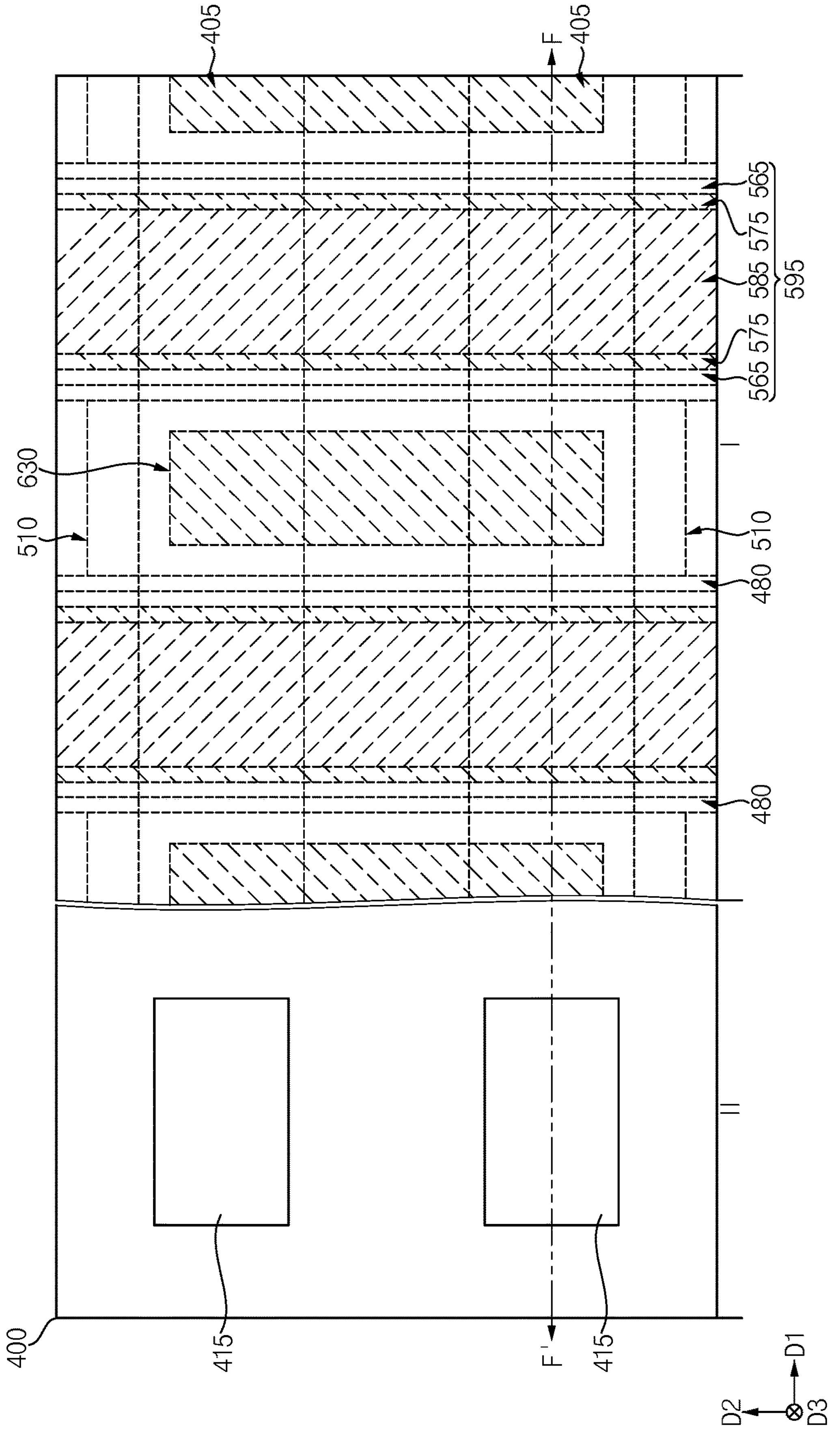
Figure 45:
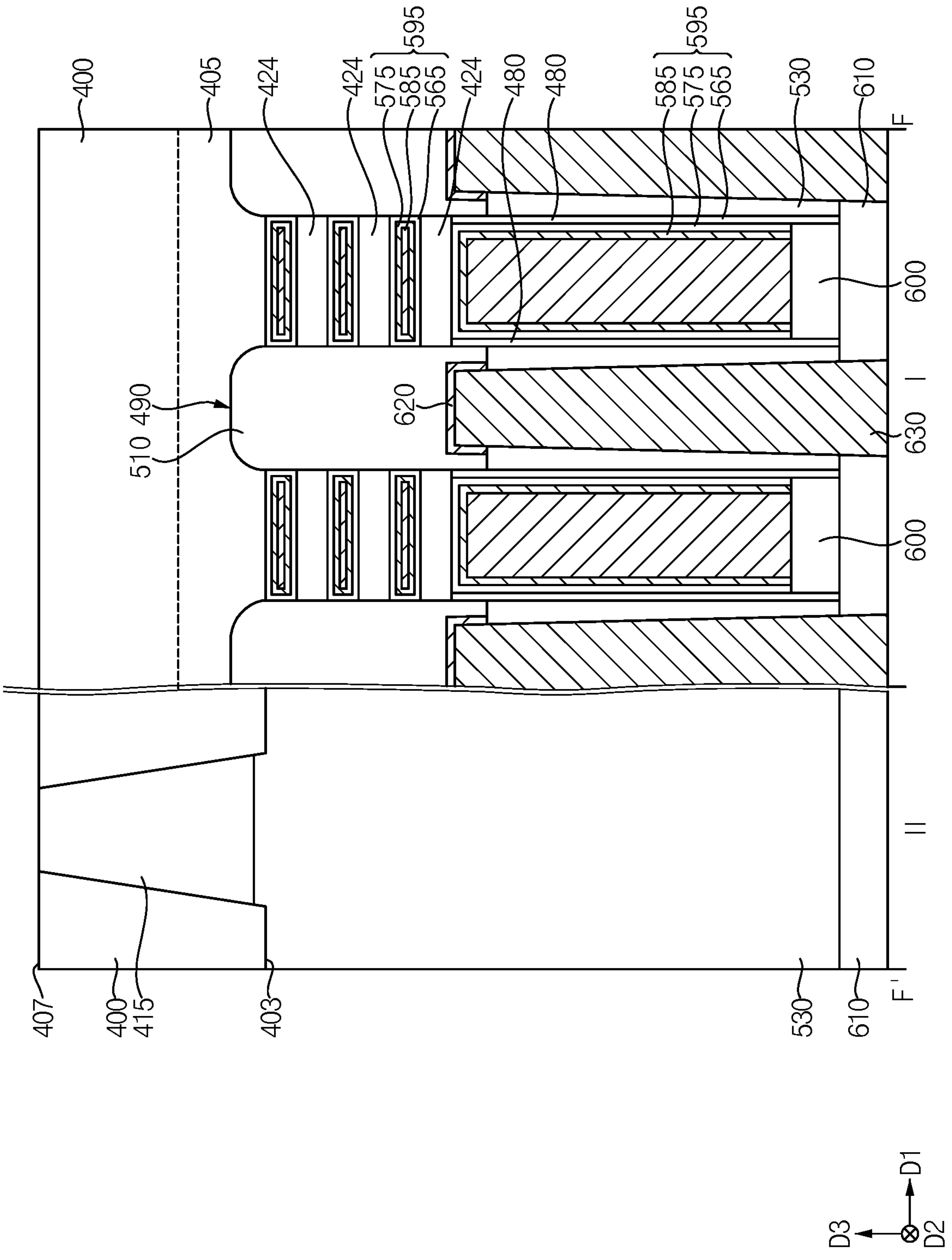
Figure 46:
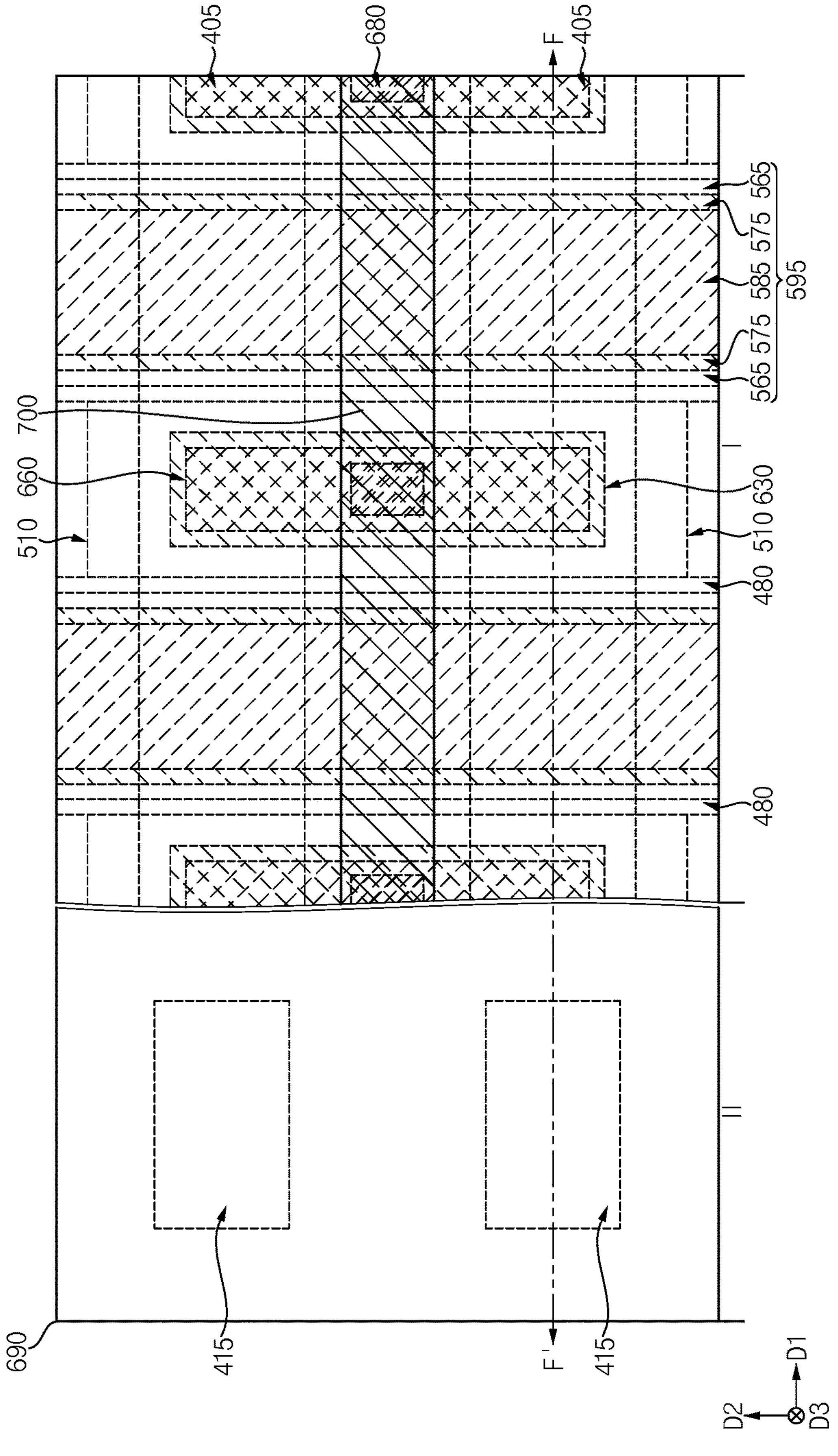
Figure 47:
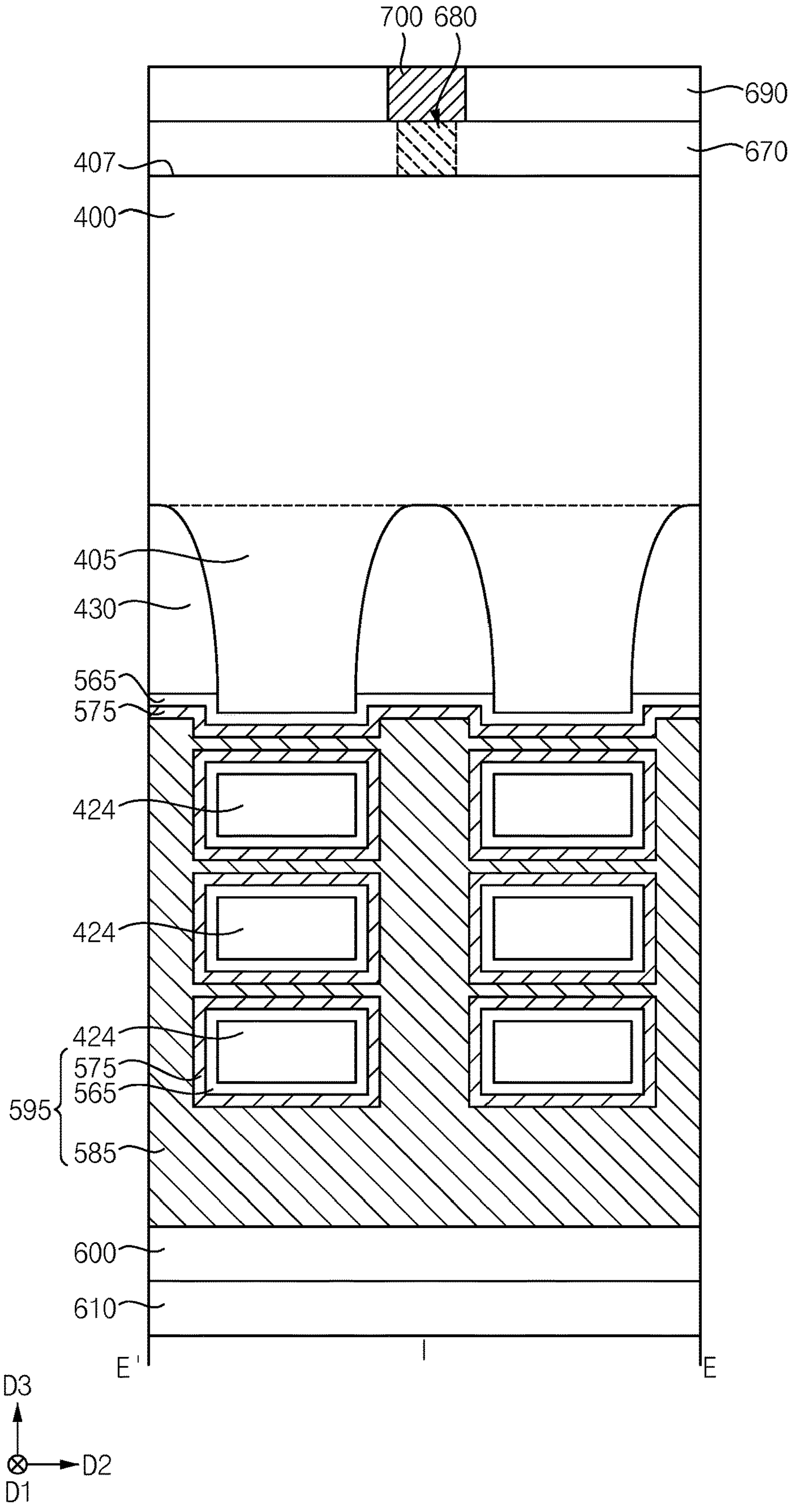

Referring to FIGS. 44 and 45, the substrate 400 may be turned over so that the first and second surfaces 401 and 403 may face upwardly and downwardly, respectively, and thus upper and lower portions of the structures on the substrate 400 may be referred to as lower and upper portions, respectively.

An upper portion of the substrate 400, that is, a portion of the substrate 400 adjacent to the second surface 403 may be removed to expose the second alignment key 415.

Hereinafter, an upper surface of the substrate 400 after removing the upper portion of the substrate 400 may be referred to as a third surface 407 of the substrate 400.

Referring to FIGS. 46 to 49, processes substantially the same as or similar to those illustrated with reference to FIGS. 20 to 26 may be performed.

Particularly, an eighth opening may be formed through the substrate 400 and the second active pattern 405 to expose an upper surface of the second source/drain layer 510, and the eighth opening may also extend through an upper portion of the second source/drain layer 510.

In example embodiments, when the eighth opening is formed, the second alignment key 415 on the second region II of the substrate 400 may be used for positioning and aligning the eighth opening.

A fourth ohmic contact pattern 650 may be formed on the upper surface of the second source/drain layer 510 exposed by the eighth opening, and a fourth contact plug 660 may be formed in the eighth opening.

In example embodiments, the fourth contact plug 660 may have a width gradually decreasing in the third direction D3 from a top toward a bottom thereof. However, in some embodiments, a fourth insulation layer may be further formed on a sidewall of the eighth opening, and thus the fourth contact plug 660 may be electrically insulated from the substrate 400 by the fourth insulation layer.

A seventh insulating interlayer 670 may be formed on the third surface 407 of the substrate 400, the second alignment key 415 and the fourth contact plug 660, and a second via 680 may be formed through the seventh insulating interlayer 670 to contact an upper surface of the fourth contact plug 660.

An eighth insulating interlayer 690 may be formed on the seventh insulating interlayer 670 and the second via 680, and a second wiring 700 may be formed through the eighth insulating interlayer 690 to contact an upper surface of the second via 680.

In example embodiments, the second wiring 700 may serve as a power rail.

In an example embodiment, the second wiring 700 may extend in the first direction D1. Alternatively, the second wiring 700 may extend in the second direction D2.

FIG. 48 shows that the second wiring 700 overlaps the second gate structures 595 in the third direction D3, however, aspects of the inventive concept may not be limited thereto. For example, the fourth contact plug 660 may extend in the second direction D2 to a length greater than a length of the second gate structure 595, and each of the second via 680 and the second wiring 700 may not overlap the second gate structures 595 in the third direction D3.

The second region II of the substrate 400 may be removed by, e.g., a sawing process, and the second alignment key 415 may also be removed.

By the above processes, the semiconductor device may be manufactured.

As illustrated above, the second alignment key 415 may be formed to be adjacent to the second surface 403 of the substrate 400, and may be used for positioning and aligning the structures on the second surface 403 of the substrate 400, e.g., the second dummy gate structure 470, and may be exposed by removing a portion of the substrate 400 adjacent to the first surface 401 of the substrate 400. Thus, the second alignment key 415 may also be used for positioning and aligning the structures on the third surface 407 of the substrate 400, e.g., the eighth opening for forming the fourth contact plug 660.

Accordingly, even though the second wiring 700 is formed on the third surface 407 of the substrate 400 instead of the second surface 403 of the substrate 400, the structures, e.g., the fourth contact plug 660 for electrically connecting the structures adjacent to the second surface 403 of the substrate 400, e.g., the second source/drain layer 510 to the second wiring 700 may be aligned with the second source/drain layer 510 in the third direction D3.

Figure 50:
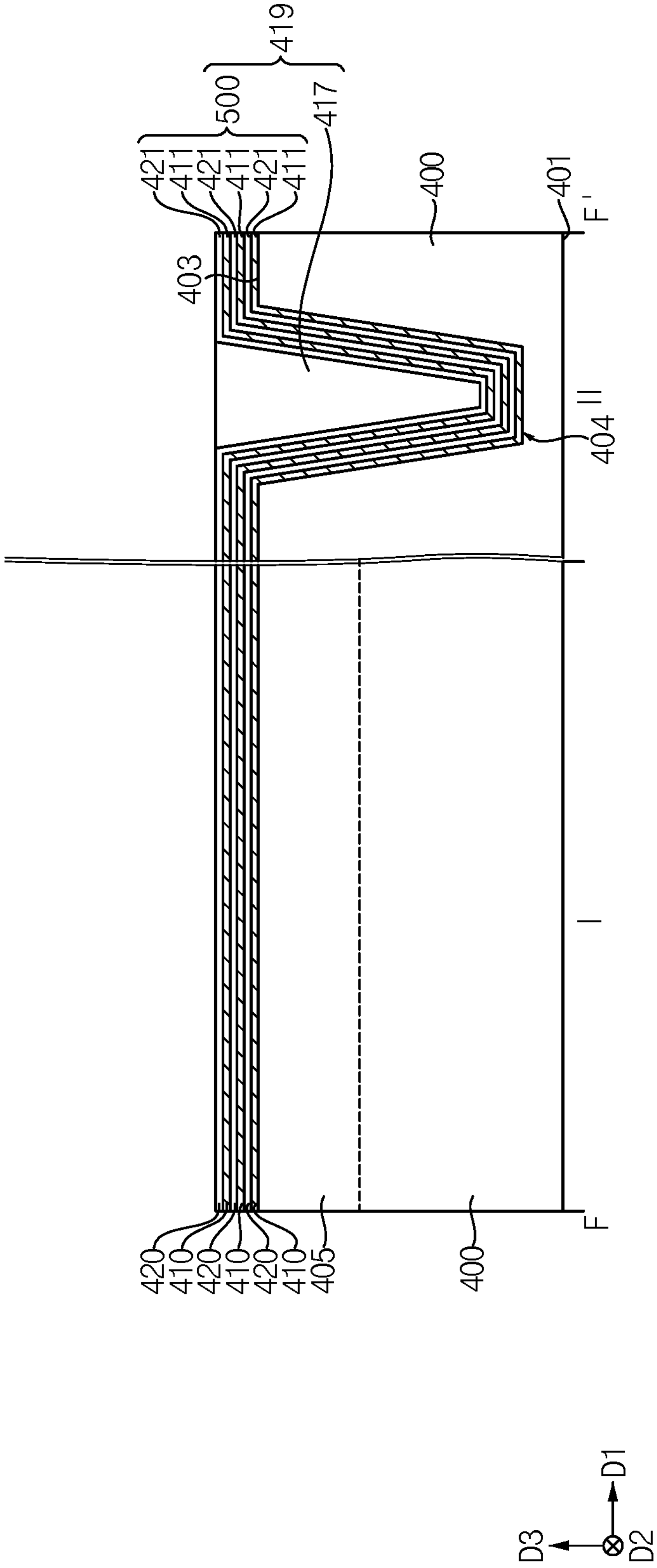
FIGS. 50 to 55 are a plan view and cross-sectional views illustrating a method of manufacturing a semiconductor device in accordance with example embodiments.
Figure 51:
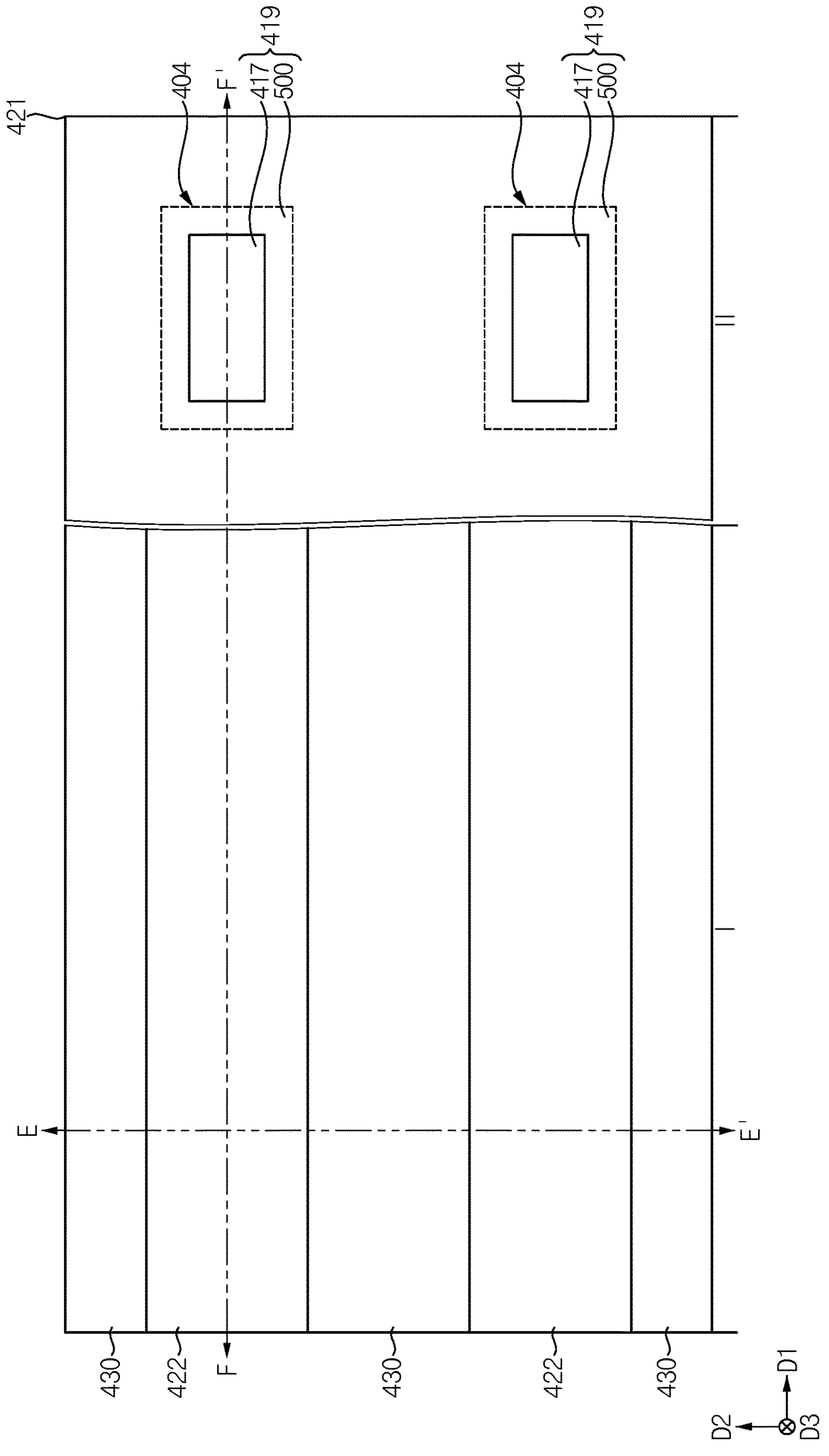
Figure 52:
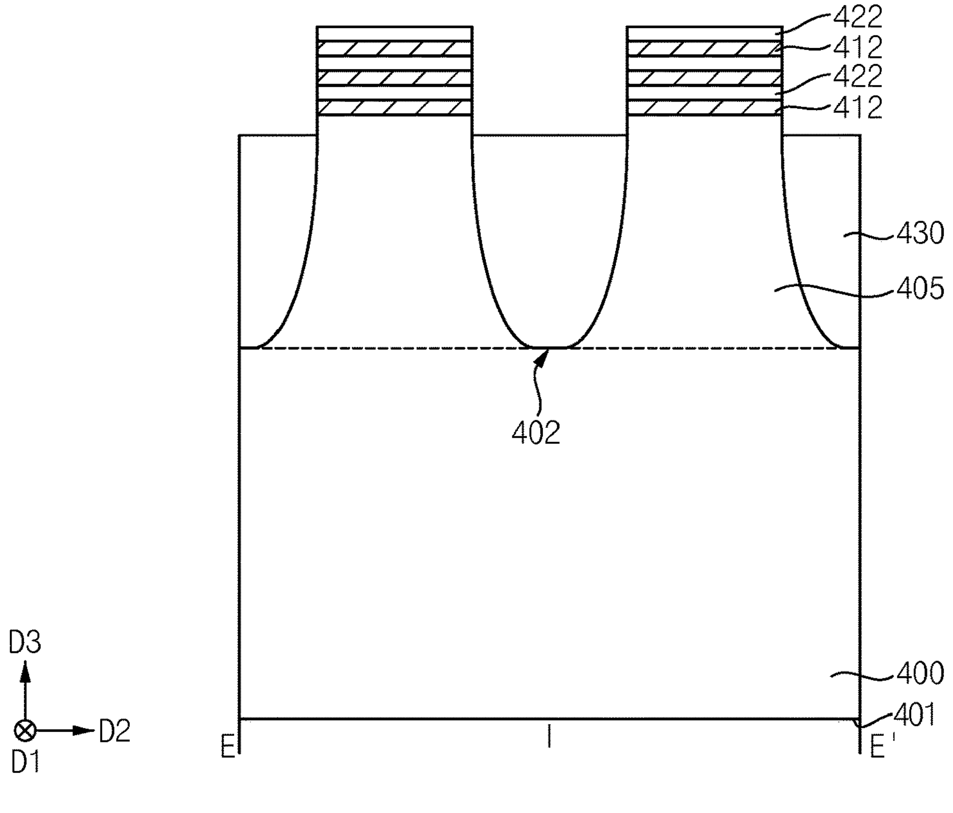

FIGS. 50 to 55 are a plan view and cross-sectional views illustrating a method of manufacturing a semiconductor device in accordance with example embodiments. Particularly, FIG. 51 is the plan view, FIG. 52 is a cross-sectional view taken along line E-E' of a corresponding plan view, and FIGS. 50 and 53 to 55 are cross-sectional views taken along lines F-F' of corresponding plan views, respectively.

This method may include processes substantially the same as or similar to those illustrated with reference to FIGS. 27 to 49, and thus repeated explanations are omitted herein.

Referring to FIG. 50, the fourth trench 404 may be formed on the second region II of the substrate 400 including the first and second regions I and II, and the sacrificial layer 410 and the semiconductor layer 420 may be alternately and repeatedly stacked on the substrate 400 having the fourth trench 404 thereon.

A fifth insulation layer may be formed on an uppermost one of the semiconductor layers 420, and an upper portion of the fifth insulation layer may be planarized until an upper surface of the uppermost one of the semiconductor layers 420 is exposed to form a third key pattern 417 on a portion of the uppermost one of the semiconductor layers 420 in the fourth trench 404.

Hereinafter, portions of the sacrificial layer 410 and the semiconductor layer 420 in the fourth trench 404 and an area adjacent to the fourth trench 404 on the second region II of the substrate 400 may be referred to as first and second key patterns 411 and 421, respectively, which may collectively form a key pattern structure 500. Additionally, the key pattern structure 500 and the third key pattern 417 may collectively form a third alignment key 419.

Figure 53:
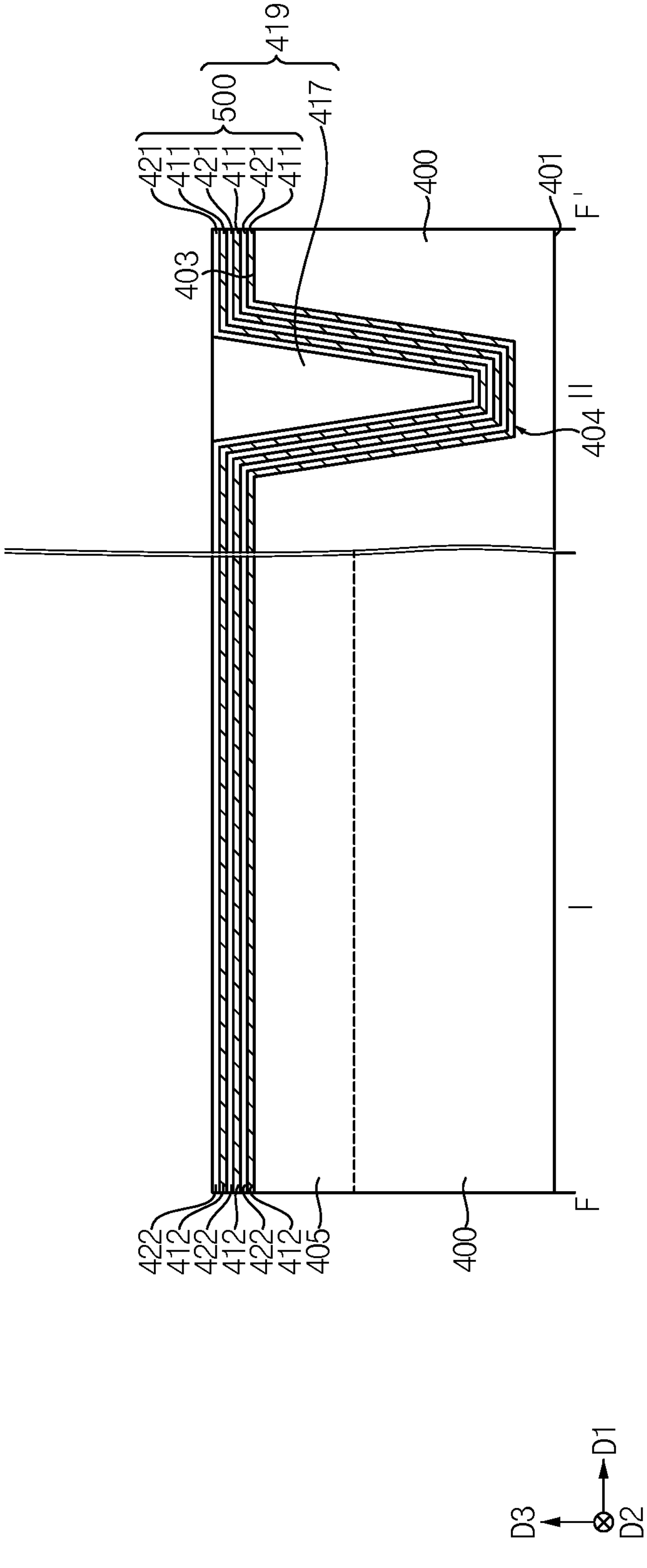

Referring to FIGS. 51 to 53, the semiconductor layers 420 and the sacrificial layers 410 on the first region I of the substrate 400 and an upper portion of the substrate 400 may be partially removed to form the third trench 402 on the first region I of the substrate 400, and the second isolation pattern 430 may be formed in the third trench 402.

Thus, the second active patterns 405 each of which may extend in the first direction D1 may be spaced apart from each other in the second direction D2 on the first region I of the substrate 400, and the fin structure including the sacrificial lines 412 and the semiconductor lines 422 alternately and repeatedly stacked in the third direction D3 may be formed on each of the second active patterns 405.

Processes substantially the same as or similar to those illustrated with reference to FIGS. 30 to 43 may be performed.

Figure 54:
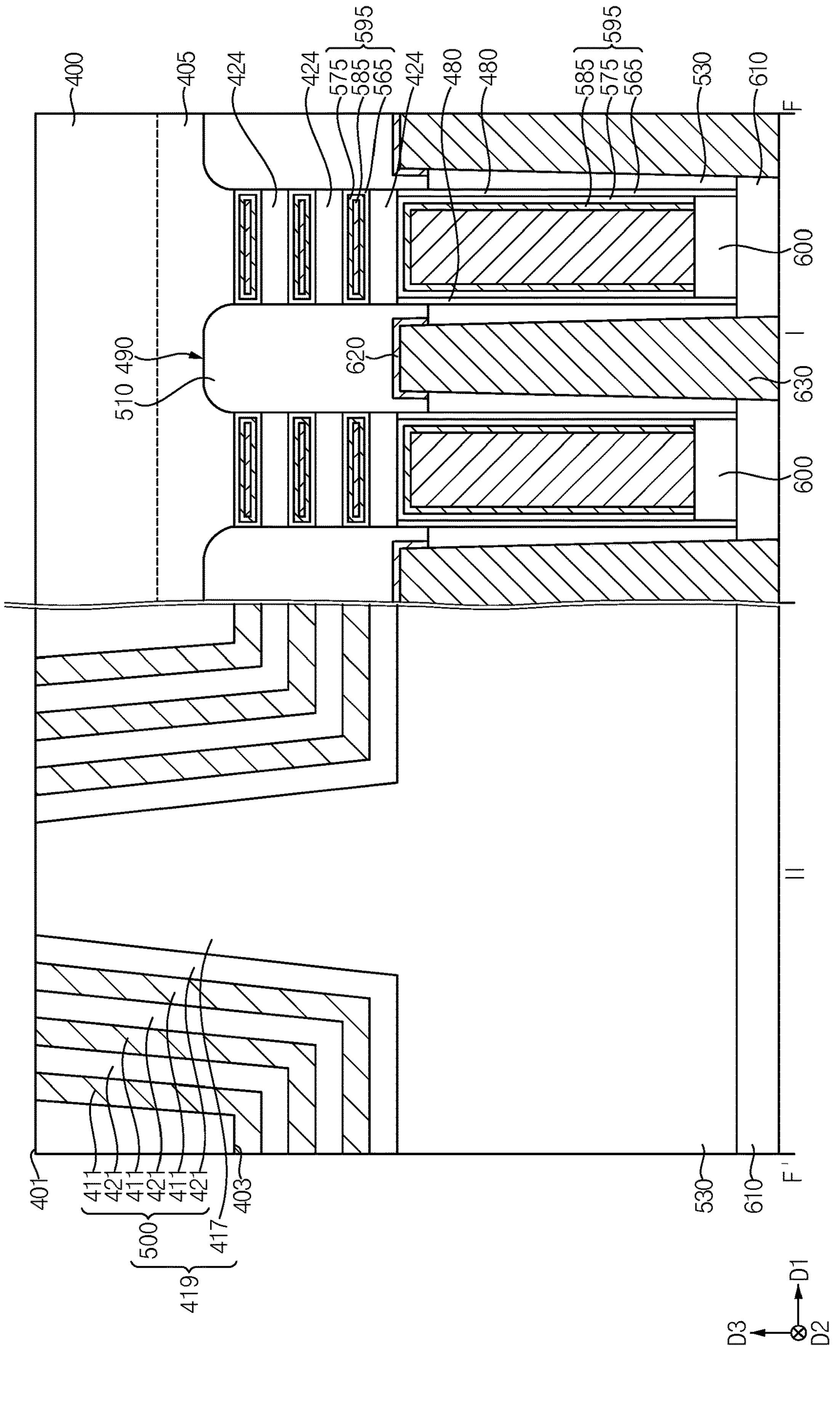

Referring to FIG. 54, processes substantially the same as or similar to those illustrated with reference to FIGS. 44 and 45 may be performed.

The upper portion of the substrate 400, that is, the portion of the substrate 400 adjacent to the second surface 403 of the substrate 400 may be removed to expose the third alignment key 419.

In an example embodiment, when the portion of the substrate 400 adjacent to the second surface 403 thereof is removed, upper portions of the key pattern structure 500 and the third key pattern 417 included in the third alignment key 419 may also be removed. Thus, a portion of the key pattern structure 500 on the upper surface of the third key pattern 417 may be removed, and the first and second key patterns 411 and 421 included in the key pattern structure 500 may be alternately and repeatedly stacked on a sidewall of the third key pattern 417 in the horizontal direction.

Figure 55:
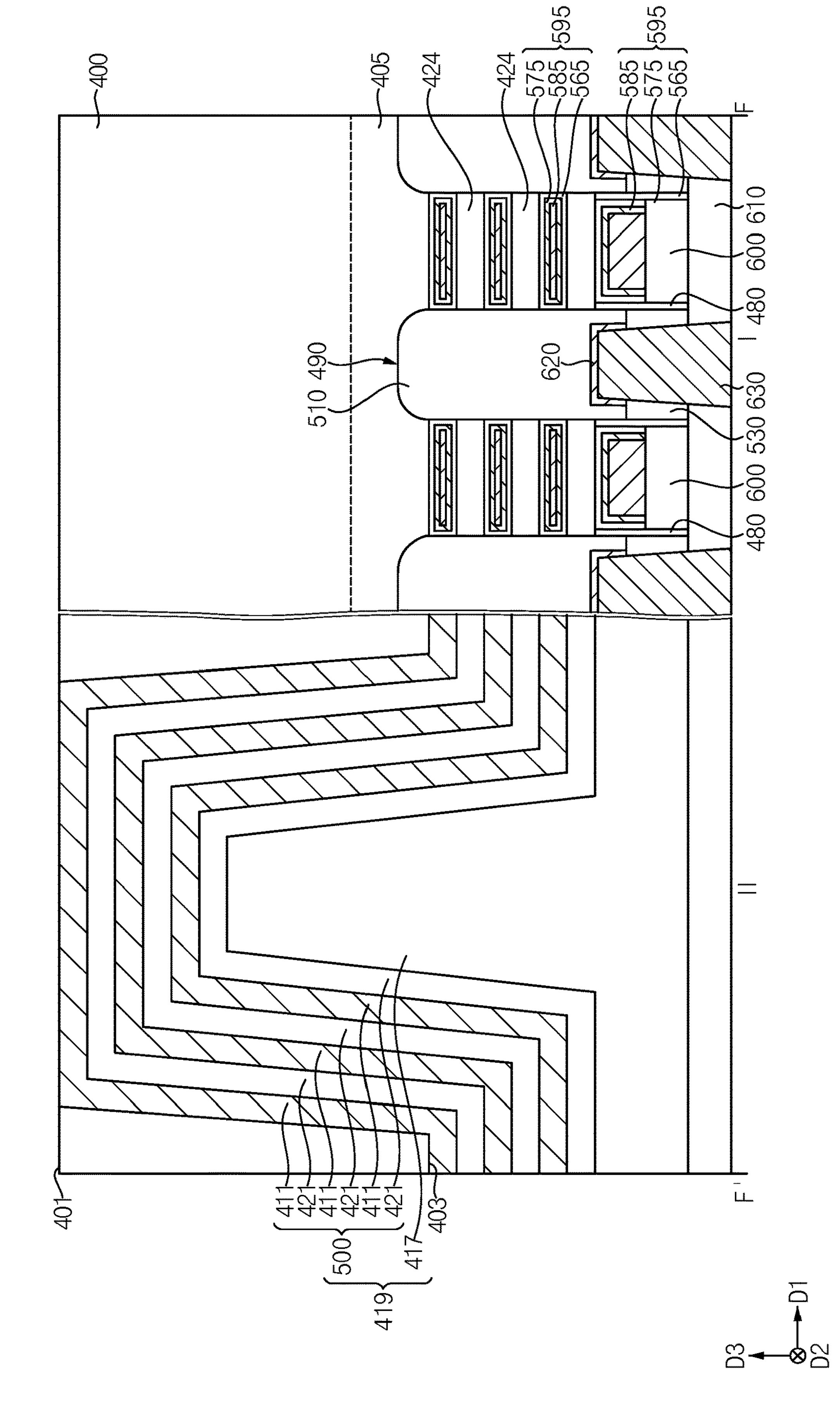

Referring to FIG. 55, in another example embodiment, when the portion of the substrate 400 adjacent to the second surface 403 thereof is removed, the upper surface of the key pattern structure 500 included in the third alignment key 419 may be exposed, and the upper portions of the key pattern structure 500 and the third key pattern 417 may not be removed.

Processes substantially the same as or similar to those illustrated with reference to FIGS. 46 to 49 may be performed to complete the fabrication of the semiconductor device.

The semiconductor device may be used in various types of memory devices and/or systems including a power rail. For example, the semiconductor device may be applied to a logic device such as a central processing unit (CPU), an application processor (AP), etc. Alternatively, the semiconductor device may be applied to a volatile memory device such as a DRAM device, an SRAM device, etc., or to a non-volatile memory device such as a flash memory device, a PRAM device, an MRAM device, an RRAM device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of aspects of the present inventive concept. Accordingly, all such modifications are intended to be included within the scope of the aspects of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:

forming an alignment key through a portion of a substrate including first and second surfaces opposite to each other, the portion being adjacent to the second surface;

forming a transistor on the second surface of the substrate, the transistor including a gate structure and a source/drain layer;

removing a portion of the substrate adjacent to the first surface of the substrate to expose the alignment key;

forming a contact plug through a portion of the substrate adjacent to the first surface of the substrate, the contact plug being electrically connected to the source/drain layer; and forming a power rail on the first surface of the substrate, the power rail being electrically connected to the contact plug.

2. The method as claimed in claim 1, wherein forming the alignment key includes:

removing a portion of the substrate adjacent to the second surface of the substrate to form a first trench; and forming an insulation layer in the first trench.

3. The method as claimed in claim 2, wherein the substrate includes a chip region and a scribe lane region, and the first trench is formed in the scribe lane region of the substrate, and wherein the method further comprises:

removing a portion of the substrate adjacent to the second surface of the substrate in the chip region to form a second trench; and forming an isolation pattern in the second trench.

4. The method as claimed in claim 3, wherein the second trench defines an active pattern in the chip region of the substrate, and wherein the isolation pattern is formed in a lower portion of the second trench, and covers a lower sidewall of the active pattern.

5. The method as claimed in claim 1, wherein forming the alignment key includes:

alternately and repeatedly stacking a sacrificial layer and a semiconductor layer on the second surface of the substrate, the sacrificial layer including silicon-germanium and the semiconductor layer including silicon;

partially removing the sacrificial layers, the semiconductor layers and a portion of the substrate adjacent to the second surface of the substrate to form a first trench; and forming an insulation layer in the first trench.

6. The method as claimed in claim 5, wherein the substrate includes a chip region and a scribe lane region, the first trench is formed in the scribe lane region of the substrate, and wherein the method further comprises:

partially removing the sacrificial layers, the semiconductor layers and a portion of the substrate adjacent to the second surface of the substrate in the chip region to form a second trench; and forming an isolation pattern in the second trench.

7. The method as claimed in claim 1, wherein forming the alignment key includes:

removing a portion of the substrate adjacent to the second surface of the substrate to form a first trench;

alternately and repeatedly stacking a sacrificial layer and a semiconductor layer on the second surface of the substrate having the first trench thereon; and forming an insulation layer on a portion of an uppermost one of the semiconductor layers on the first trench.

8. The method as claimed in claim 7, wherein the substrate includes a chip region and a scribe lane region, the first trench is formed in the scribe lane region of the substrate, and wherein the method further comprises:

partially removing the sacrificial layers, the semiconductor layers and a portion of the substrate adjacent to the second surface of the substrate in the chip region to form a second trench; and forming an isolation pattern in the second trench.

9. The method as claimed in claim 1, wherein forming the transistor includes:

forming a dummy gate structure on the second surface of the substrate;

forming the source/drain layer on a portion of the substrate adjacent to the dummy gate structure; and replacing the dummy gate structure with the gate structure.

10. The method as claimed in claim 1, wherein forming the contact plug includes:

removing a portion of the substrate adjacent to the first surface of the substrate to form an opening exposing the source/drain layer; and forming the contact plug in the opening.

11. A method of manufacturing a semiconductor device, the method comprising:

removing portions of a substrate in a chip region and a scribe lane region to form first and second trenches, respectively, the substrate including first and second surfaces opposite to each other, and the portions being adjacent to the second surface of the substrate;

forming an isolation pattern and an alignment key in the first and second trenches, respectively;

forming a dummy gate structure on the second surface of the substrate;

forming a source/drain layer on a portion of the substrate adjacent to the dummy gate structure;

replacing the dummy gate structure with a gate structure;

removing a portion of the substrate adjacent to the first surface of the substrate to expose the alignment key;

forming a contact plug through a portion of the substrate adjacent to the first surface of the substrate, the contact plug being electrically connected to the source/drain layer; and forming a power rail on the first surface of the substrate, the power rail being electrically connected to the contact plug.

12. The method as claimed in claim 11, wherein the isolation pattern and the alignment key include substantially the same material.

13. The method as claimed in claim 11, wherein the first trench defines an active pattern in the chip region of the substrate, and wherein the isolation pattern is formed in a lower portion of the first trench, and covers a lower sidewall of the active pattern.

14. The method as claimed in claim 11, further comprising, prior to forming the first and second trenches, alternately and repeatedly stacking a sacrificial layer and a semiconductor layer on the second surface of the substrate, wherein forming the first and second trenches in the chip region and the scribe lane region, respectively, includes partially removing the sacrificial layers, the semiconductor layers and portions of the substrate adjacent to the second surface of the substrate.

15. The method as claimed in claim 14, wherein replacing the dummy gate structure with the gate structure includes:

removing the sacrificial layers to form an opening; and forming a gate insulation pattern and a gate electrode in the opening.

* * * * *